(12) United States Patent
Choi et al.

(10) Patent No.: US 12,302,578 B2
(45) Date of Patent: May 13, 2025

(54) NON-VOLATILE MEMORY DEVICE

(71) Applicant: Samsung Electronics Co., Ltd., Suwon-si (KR)

(72) Inventors: Moorym Choi, Yongin-si (KR); Jungtae Sung, Seoul (KR); Yunsun Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 17/834,977

(22) Filed: Jun. 8, 2022

(65) Prior Publication Data

US 2023/0140000 A1 May 4, 2023

(30) Foreign Application Priority Data

Nov. 2, 2021 (KR) .................. 10-2021-0148537

(51) Int. Cl.
*H10B 43/40* (2023.01)
*H01L 23/528* (2006.01)
*H10B 43/27* (2023.01)
*H10D 64/23* (2025.01)

(52) U.S. Cl.
CPC ......... *H10B 43/40* (2023.02); *H01L 23/5283* (2013.01); *H10B 43/27* (2023.02); *H10D 64/251* (2025.01)

(58) Field of Classification Search
CPC ........ H10B 43/40; H10B 43/27; H10B 43/35; H10B 43/50; H10B 80/00; H01L 23/5283; H01L 29/41725
See application file for complete search history.

(56) References Cited

U.S. PATENT DOCUMENTS

| | | | |
|---|---|---|---|
| 8,971,118 B2 | 3/2015 | Jin et al. | |
| 9,287,265 B2 | 3/2016 | Park et al. | |
| 10,600,781 B1 | 3/2020 | Xiao et al. | |
| 2019/0371807 A1* | 12/2019 | Nishikawa | H10B 41/10 |
| 2019/0378855 A1* | 12/2019 | Kim | H10B 43/40 |
| 2020/0303401 A1 | 9/2020 | Kanamori et al. | |
| 2020/0357783 A1 | 11/2020 | Kai et al. | |
| 2021/0142841 A1 | 5/2021 | Nishikawa et al. | |

* cited by examiner

*Primary Examiner* — Kyoung Lee
*Assistant Examiner* — Christina A Sylvia
(74) *Attorney, Agent, or Firm* — Muir Patent Law, PLLC

(57) ABSTRACT

A semiconductor device includes first and second substrates including cell and peripheral circuit regions, first and second gate electrode structures, first and second channels, and first to third transistors. The first and second gate electrode structures include first and second gate electrodes in a vertical direction. The first and second channel extend through the first and second gate electrode structures. The first transistor is on the peripheral circuit region. The second gate electrode structure is on the first gate electrode structure and the first transistor. The second and third transistors are on the second gate electrode structure. The second substrate is on the second and third transistors. The first and second channels do not directly contact each other, are electrically connected with each other, and receive electrical signals from the second transistor. The first and third transistors apply electrical signals to the first and second gate electrode structures.

20 Claims, 49 Drawing Sheets

NON-VOLATILE MEMORY DEVICE

CROSS-REFERENCE TO RELATED APPLICATIONS

This application claims priority under 35 U.S.C. § 119 to Korean Patent Application No. 10-2021-0148537, filed on Nov. 2, 2021, in the Korean Intellectual Property Office (KIPO), the contents of which are herein incorporated by reference in their entirety.

BACKGROUND

1. Field

The inventive concepts relate to a semiconductor device, and more particularly, relate to a vertical memory device.

2. Description of the Related Art

In an electronic system requiring data storage, a semiconductor device that may store high-capacity data is needed. Thus, a method of increasing the data storage capacity of the semiconductor device has been studied. For example, a method of stacking a plurality of memory cells in a vertical direction has been proposed.

As the number of stacks of the memory cells in the semiconductor device increases, the number of transistors for applying electrical signals also increases, and thus a method of arranging the transistors is needed.

SUMMARY

Example embodiments provide a semiconductor device having improved characteristics.

According to an aspect of the inventive concept, there is provided a semiconductor device. The semiconductor device may include a first gate electrode structure, a first channel, a first transistor, a second gate electrode structure, a second channel, second and third transistors, and a second substrate. The first gate electrode structure may be formed on a first substrate including a cell region and a peripheral circuit region surrounding the cell region. The first gate electrode structure may include first gate electrodes spaced apart from each other on the cell region of the first substrate in a first direction substantially perpendicular to an upper surface of the first substrate, and each of the first gate electrodes may extend lengthwise in a second direction substantially parallel to the upper surface of the first substrate. The first channel may extend in the first direction through at least a portion of the first gate electrode structure. The first transistor may be formed on the peripheral circuit region of the first substrate. The second gate electrode structure may be formed on the first gate electrode structure and the first transistor. The second gate electrode structure may include second gate electrodes spaced apart from each other in the first direction, and each of the second gate electrodes may extend lengthwise in the second direction. The second channel may extend in the first direction through at least a portion of the second gate electrode structure. The second and third transistors may be formed on the second gate electrode structure. The second substrate may be formed on the second and third transistors. The first and second channels may not directly contact each other, but be electrically connected with each other, and may receive electrical signals from the second transistor. The first and third transistors may apply electrical signals to the first and second gate electrode structures.

According to an aspect of the inventive concept, there is provided a semiconductor device. The semiconductor device may include a first gate electrode structure, a first channel, a first transistor, a second gate electrode structure, a second channel, second and third transistors, and a second substrate. The first gate electrode structure may be formed on a first substrate including a cell region and a peripheral circuit region surrounding the cell region. The first gate electrode structure may include first gate electrodes spaced apart from each other on the cell region of the first substrate in a first direction substantially perpendicular to an upper surface of the first substrate, and each of the first gate electrodes may extend lengthwise in a second direction substantially parallel to the upper surface of the first substrate. The first channel may extend in the first direction through at least a portion of the first gate electrode structure. The first transistor may be formed on the peripheral circuit region of the first substrate. The second gate electrode structure may be formed on the first gate electrode structure and the first transistor. The second gate electrode structure may include second gate electrodes spaced apart from each other in the first direction, and each of the second gate electrodes may extend lengthwise in the second direction. The second channel may extend in the first direction through at least a portion of the second gate electrode structure. The second and third transistors may be formed on the second gate electrode structure. The second substrate may be formed on the second and third transistors. The first and second channels may be electrically connected with each other, and receive electrical signals from the second transistor. The first and third transistors may apply electrical signals to the first and second gate electrode structures. The first transistor may overlap the second gate electrode structure in the first direction.

According to an aspect of the inventive concept, there is provided a semiconductor device. The semiconductor device may include a first gate electrode structure, a first channel, a first transistor, a second gate electrode structure, a second channel, a bonding structure, second and third transistors, a bit line, a first contact plug, a second contact plug, a third contact plug, a fourth contact plug, and second substrate. The first gate electrode structure may be formed on a first substrate including a cell region and a peripheral circuit region surrounding the cell region. The first gate electrode structure may include first gate electrodes spaced apart from each other on the cell region of the first substrate in a first direction substantially perpendicular to an upper surface of the first substrate, and each of the first gate electrodes may extend lengthwise in a second direction substantially parallel to the upper surface of the first substrate. The first channel may extend in the first direction through at least a portion of the first gate electrode structure. The first transistor may be formed on the peripheral circuit region of the first substrate. The second gate electrode structure may be formed on the first gate electrode structure and the first transistor. The second gate electrode structure may include second gate electrodes spaced apart from each other in the first direction, and each of the second gate electrodes may extend lengthwise in the second direction. The second channel may extend in the first direction through at least a portion of the second gate electrode structure. The bonding structure may be formed between an upper surface of the first channel and a lower surface of the second channel, and may electrically connect the first and second channels with each other. The second and third transistors may be formed on the second gate electrode structure. The bit line may extend in a third direction substantially parallel to the upper surface of the first substrate and crossing the second direction, and may electrically connect the second channel to the second transistor. The first contact plug may be electrically connected to the first transistor and extend in the first direction. The second contact plug may be electrically connected to the first gate electrode structure and extend in the first direction. The third contact plug may be electrically connected to the second gate electrode structure and extend in the first direction. The fourth contact plug may be electrically connected to the third transistor and extend in the first direction. The second substrate may be formed on the second and third transistors. The first and second contact plugs may be electrically connected with each other. The third and fourth contact plugs may be electrically connected with each other.

In the semiconductor device, the transistors may be formed over and under the gate electrode structures so as to increase the integration degree of the semiconductor device.

DETAILED DESCRIPTION

The above and other aspects and features of a semiconductor device and a method of manufacturing the semiconductor device, and an electronic system, e.g., a massive data storage system including the semiconductor device in accordance with example embodiments will become readily understood from detailed descriptions that follow, with reference to the accompanying drawings in which like numerals refer to like elements throughout. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 180 degrees or at other orientations) and the spatially relative descriptors used herein interpreted accordingly.

As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Figure 1:
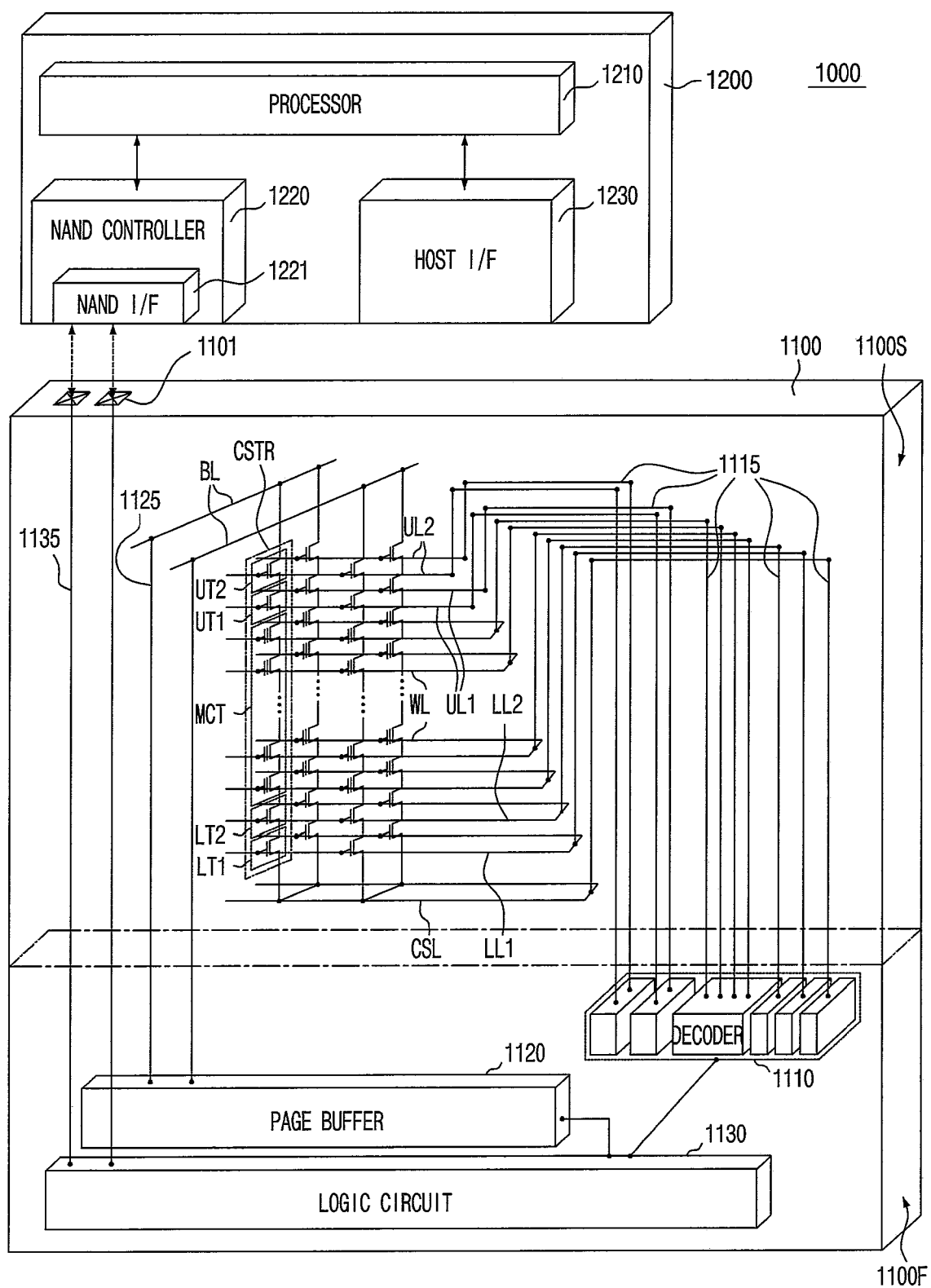
FIG. 1 is a schematic diagram illustrating an electronic system including a semiconductor device in accordance with example embodiments.

FIG. 1 is a schematic diagram illustrating an electronic system including a semiconductor device in accordance with example embodiments.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid-state drive (SSD) device, a universal serial bus (USB), a computing system, a medical device, or a communication device that may include one or a plurality of semiconductor devices 1100.

The semiconductor device 1100 may be a non-volatile memory device, for example, a NAND flash memory device that will be illustrated with reference to FIGS. 46 to 49. The semiconductor device 1100 may include a first structure 1100F and a second structure 1100S on the first structure 1100F. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor MCT among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control commands for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When a control command is received from the outside host through the host interface 1230, the processor 1210 may control the semiconductor device 1100 in response to the control command.

Figure 2:
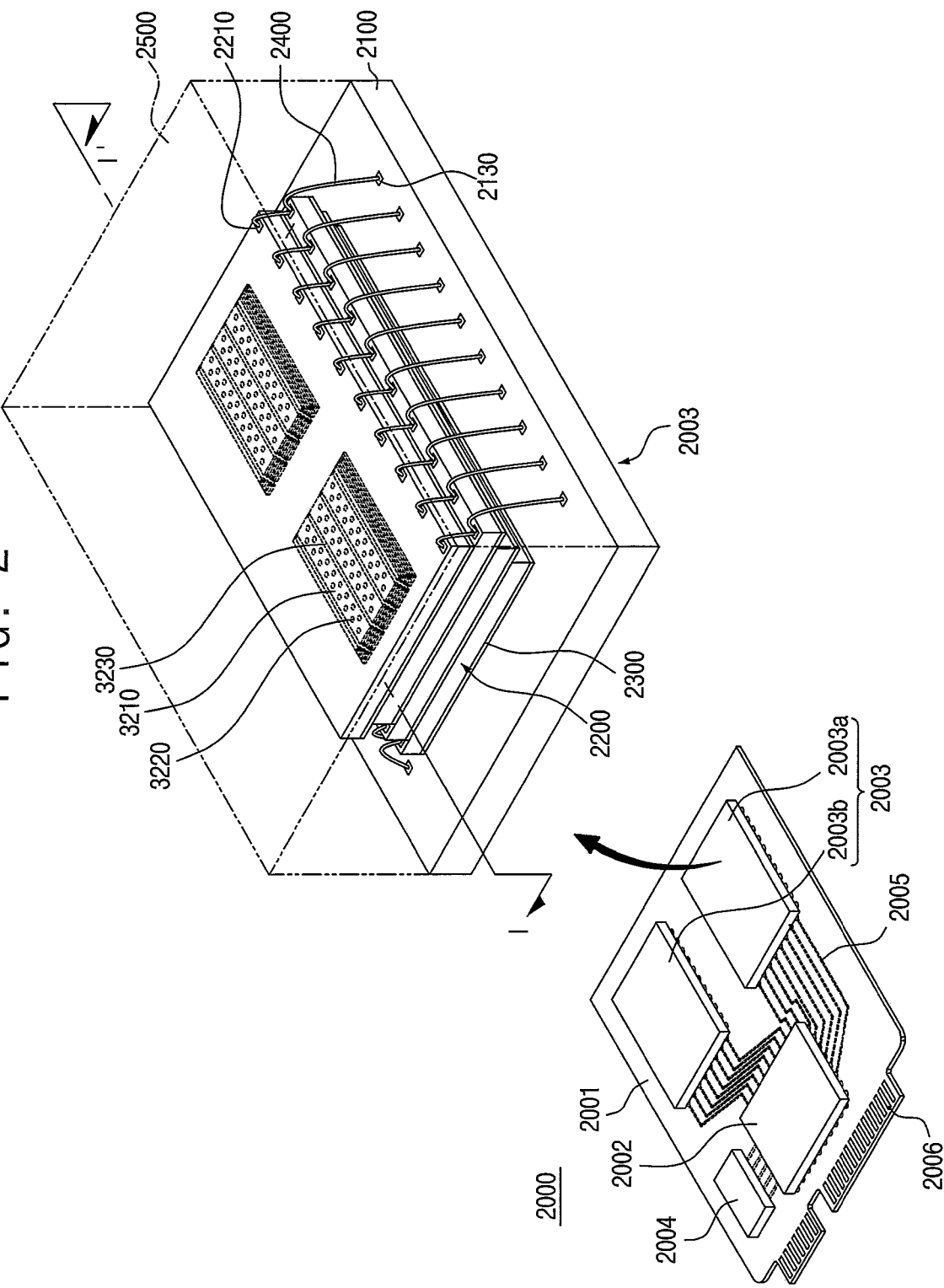
FIG. 2 is a schematic perspective view illustrating an electronic system including a semiconductor device in accordance with example embodiments.

FIG. 2 is a schematic perspective view illustrating an electronic system including a semiconductor device in accordance with example embodiments.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality of pins in the connector 2006 may be changed depending on a communication interface between the electronic system 2000 and the outside host. In example embodiments, the electronic system 2000 may communicate with the outside host according to one of a Universal Serial Bus (USB), peripheral component interconnect express (PCI-Express), serial advanced technology attachment (SATA), M-Phy for universal flash storage (UFS), etc. In example embodiments, the electronic system 2000 may be operated by a power source provided from the outside host through the connector 2006. Although not illustrated, the electronic system 2000 may further include a power management integrated circuit (PMIC) for distributing the power source provided from the outside host to the controller 2002 and the semiconductor package 2003.

The controller 2002 may write data to the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. Although not illustrated, when the electronic system 2000 includes the DRAM device 2004, the controller 2002 may further include a DRAM controller for controlling the DRAM device 2004 in addition to the NAND controller (e.g., NAND controller 1220 of FIG. 1) for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100. In example embodiments, each of the semiconductor chips of FIG. 2 may correspond to the semiconductor device 1100 of FIG. 1.

The package substrate 2100 may be a printed circuit board (PCB) including package upper pads 2130. Each semiconductor chip 2200 may include an input/output pad 2210. The input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 46 to 49.

In example embodiments, the connection structure 2400 may be a bonding wire for electrically connecting the input/output pad 2210 and the package upper pads 2130. Thus, in each of the first and second semiconductor packages 2003a and 2003b, the semiconductor chips 2200 may be electrically connected with each other by a bonding wire method, and may be electrically connected to the package upper pads 2130 of the package substrate 2100. Alternatively, in each of the first and second semiconductor packages 2003a and 2003b, the semiconductor chips 2200 may be electrically connected with each other by a connection structure including a through silicon via (TSV), instead of the connection structure 2400 of the bonding wire method.

In example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 3:
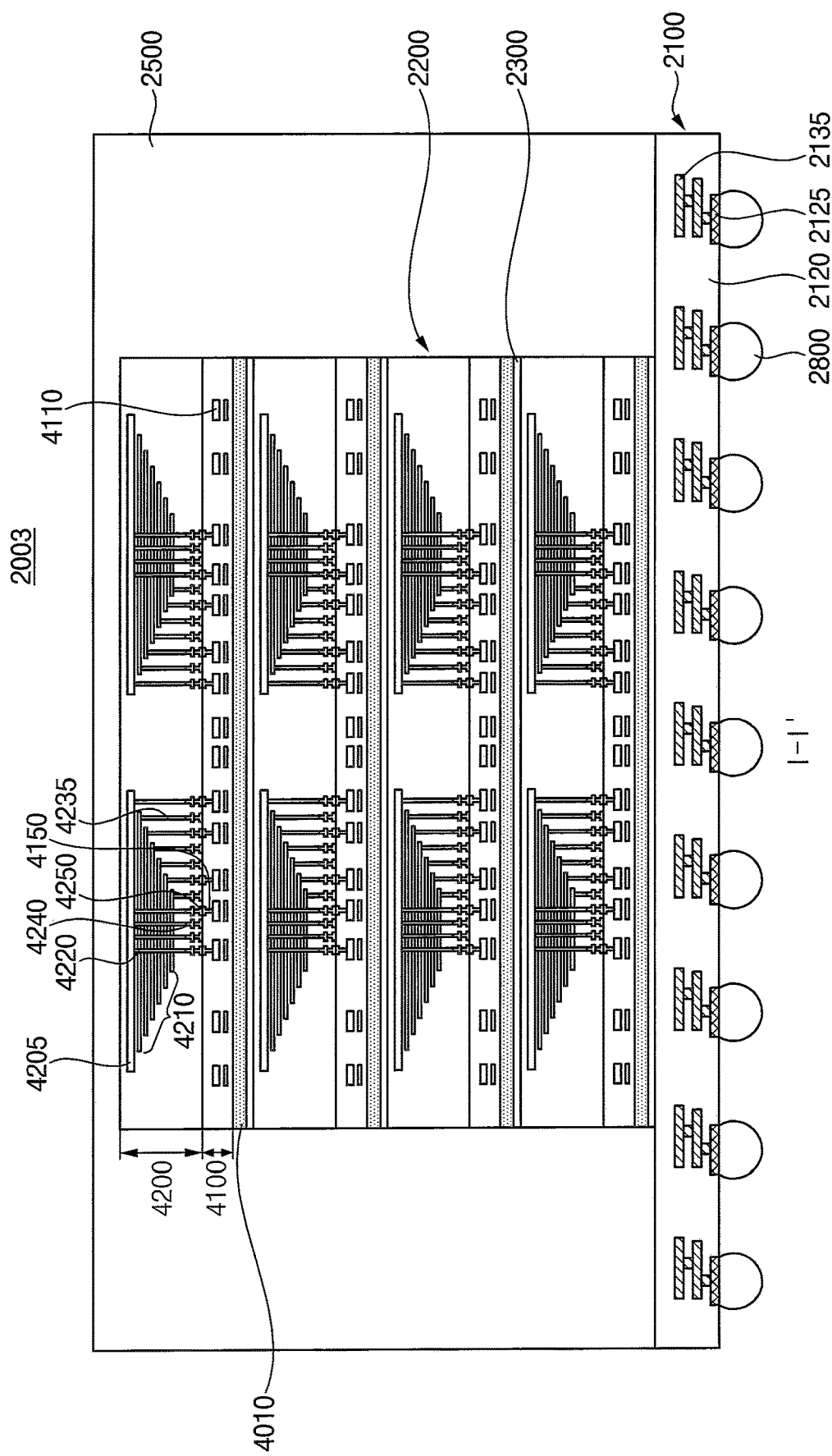
FIG. 3 is a schematic cross-sectional view illustrating a semiconductor package that may include a semiconductor device in accordance with example embodiments.

FIG. 3 is a schematic cross-sectional view illustrating a semiconductor package that may include a semiconductor device in accordance with example embodiments. FIG. 3 illustrates example embodiments of the semiconductor package 2003 shown in FIG. 2, and shows a cross-section taken along a line I-I' of the semiconductor package 2003 in FIG. 2.

Referring to FIG. 3, in the semiconductor package 2003, the package substrate 2100 may be a PCB. The package substrate 2100 may include a substrate body part 2120, the package upper pads 2130 (refer to FIG. 2) on an upper surface of the substrate body part 2120, package lower pads 2125 on a lower surface of the substrate body part 2120 or exposed through the lower surface of the substrate body part 2120, and inner wirings 2135 for electrically connecting the package upper pads 2130 and the package lower pads 2125 in an inside of the substrate body part 2120. The package upper pads 2130 may be electrically connected to the connection structures 2400. The package lower pads 2125 may be connected to wiring patterns 2005 of the main substrate 2001 in the electronic system 2000, illustrated in FIG. 2, through conductive connection parts 2800.

Each semiconductor chip 2200 may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 2) extending through the gate electrode structure 4210, and second bonding structures 4250 electrically connected to the memory channel structures 4220 and the word lines WL (refer to FIG. 1) of the gate electrode structure 4210. For example, the second bonding structures 4250 may be electrically connected to the memory channel structures 4220 and the word lines WL (refer to FIG. 1) through the bit lines 4240 electrically connected to the memory channel structures 4220 and the gate connection wirings 4235 electrically connected to the word lines WL (refer to FIG. 1), respectively. The first bonding structures 4150 of the first structure 4100 and the second bonding structures 4250 of the second structure 4200 may contact each other to be bonded with each other. The first bonding structures 4150 and the second bonding structures 4250 may include, e.g., copper. The term "contact," as used herein, refers to a direct connection (i.e., touching) unless the context indicates otherwise.

Each semiconductor chip 2200 may further include the input/output pad 2210 (refer to FIG. 2) electrically connected to the peripheral circuit wirings 4110 of the first structure 4100.

The semiconductor chips 2200 of FIG. 3 may be electrically connected with each other by the connection structures 2400 in a bonding wire method. However, in example embodiments, semiconductor chips such as the semiconductor chips 2200 of FIG. 3 in the same semiconductor package may be electrically connected with each other by a connection structure including a TSV.

FIGS. 4 to 47 are plan views and cross-sectional views illustrating a method of manufacturing a vertical memory device in accordance with example embodiments. Particularly, FIGS. 4, 7, 10, 15, 20, 25, 28, 35 and 40 are the plan views, FIGS. 5, 8, 11-14, 16, 18, 33, 36, 38-39, 41, 43 and 46 are cross-sectional views taken along lines A-A', respectively, of corresponding plan views, FIGS. 6, 9, 17, 19, 34, 37, 42, 44 and 47 are cross-sectional views taken along lines B-B', respectively, of corresponding plan views, FIGS. 21, 23, 26, 29 and 31 are cross-sectional views taken along lines C-C' of corresponding plan views, respectively, and FIGS. 22, 24, 27, 30 and 32 are cross-sectional views taken along lines D-D', respectively, of corresponding plan views, respectively. FIG. 45 is a cross-sectional view of a third substrate.

The semiconductor device may correspond to the semiconductor device 1100 of FIG. 1 and the semiconductor chips 2200 of FIGS. 2 and 3.

Hereinafter, in the specifications (and not necessarily in the claims), a direction substantially perpendicular to an upper surface of a first substrate may be referred to as a first direction D1, and two directions substantially parallel to the upper surface of the first substrate and crossing each other may be referred to as second and third directions D2 and D3, respectively. In example embodiments, the second and third directions D2 and D3 may be substantially perpendicular to each other.

Figure 4:
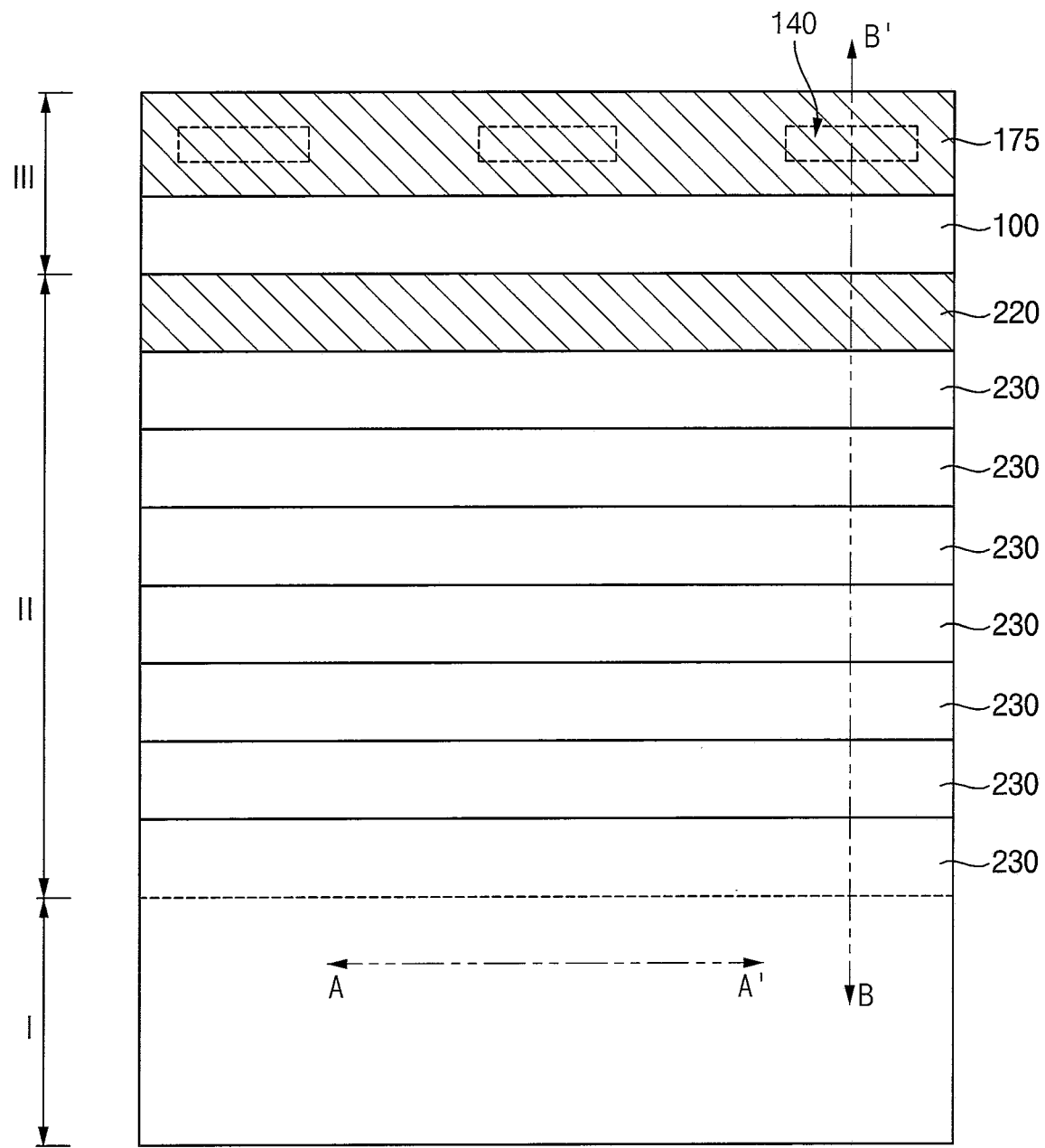
FIGS. 4 to 47 are plan views and cross-sectional views illustrating a method of manufacturing a vertical memory device in accordance with example embodiments.
Figure 5:
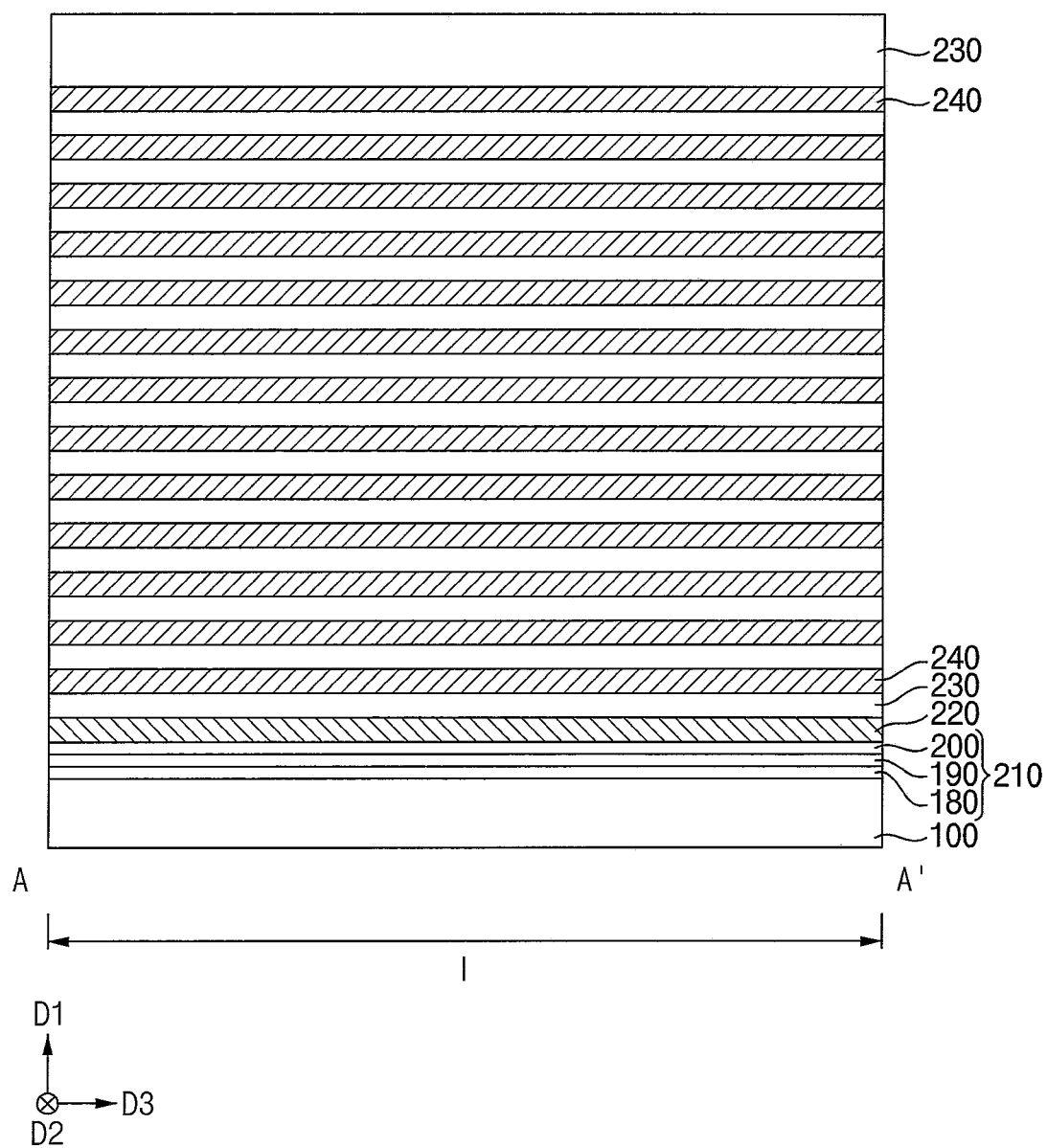
Figure 6:
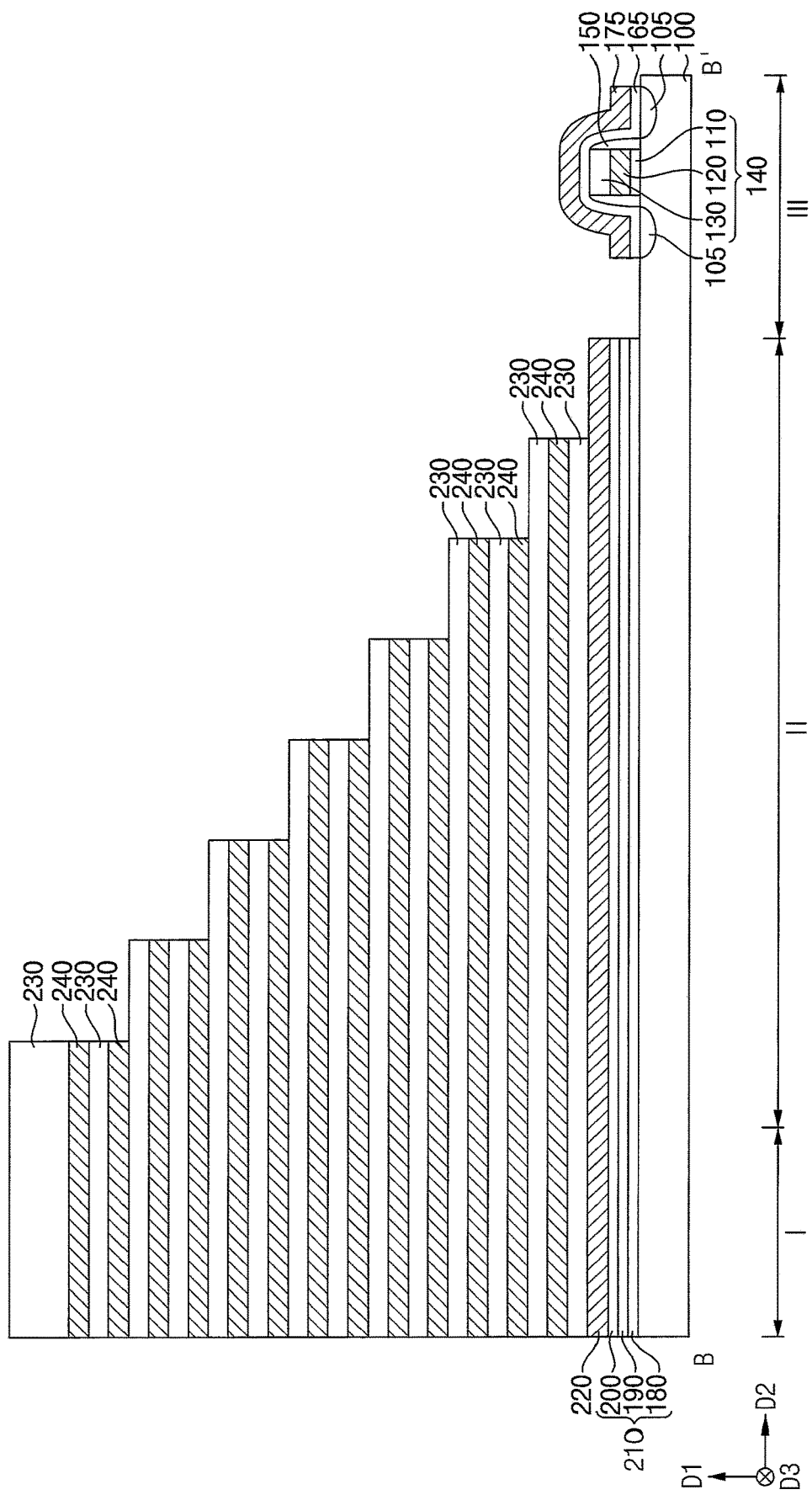

Referring to FIGS. 4 to 6, gate structures 140 may be formed on a third region III of a first substrate 100 including a first region I, a second region II and the third region III.

The first substrate 100 may include silicon, germanium, silicon-germanium or a III-V compound such as GaP, GaAs, GaSb, etc. In some embodiments, the first substrate 100 may be a silicon-on-insulator (SOI) substrate or a germanium-on-insulator (GOI) substrate.

The first region I may be a cell array region in which memory cells may be formed. The second region II may at least partially surround the first region I, and may be a pad region or extension region in which contact plugs for transferring electrical signals to the memory cells may be formed. The third region may at least partially surround the second region II, and some of peripheral circuits for applying electrical signals to the memory cells may be formed.

The gate structure 140 may be formed by sequentially forming and patterning a gate insulation layer, a first gate electrode layer, and a gate mask layer on the first substrate 100. Thus, the gate structure 140 may include a gate insulation pattern 110, a first gate electrode 120, and a gate mask 130 sequentially stacked. The gate insulation pattern 110 may include an oxide, e.g., silicon oxide, the first gate electrode 120 may include a metal, e.g., tungsten, titanium, aluminum, etc., and/or doped polysilicon, and the gate mask 130 may include a nitride, e.g., silicon nitride.

A gate spacer 150 may be formed on a sidewall of the gate structure 140. The gate spacer 150 may be formed by forming a gate spacer layer on the first substrate 100 to cover the gate structure 140 and anisotropically etching the gate spacer layer. The gate spacer 150 may include a nitride, e.g., silicon nitride, and thus, in some embodiments, may be merged with the gate mask 130. After forming the gate spacer 150, impurities may be implanted into upper portions of the first substrate 100 adjacent to the gate structure 140 to form first impurity regions 105. The first impurity regions 105 may be formed on both sides of the gate structure 140. The first impurity regions 105 may include n-type impurities or p-type impurities, and the gate structure 140 and the first impurity regions 105 may form a first transistor. The first impurity regions 105 may serve as source/drain regions of the first transistor.

A first insulation layer and an etch stop layer may be formed on the first substrate 100 to cover the gate structure 140 and the gate spacer 150, and may be patterned to form a first insulation pattern 165 and an etch stop pattern 175, respectively, that may be sequentially stacked on the third region III of the first substrate 100.

In example embodiments, the first insulation pattern 165 and the etch stop pattern 175 may cover the gate structure 140 and the gate spacer 150 on the third region III of the first substrate 100 in a plan view. In example embodiments, the first insulation pattern 165 may contact upper surfaces of the first impurity regions 105, side surfaces of the gate spacer 150, and a top surface of the gate mask 130, and the etch stop pattern 175 may contact a top surface of the first insulation pattern 165.

The first insulation layer may include an oxide, e.g., silicon oxide, and the etch stop layer may include a nitride, e.g., silicon nitride.

A sacrificial layer structure 210 and a first support layer 220 may be formed on the first and second regions I and II of the first substrate 100, and a second insulation layer 230 and a fourth sacrificial layer 240 may be alternately and repeatedly stacked on the first support layer 220 in the first direction D1 to form a first mold layer.

The sacrificial layer structure 210 may include first, second, and third sacrificial layers 180, 190, and 200 sequentially stacked in the first direction. The first and third sacrificial layers 180 and 200 may include an oxide, e.g., silicon oxide, and the second sacrificial layer 190 may include a nitride, e.g., silicon nitride. A first recess (not shown) may be formed through the sacrificial layer structure 210 on the first substrate 100.

The first support layer 220 may include a material having an etching selectivity with respect to the first to third sacrificial layers 180, 190, and 200, e.g., polysilicon doped with n-type impurities. However, the first support layer 220 may be formed by depositing an amorphous silicon layer doped with n-type impurities and crystallizing the amorphous silicon layer by a heat treatment, so as to include polysilicon doped with n-type impurities.

The first support layer 220 may have a uniform thickness on the sacrificial layer structure 210 and an upper surface of the first substrate 100 exposed by the first recess, and a portion of the first support layer 220 in the first recess may be referred to as a first support pattern. As used herein, the term "thickness" may refer to the thickness or height measured in a direction perpendicular to a top surface of the first substrate 100.

The second insulation layer 230 may include an oxide, e.g., silicon oxide, and the fourth sacrificial layer 240 may include a material having an etching selectivity with respect to the second insulation layer 230, e.g., a nitride such as silicon nitride.

FIG. 5 shows that the first mold layer includes the second insulation layers 230 at fourteen levels, respectively, and the fourth sacrificial layers 240 at thirteen levels, respectively, however, the inventive concept may not be limited thereto, and the second insulation layer 230 and the fourth sacrificial layer 240 may be formed at more levels. In some example embodiments, the number of second insulation layers 230 may be one more than the number of fourth sacrificial layers 240. In other example embodiments, the number of second insulation layers 230 may be the same as the number of fourth sacrificial layers 240. In some embodiments, an uppermost one of the second insulation layers 230 may have a thickness greater than those of other ones of the second insulation layers 230.

A first photoresist layer (not shown) may be formed on an uppermost one of the second insulation layers 230 of the first mold layer, and may be patterned to form a first photoresist pattern. The uppermost one of the second insulation layers 230 and an uppermost one of the fourth sacrificial layers 240 may be etched using the first photoresist pattern as an etching mask. Thus, one of the second insulation layers 230 directly under the uppermost one of the fourth sacrificial layers 240 may be partially exposed. A trimming process in which an area of the first photoresist pattern is reduced by a given ratio may be performed, and the uppermost one of the second insulation layers 230, the uppermost one of the fourth sacrificial layers 240, the exposed one of the second insulation layers 230, and one of the fourth sacrificial layers 240 directly under the exposed one of the second insulation layers 230 may be etched using the first photoresist pattern having the reduced area as an etching mask. The trimming process and the etching process may be alternately and repeatedly performed to form a first mold having a staircase shape including a plurality of step layers each of which may include one fourth sacrificial layer 240 and one second insulation layer 230 sequentially stacked. Hereinafter, the "step layer" may be defined as not only an exposed portion but also a non-exposed portion of the fourth sacrificial layer 240 and the second insulation layer 230 at the same level, and the exposed portion thereof may be defined as a "step." In example embodiments, the steps may be arranged in the second direction D2 and/or in the third direction D3 on the second region II of the first substrate 100.

The first mold may be formed on the first support layer 220 and the first support pattern on the first and second regions I and II of the first substrate 100, and an edge upper surface of the first support layer 220 may not be covered by the first mold but exposed.

Figure 7:
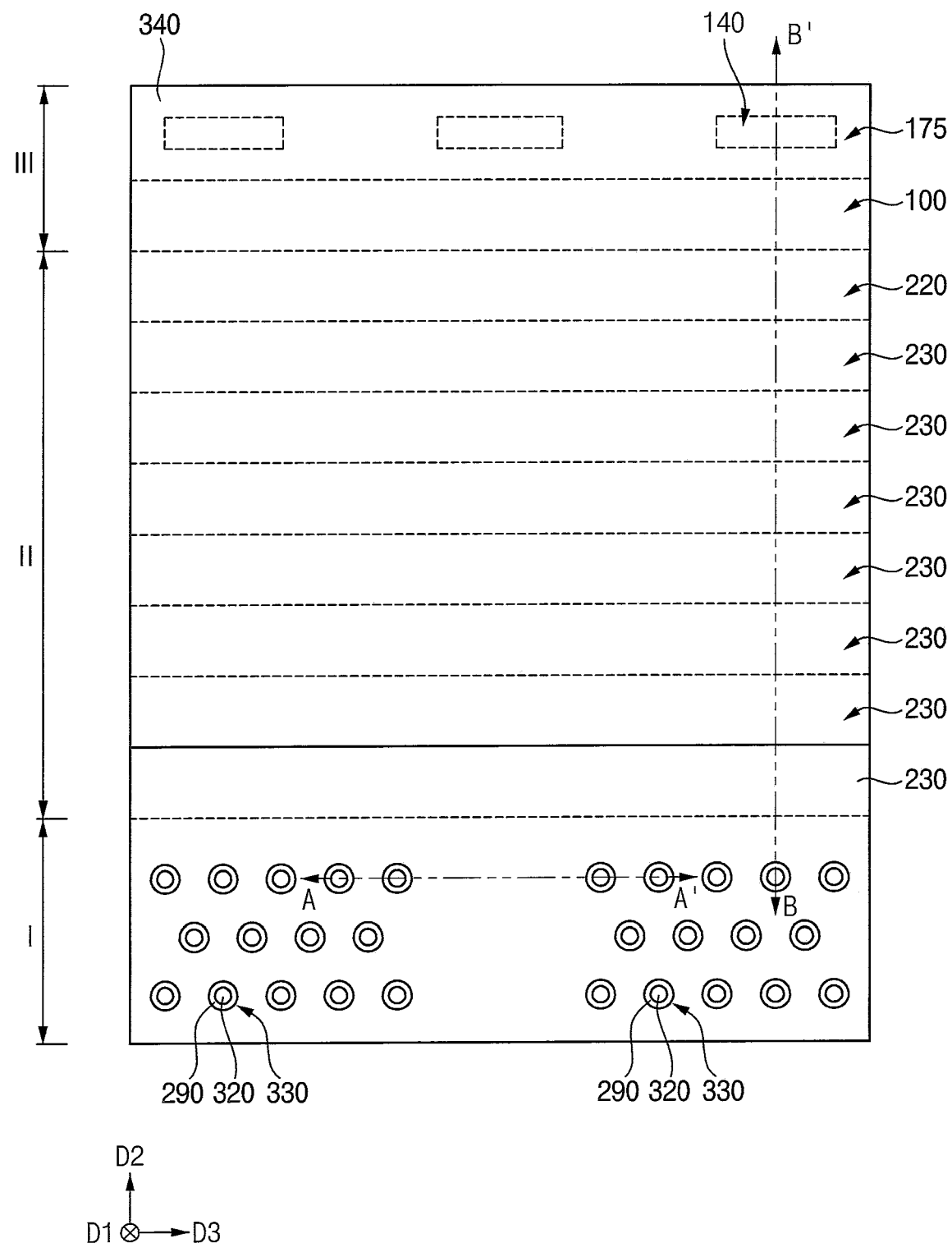
Figure 8:
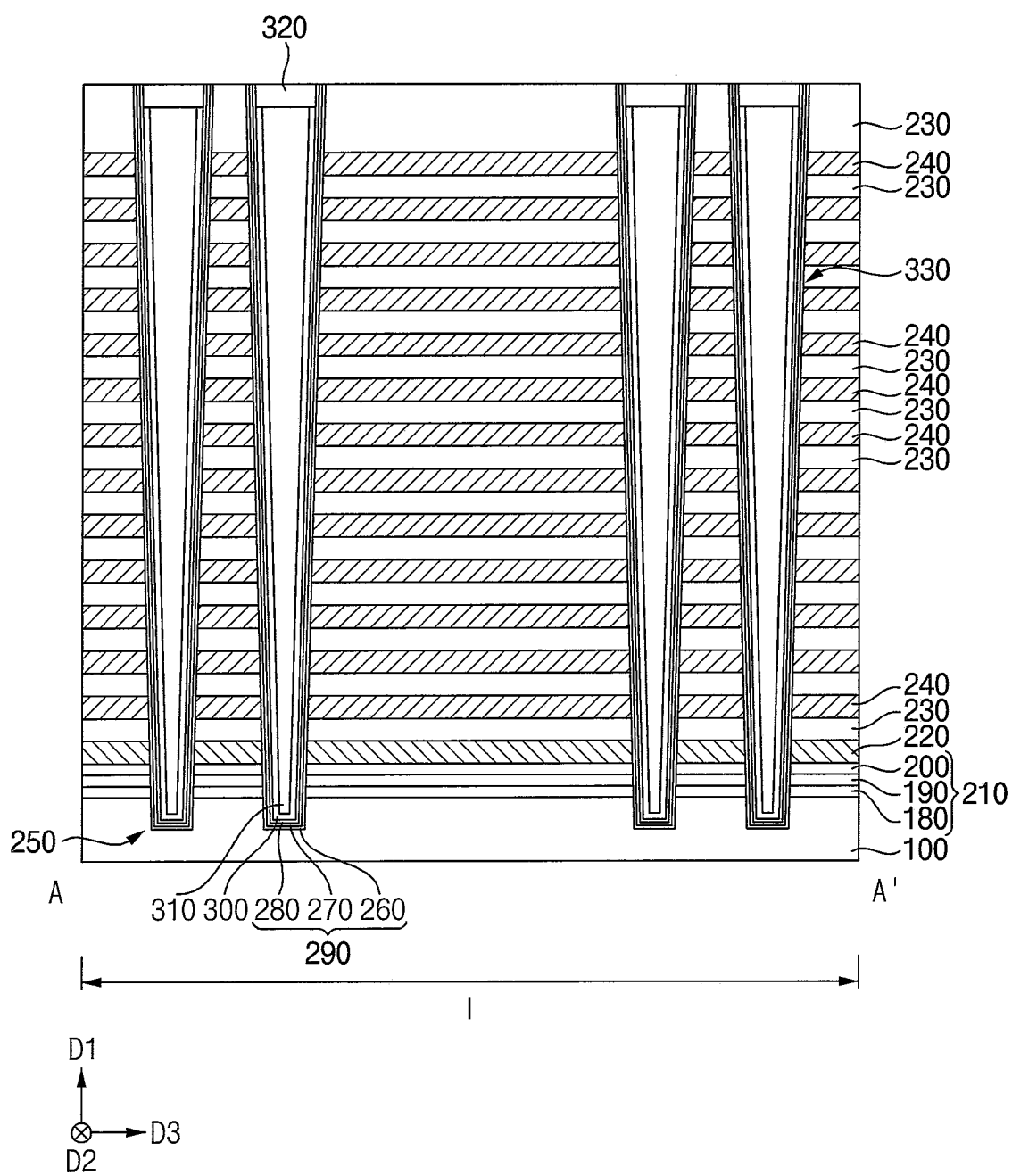
Figure 9:
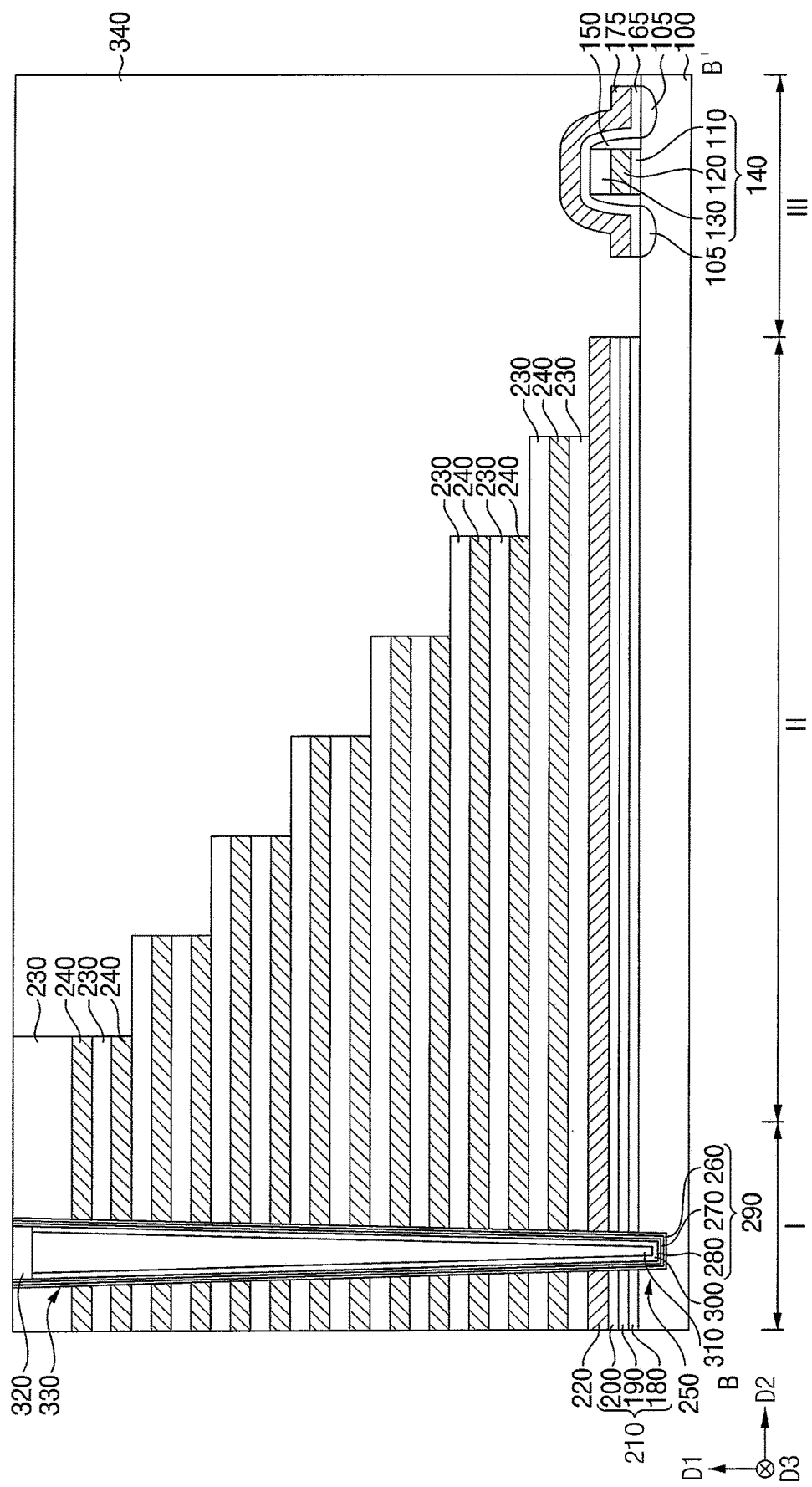

Referring to FIGS. 7 to 9, a first insulating interlayer 340 may be formed on the first substrate 100 to cover the first mold, the first support layer 220, the sacrificial layer structure 210, the etch stop pattern 175, and the first insulation pattern 165, and may be planarized until an upper surface of the uppermost one of the second insulation layers 230 of the first mold is exposed. Thus, a sidewall of the first mold, the exposed upper surface and a sidewall of the first support layer 220, a sidewall of the sacrificial layer structure 210, an upper surface and a sidewall of the etch stop pattern 175, and a sidewall of the first insulation pattern 165 may be covered by the first insulating interlayer 340.

A first channel hole 250 extending in the first direction D1 may be formed through the first mold, the first support layer 220, and the sacrificial layer structure 210 on the first region I of the first substrate 100 to expose an upper surface of the first substrate 100, a first charge storage structure layer may be formed on a sidewall of the first channel hole 250, the upper surface of the first substrate 100 exposed by the first channel hole 250, the uppermost one of the second insulation layer 230, and the first insulating interlayer 340. In example embodiments, the first channel hole 250 may extend below an upper surface of the first substrate 100. A first channel layer may be formed on the first charge storage structure layer, and a first filling layer may be formed on the first channel layer to fill the first channel hole 250.

In example embodiments, a plurality of first channel holes 250 may be formed in each of the second and third directions D2 and D3.

In example embodiments, each of the first channel holes 250 may have a width gradually decreasing from a top end toward a bottom end due to the characteristics of the etching process.

The first channel layer may include, e.g., polysilicon, and the first filling layer may include an oxide, e.g., silicon oxide. The first charge storage structure layer may include a first blocking layer, a first charge storage layer, and a first tunnel insulation layer sequentially stacked from an inner wall of the first channel hole 250. The first blocking layer and the first tunnel insulation layer may include an oxide, e.g., silicon oxide, and the first charge storage layer may include a nitride, e.g., silicon nitride.

The first filling layer, the first channel layer, and the first charge storage structure layer may be planarized until an upper surface of the uppermost one of the second insulation layer 230 in the first mold is exposed, and thus a first filling pattern 310, the first channel 300, and the first charge storage structure 290 may be formed in the first channel hole 250. The first charge storage structure 290 may include a first blocking pattern 260, a first charge storage pattern 270, and a first tunnel insulation pattern 280 sequentially stacked on the sidewall of the first channel hole 250 and the upper surface of the first substrate 100.

In example embodiments, the first filling pattern 310 may have a pillar shape extending lengthwise in the first direction D1, the first channel 300 may have a cup shape covering a sidewall and a lower surface of the first filling pattern 310, and the first charge storage structure 290 may have a cup shape covering an outer sidewall and a lower surface of the first channel 300. Lower surfaces of the first filling pattern 310, the first channel 300, and the first charge storage structure 290 may be at a lower vertical level than an upper surface of the first substrate 100.

Upper portions of the first channel 300 and the first filling pattern 310 may be removed to form a trench, and a first capping pattern 320 may be formed in the trench. Upper surfaces of the first capping pattern 320, the first charge storage structure 290, and the uppermost one of the second insulation layers 230 may be coplanar with one another. In example embodiments, the first capping pattern 320 may include polysilicon or amorphous silicon doped with impurities, and if the first capping pattern 320 includes amorphous silicon doped with impurities, a crystallization process may be further performed.

The first filling pattern 310, the first channel 300, the first charge storage structure 290, and the first capping pattern 320 may form a first memory channel structure 330. In example embodiments, a plurality of first memory channel structures 330 may be spaced apart from each other in each of the second and third directions D2 and D3 in the first region I. Each first memory channel structure 330 may have an upper surface larger than a lower surface thereof, and may have a width gradually decreasing from a top toward a bottom thereof.

Figure 10:
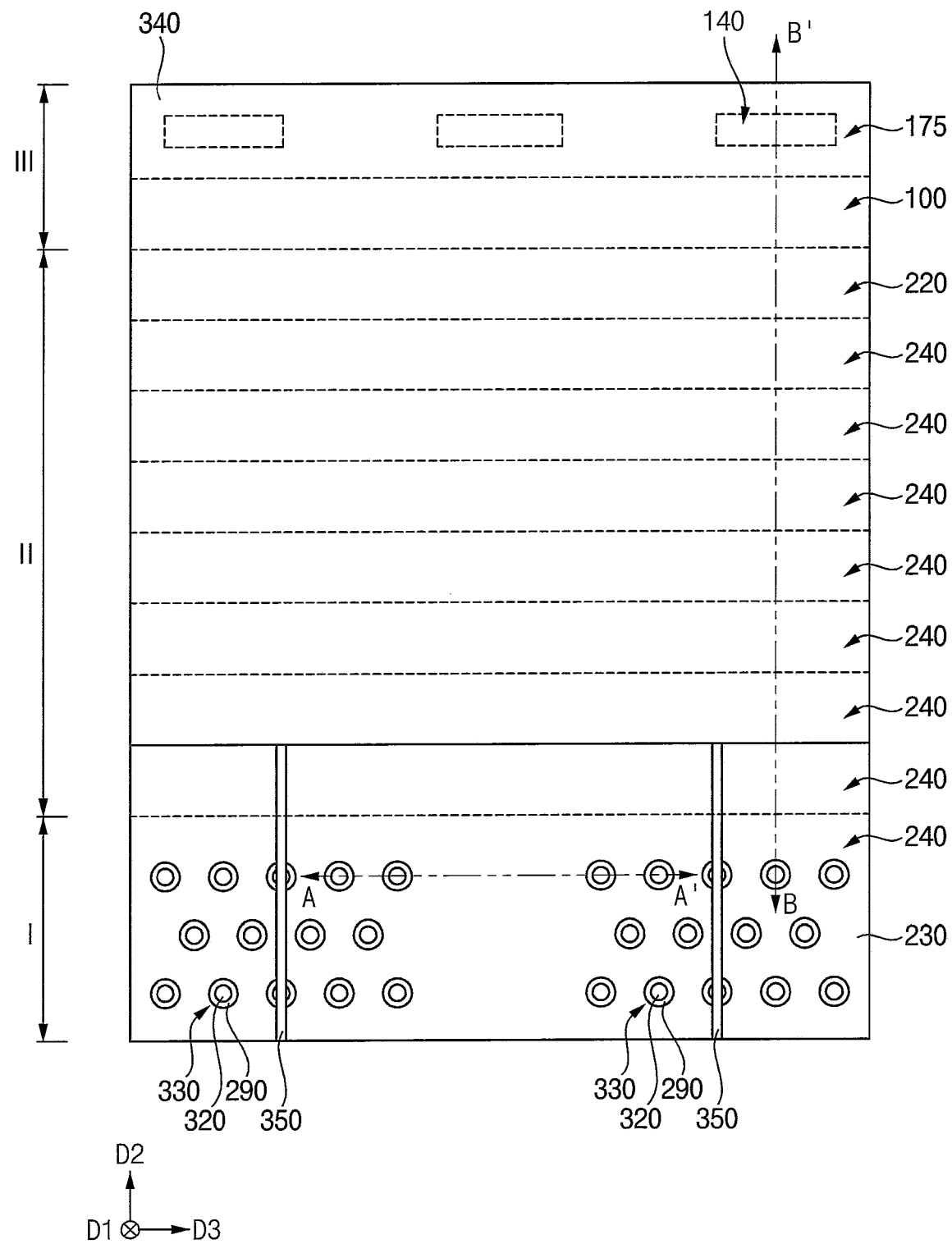

Referring to FIG. 10, the first insulating interlayer 340, and some of the second insulation layers 230 and the fourth sacrificial layers 240 may be partially etched to form a first opening extending in the second direction D2, and a first division pattern 350 may be formed in the first opening.

The first division pattern 350 may extend in the second direction D2 on the first and second regions I and II of the first substrate 100 through, e.g., upper two step layers in the first mold. Thus, the fourth sacrificial layers 240 at upper two levels in the first mold may be divided in the third direction D3 by the first division pattern 350. In an example embodiment, the first division pattern 350 may extend through upper portions of some of the first memory channel structures 330.

The first division pattern 350 may include an oxide, e.g., silicon oxide, or a nitride, e.g., silicon nitride.

Figure 11:
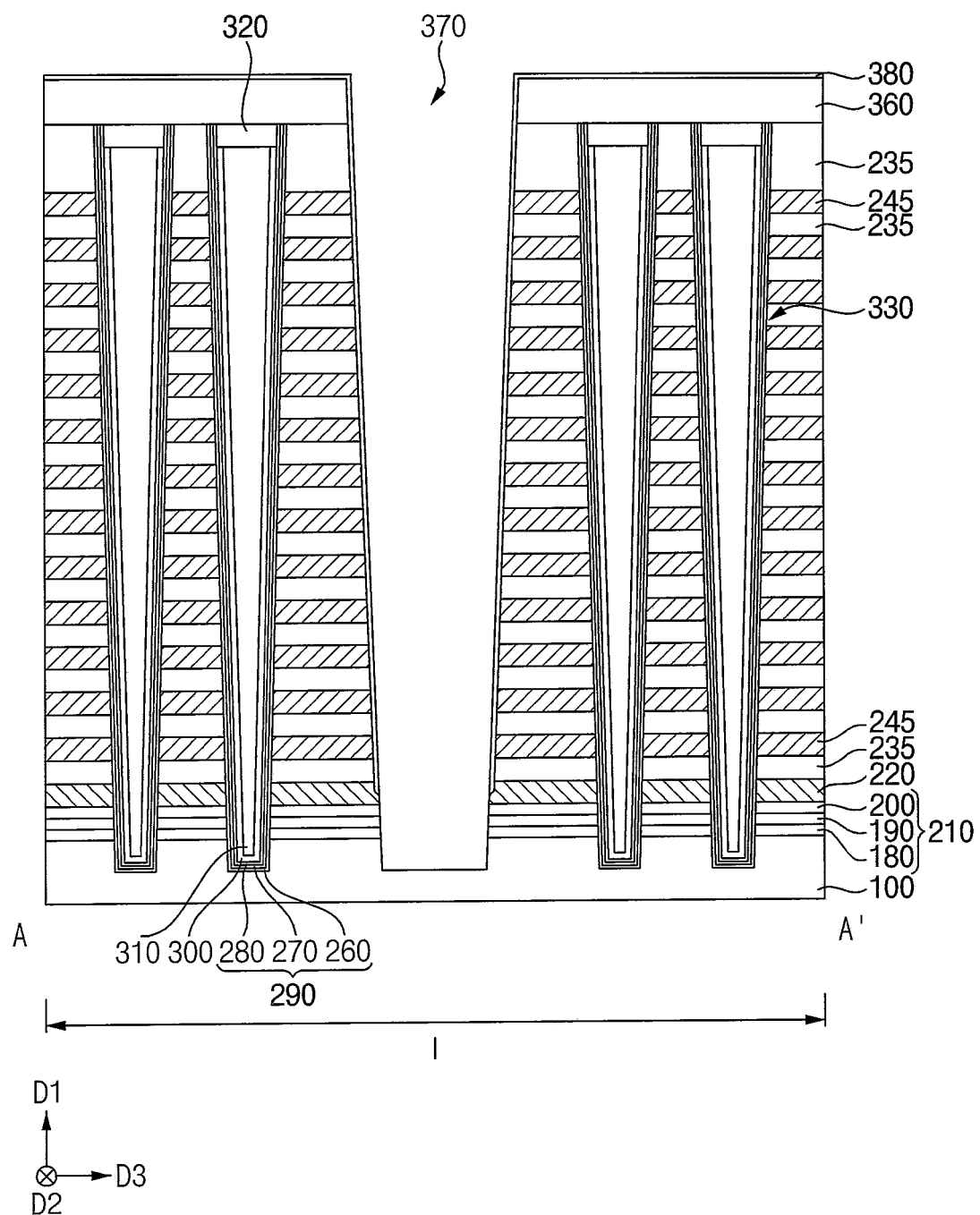

Referring to FIG. 11, a second insulating interlayer 360 including an oxide, e.g., silicon oxide, may be formed on the first insulating interlayer 340 and the first division pattern 350, and a second opening 370 may be formed through the first mold by, e.g., a dry etching process.

The dry etching process may be performed until the second opening 370 exposes an upper surface of the first support layer 220 or the first support pattern, and further the second opening 370 may extend through an upper portion of the first support layer 220 or the first support pattern. In example embodiments, the second opening 370 may extend lengthwise in the second direction D2 on the first and second regions I and II of the first substrate 100, and a plurality of second openings 370 may be formed in the third direction D3. As the second opening 370 is formed, the second insulation layer 230 in the first mold may be divided into second insulation patterns 235 each of which may extend in the second direction D2, and the fourth sacrificial layer 240 may be divided into fourth sacrificial patterns 245 each of which may extend in the second direction D2.

In example embodiments, each second opening 370 may have a width gradually decreasing from a top end toward a bottom end due to the characteristics of the dry etching process.

A spacer layer may be formed on a sidewall of the second opening 370 and a second insulating interlayer 360, and may be anisotropically etched so that a portion of the spacer layer on a bottom of the second opening 370 may be removed to form a spacer 380. Thus, upper surfaces of the first support layer 220 and the first support pattern may be partially exposed.

The exposed first support layer 220 and the first support pattern and a portion of the sacrificial layer structure 210 thereunder may be removed to enlarge the second opening 370 downwardly. Accordingly, the second opening 370 may expose an upper surface of the first substrate 100, and further extend through an upper portion of the first substrate 100.

In example embodiments, the spacer 380 may include, e.g., undoped polysilicon or undoped amorphous silicon. If the spacer 380 includes undoped amorphous silicon, the spacer 380 may be crystallized by heat generated through deposition processes of other layers to include undoped polysilicon.

When the sacrificial layer structure 210 is partially removed, the sidewall of the second opening 370 may be covered by the spacer 380, and thus the second insulation pattern 235 and the fourth sacrificial pattern 245 included in the first mold may not be removed.

Figure 12:
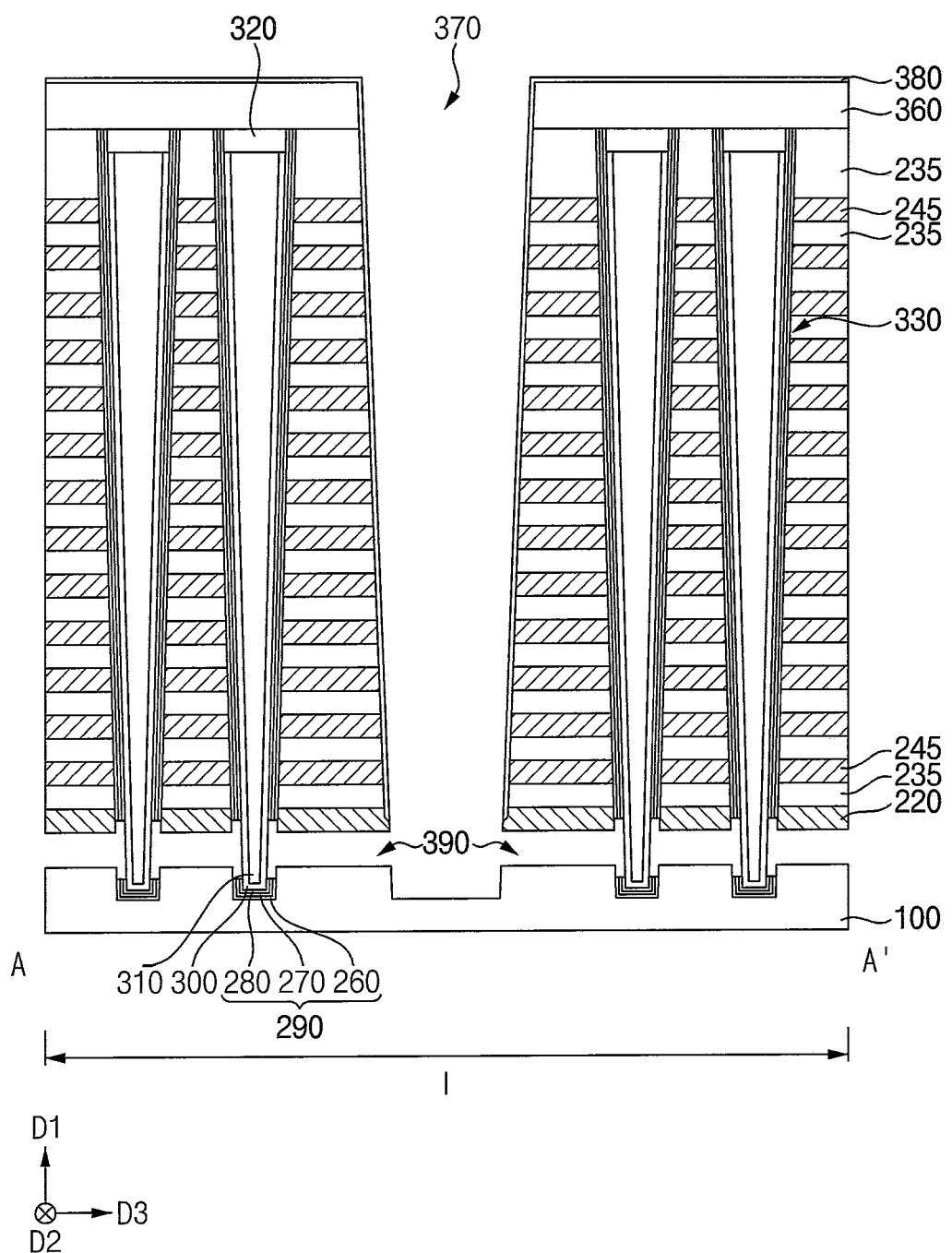

Referring to FIG. 12, the sacrificial layer structure 210 exposed by the second opening 370 may be removed by, e.g., a wet etching process to form a first gap 390.

In example embodiments, the wet etching process may be performed using, e.g., hydrofluoric acid or phosphoric acid.

As the first gap 390 is formed, a lower portion of the first support layer 220 and an upper surface of the first substrate 100 adjacent to the second opening 370 may be exposed. Additionally, a sidewall of the first charge storage structure 290 may be partially exposed by the first gap 390, and the exposed sidewall of the first charge storage structure 290 may also be removed to expose an outer sidewall of the first channel 300. Accordingly, the first charge storage structure 290 may be divided into an upper portion extending through the first mold to cover most portion of the outer sidewall of the first channel 300 and a lower portion covering a lower surface of the first channel 300 on the first substrate 100.

When the first gap 390 is formed by the wet etching process, the first support layer 220 and the first support pattern may not be removed, and thus the first mold may not fall down.

Figure 13:
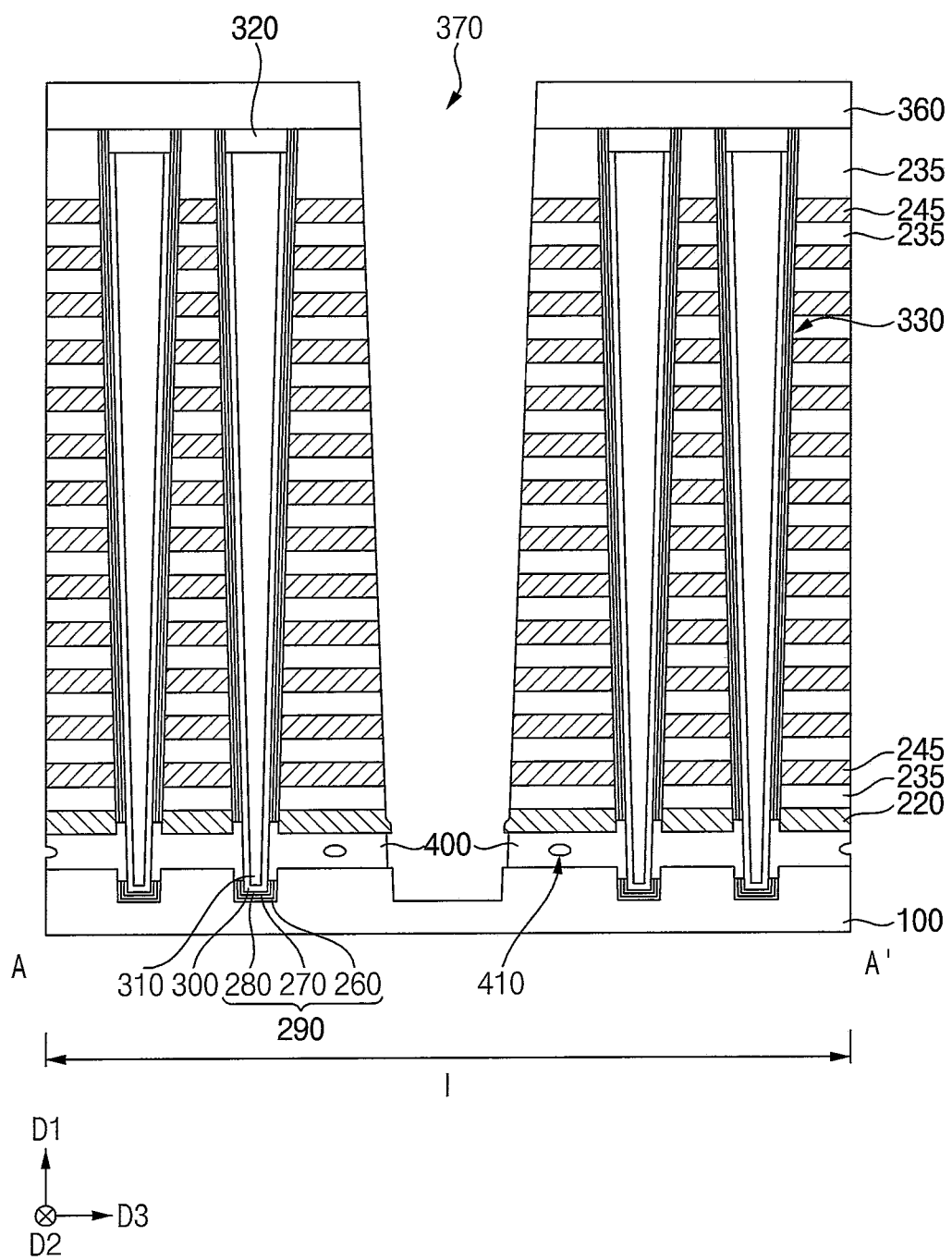

Referring to FIG. 13, after removing the spacer 380, a first channel connection layer may be formed on the sidewall of the second opening 370 and in the first gap 390, and a portion of the first channel connection layer in the second opening 370 may be removed to form a first channel connection pattern 400 in the first gap 390.

As the first channel connection pattern 400 is formed, the first channels 300 between neighboring ones of the second openings 370 in the third direction D3 may be connected with each other.

The first channel connection pattern 400 may include, e.g., amorphous silicon doped with n-type impurities, which may be crystallized by heat generated through deposition processes of other layers to form polysilicon doped with n-type impurities.

An air gap 410 may be formed in the first channel connection pattern 400. In some embodiments, a plurality of air gaps 410 may be formed in the first channel connection pattern 400.

Figure 14:
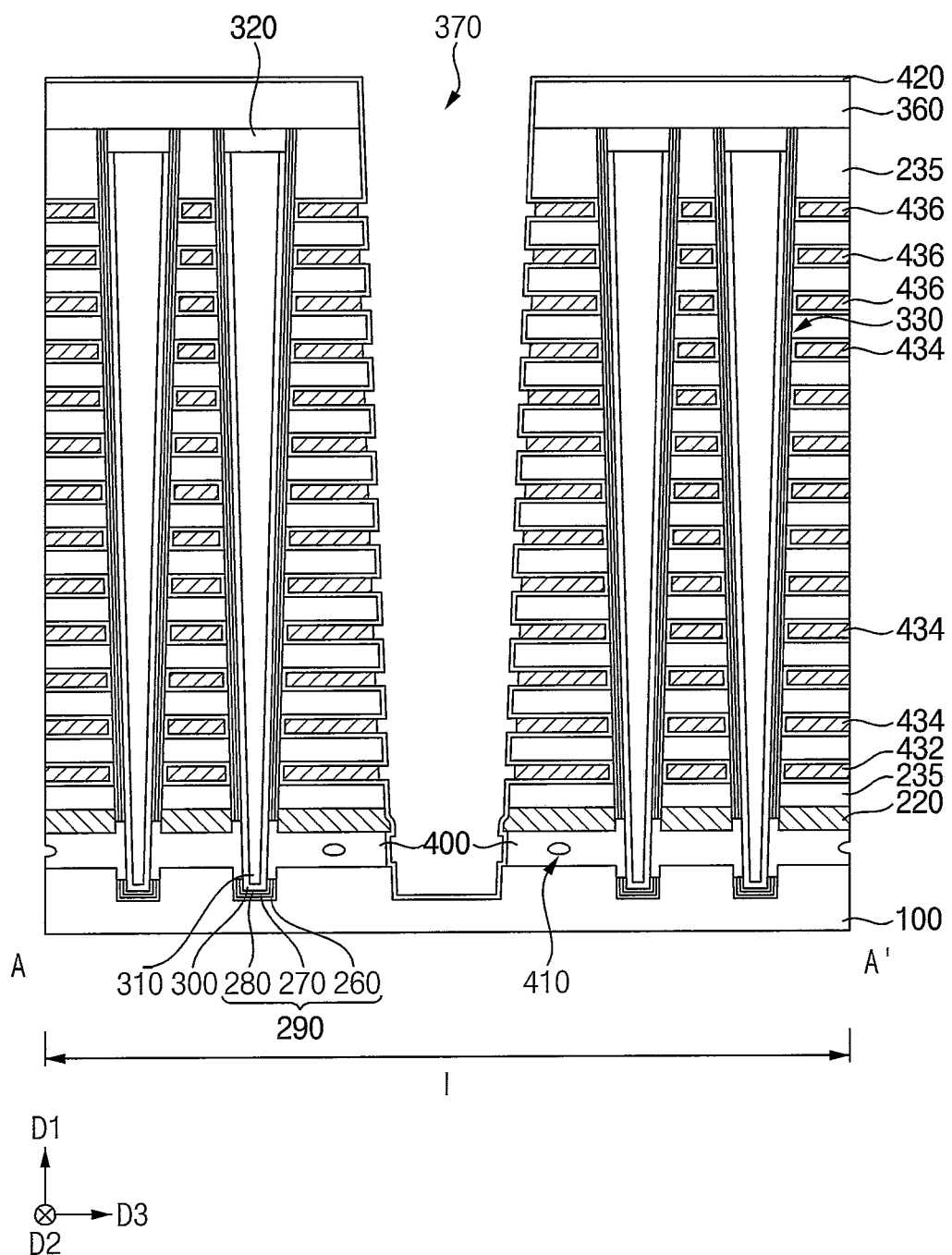

Referring to FIG. 14, fourth sacrificial patterns 245 exposed by the second opening 370 may be removed to form a second gap between the second insulation patterns 235, and an outer sidewall of the first blocking pattern 260 may be partially exposed by the second gap.

In example embodiments, the fourth sacrificial patterns 245 may be removed by a wet etching process using, e.g., phosphoric acid ($H_3PO_4$) or sulfuric acid ($H_2SO_4$).

A second blocking layer 420 may be formed on the outer sidewall of the first blocking pattern 260, inner walls of the second gaps, surfaces of the second insulation patterns 235, a sidewall and a lower surface of the first support layer 220, a sidewall of the first support pattern, a sidewall of the first channel connection pattern 400, an upper surface of the first substrate 100, and an upper surface of the second insulating interlayer 360, and a second gate electrode layer may be formed on the second blocking layer 420.

In example embodiments, the second blocking layer 420 may include a metal oxide, e.g., aluminum oxide, hafnium oxide, zirconium oxide, etc. The second gate electrode layer may include a first gate conductive layer and a first gate barrier layer covering lower and upper surfaces and a sidewall of the first gate conductive layer. The first gate conductive layer may include a low resistance metal, e.g., tungsten, titanium, tantalum, etc., and the first gate barrier layer may include a metal nitride, e.g., titanium nitride, tantalum nitride, etc.

The second gate electrode layer may be partially removed to form a second gate electrode in each of the second gaps. In example embodiments, the second gate electrode layer may be partially removed by a wet etching process.

In example embodiments, the second gate electrode may extend in the second direction D2, and a plurality of second gate electrodes may be spaced apart from each other in the first direction D1 to form a first gate electrode structure. The second gate electrodes may be staked in a staircase shape in which extension lengths in the second direction D2 decrease in a stepwise manner from a lowermost level toward an uppermost level. Additionally, a plurality of first gate electrode structures may be spaced apart from each other in the third direction D3.

The first gate electrode structure may include second to fourth gate electrodes 432, 434, and 436 sequentially stacked in the first direction D1. Additionally, although not illustrated, a fifth gate electrode may be formed under the second gate electrode 432 or over the fourth gate electrode 436, which may perform body erase using the gate induced drain leakage (GIDL) phenomenon.

The second gate electrode 432 may serve as a ground selection line (GSL), and the fourth gate electrode 436 may serve as a string selection line (SSL). FIG. 14 shows that the second gate electrode 432 is formed at a lowermost level, and the fourth gate electrode 436 is formed at an uppermost level and a second level from above, however, the inventive concept may not be limited thereto, and each of the second and fourth gate electrodes 432 and 436 may be formed at a single level or a plurality of levels. The third gate electrodes 434 may be formed at a plurality of levels between the second and fourth gate electrodes 432 and 436, and each third gate electrode 434 may serve as a word line.

Figure 15:
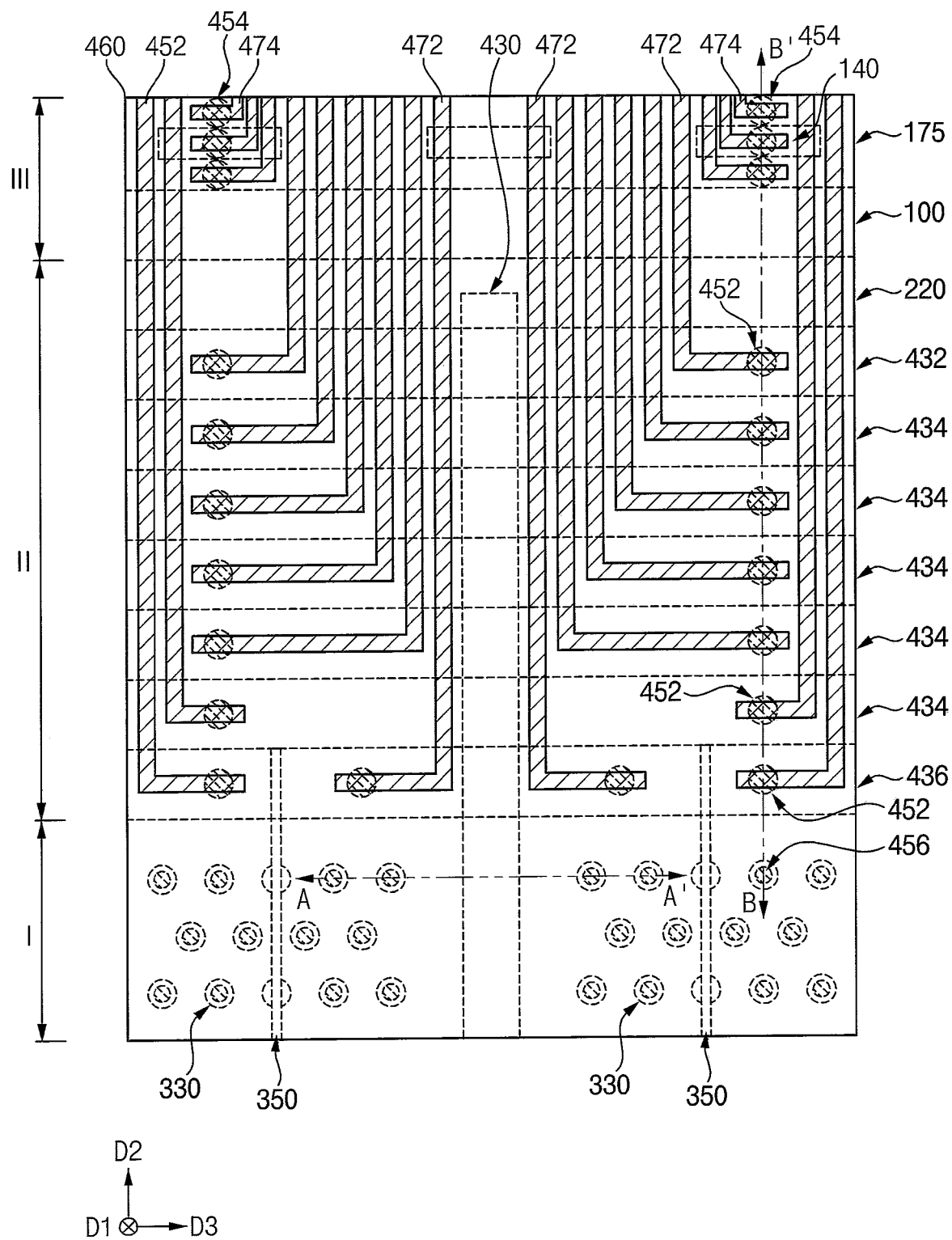
Figure 16:
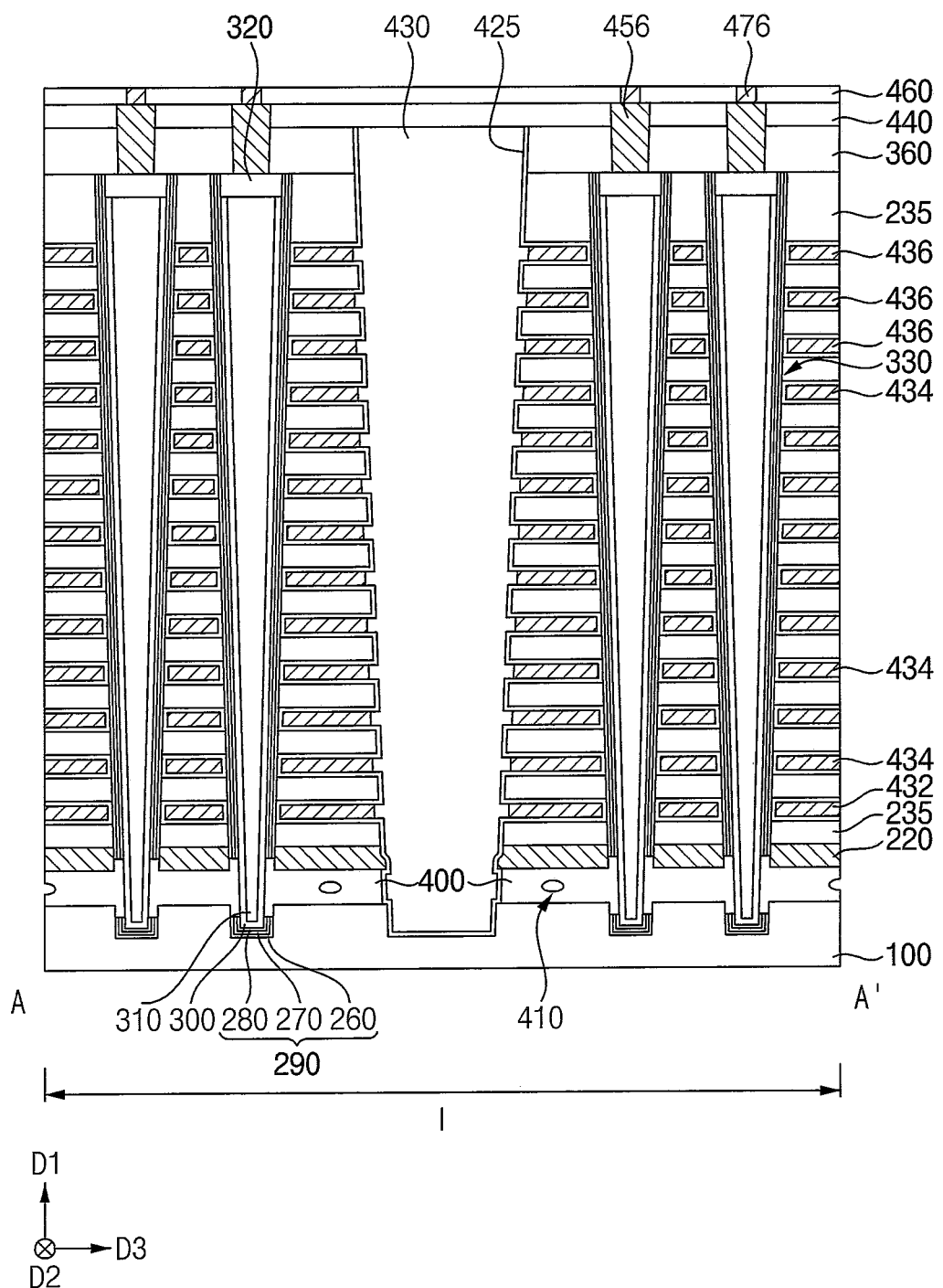
Figure 17:
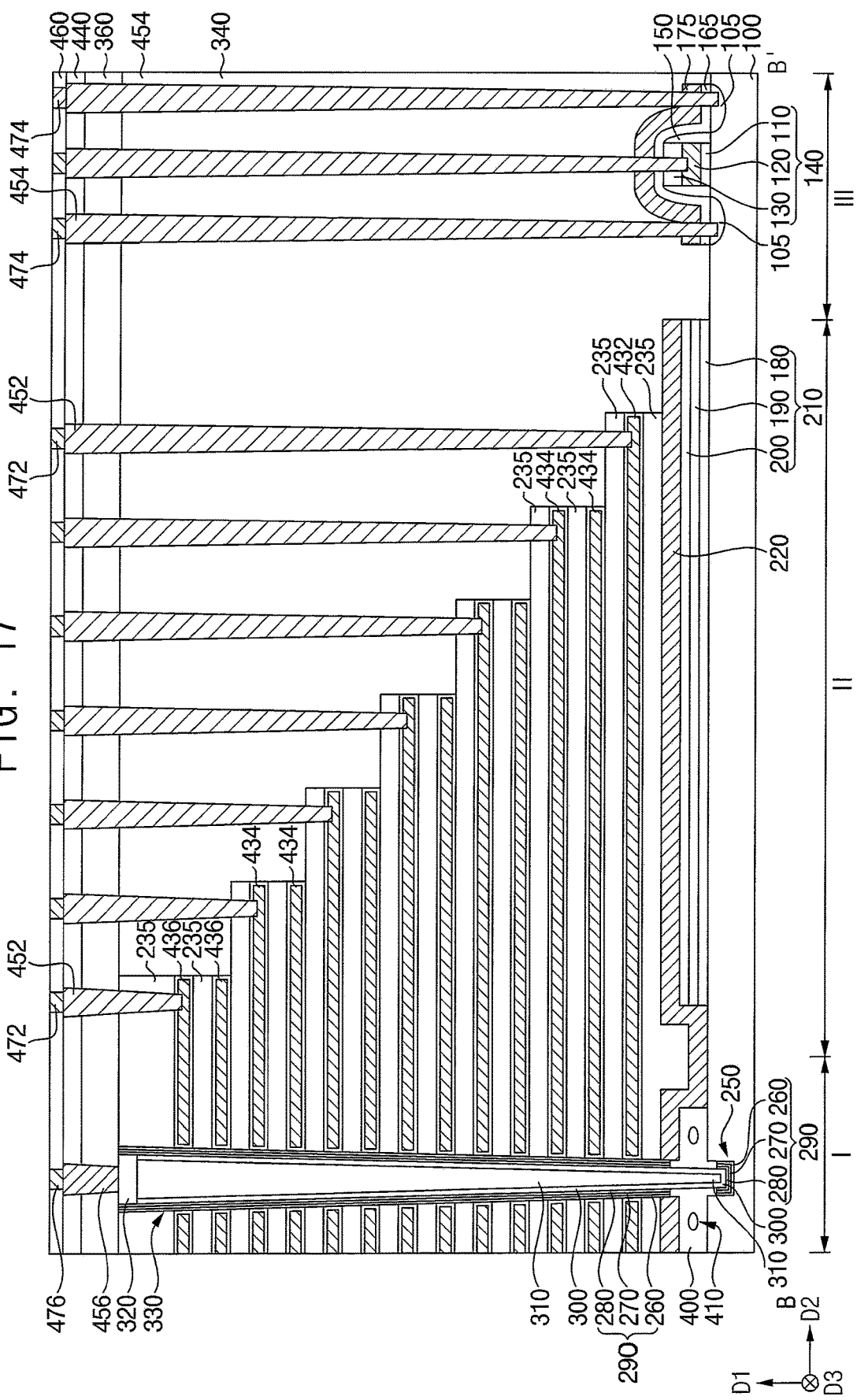

Referring to FIGS. 15 to 17, a first division layer may be formed on the second blocking layer 420 to fill the second opening 370, and planarized until the upper surface of the second insulating interlayer 360 is exposed to form a second division pattern 430. During the planarization process, a portion of the second blocking layer 420 on the upper surface of the second insulating interlayer 360 may be removed, and a remaining portion of the second blocking layer 420 may form a second blocking pattern 425.

In example embodiments, the second division pattern 430 may have a width gradually decreasing from a top toward a bottom thereof.

The second division pattern 430 may extend lengthwise in the second direction D2 on the first and second regions I and II of the first substrate 100, and a plurality of second division patterns 430 may be formed in the third direction D3. The second division pattern 430 may include an oxide, e.g., silicon oxide. An upper surface of the second division pattern 430 may be coplanar with an upper surface of the second insulating interlayer 360.

A third insulating interlayer 440 including an oxide, e.g., silicon oxide, may be formed on the second insulating interlayer 360, the second division pattern 430, and the second blocking pattern 425. First contact plugs 452 may be formed through the first to third insulating interlayers 340, 360, and 440, the second insulation pattern 235 and the second blocking pattern 425 to contact corresponding ones of the second to fourth gate electrodes 432, 434, and 436, respectively. Upper surfaces of the first contact plugs 452 may be coplanar with an upper surface of the third insulating interlayer 440, and lower surfaces of the first contact plugs 452 may be at a lower vertical level than upper surfaces of the second to fourth gate electrodes 432, 434, and 436 to which they are respectively connected. Second contact plugs 454 may be formed through the first to third insulating interlayers 340, 360, and 440, the etch stop pattern 175, the first insulation pattern 165 and the gate mask 130 to contact corresponding ones of the first gate electrode 120 and the first impurity regions 105, respectively. Upper surfaces of the second contact plugs 454 may be coplanar with the upper surface of the third insulating interlayer 440, and lower surfaces of the second contact plugs 454 may be at a lower vertical level than upper surfaces of the first gate electrode 120 and the first substrate 100 to which they are respectively connected. Third contact plugs 456 may be formed through the second and third insulating interlayers 360 and 440 to contact corresponding ones of the first capping patterns 320, respectively. Upper surfaces of the third contact plugs 456 may be coplanar with the upper surface of the third insulating interlayer 440, and lower surfaces of the third contact plugs 456 may be coplanar with a lower surface of the second insulating interlayer 360. In example embodiments, each of the first to third contact plugs 452, 454, and 456 may have a width gradually decreasing from a top toward a bottom thereof.

A fourth insulating interlayer 460 including an oxide, e.g., silicon oxide may be formed on the third insulating interlayer 440. First and second wirings 472 and 474 may be formed through the third insulating interlayer 440 to contact the first and second contact plugs 452 and 454, respectively. Upper surfaces of the first and second wirings 472 and 474 may be coplanar with an upper surface of the third insulating interlayer 440, and lower surfaces of the first and second wirings 472 and 474 may be coplanar with a lower surface of the third insulating interlayer 440. First vias 476 may be formed through the third insulating interlayer 440 to contact the third contact plugs 456, respectively. Upper surfaces of the first vias 476 may be coplanar with the upper surface of the third insulating interlayer 440, and lower surfaces of the first vias 476 may be coplanar with the lower surface of the third insulating interlayer 440. FIGS. 15 to 17 show exemplary layouts of the first to third contact plugs 452, 454, and 456 and the first and second wirings 472 and 474, however, the inventive concept may not be limited thereto, and thus the numbers and layouts of the first to third contact plugs 452, 454, and 456 and the first and second wirings 472 and 474 may be varied.

The first to third contact plugs 452, 454, and 456, the first and second wirings 472 and 474, and the first via 476 may include, e.g., a metal, a metal nitride, a metal silicide, doped polysilicon, etc.

Figure 18:
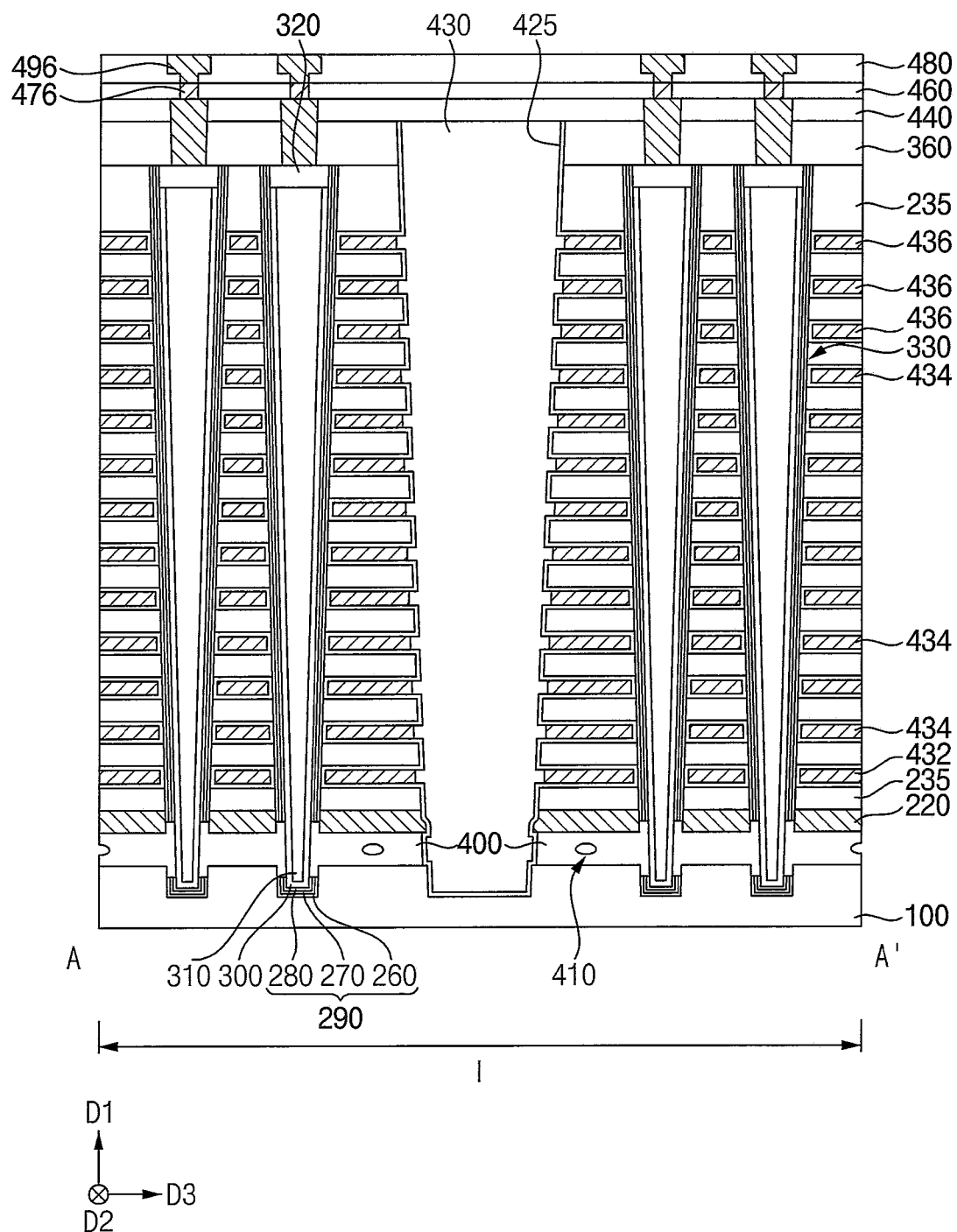
Figure 19:
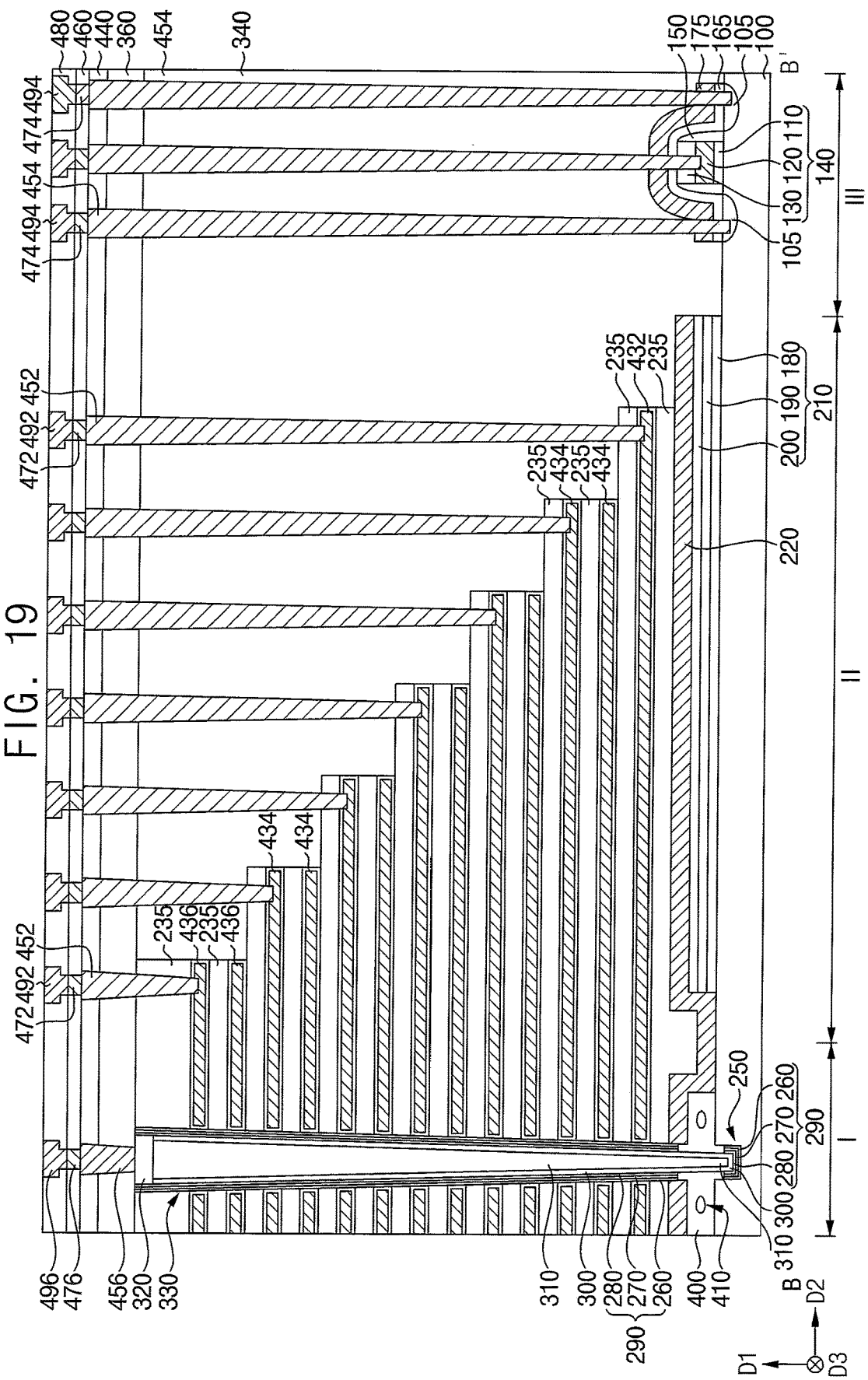

Referring to FIGS. 18 and 19, a fifth insulating interlayer 480 including an oxide, e.g., silicon oxide, may be formed on the fourth insulating interlayer 460, the first and second wirings 472 and 474, and the first via 476. First and second bonding patterns 492 and 494 may be formed through the fifth insulating interlayer 480 to contact the first and second wirings 472 and 474, respectively, and a third bonding pattern 496 may be formed through the fifth insulating interlayer 480 to contact the first via 476. Upper surfaces of the first, second, and third bonding patterns 492, 494, and 496 may be coplanar with an upper surface of the fifth insulating interlayer 480, and lower surfaces of the first, second, and third bonding patterns 492, 494, and 496 may be coplanar with a lower surface of the fifth insulating interlayer 480.

In example embodiments, the first to third bonding patterns 492, 494, and 496 may be formed to be spaced apart from each other in each of the second and third directions D2 and D3 on the first to third regions I, II and III of the first substrate 100, and may be arranged in a lattice pattern in a plan view. In an example embodiment, each of the first to third bonding patterns 492, 494, and 496 may be formed by a dual damascene process, and may include a lower portion and an upper portion having a width greater than that of the lower portion. Alternatively, each of the first to third bonding patterns 492, 494 and 496 may be formed by a single damascene process. In example embodiments, the lower portion of each of the first to third bonding patterns 492, 494, and 496 may have a first uniform width, and the upper portion of each of the first to third bonding patterns 492, 494, and 496 may have a second uniform width that is greater than the first uniform width.

The first to third bonding patterns 492, 494, and 496 may include a low resistance material, e.g., copper, aluminum, etc.

Figure 20:
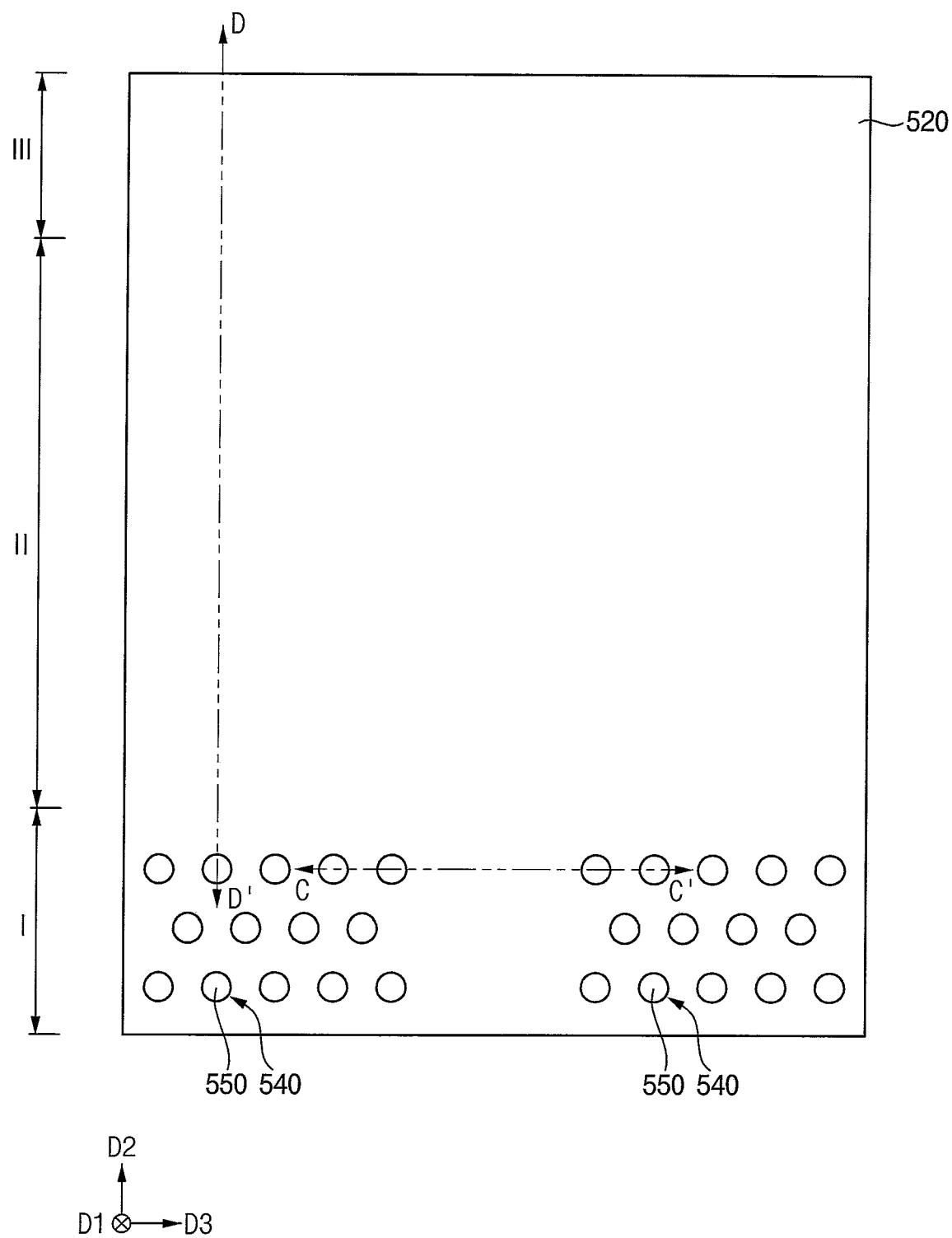
Figure 21:
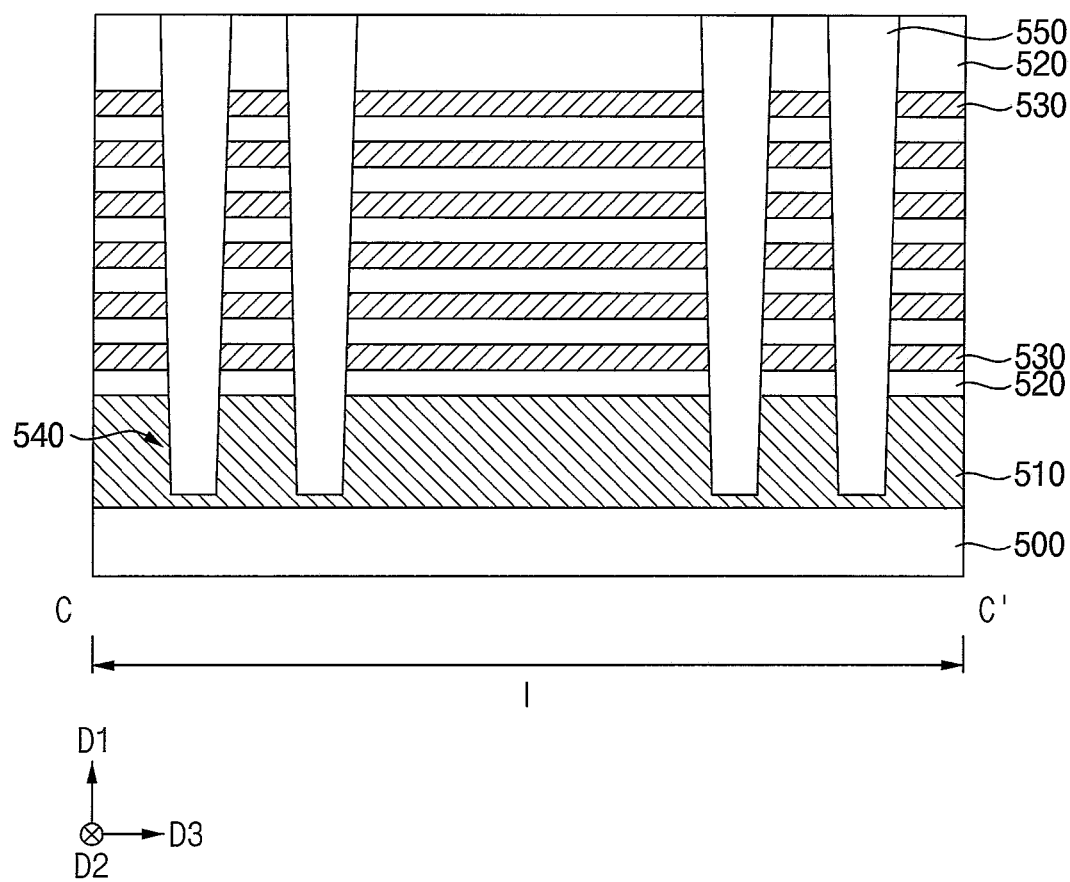
Figure 22:
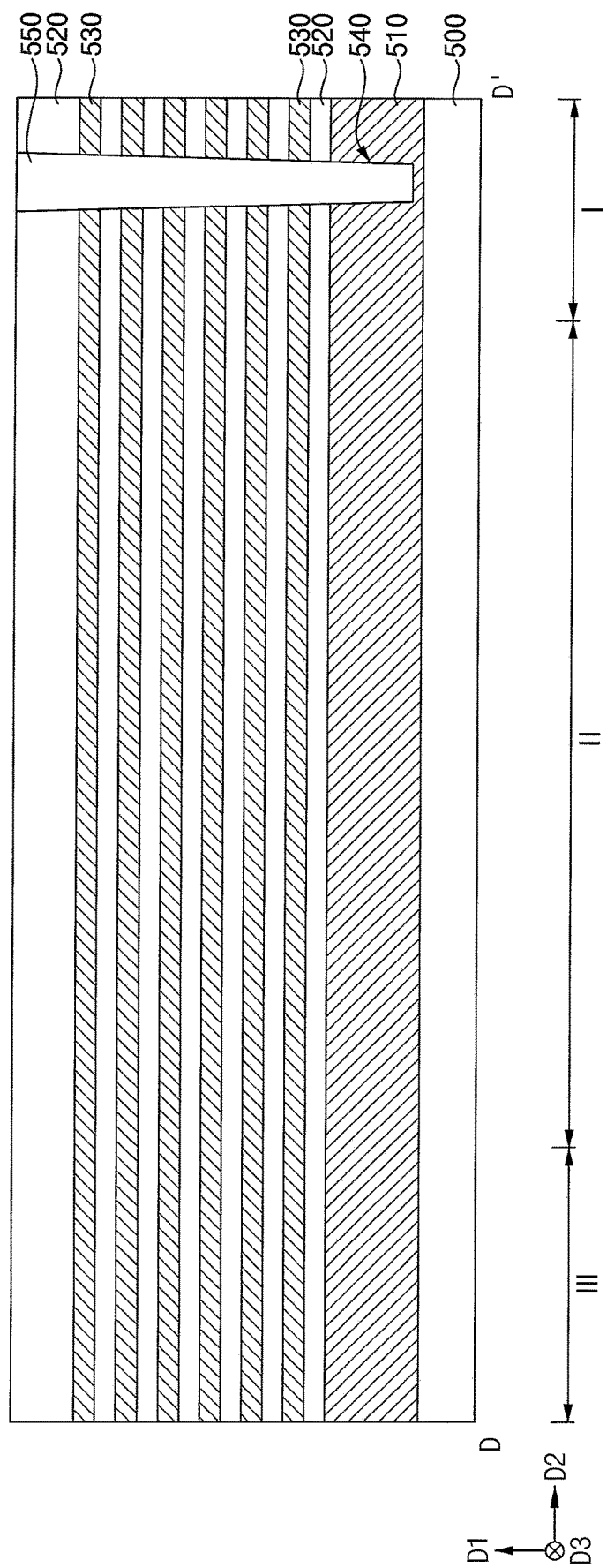

Referring to FIGS. 20 to 22, a second support layer 510 may be formed on a second substrate 500 including first to third regions I, II and III, and a third insulation layer 520 and a fifth sacrificial layer 530 may be alternately and repeatedly stacked in the first direction D1 to form a second mold layer.

The second substrate 500 may include substantially the same material as the first substrate 100, e.g., silicon, germanium, silicon-germanium or a III-V compound such as GaP, GaAs, GaSb, etc. In some embodiments, the second substrate 500 may be a silicon-on-insulator (SOI) substrate or a germanium-on-insulator (GOI) substrate.

The second support layer 510 may include substantially the same material as the first support layer 220, e.g., polysilicon doped with n-type impurities. In some embodiments, the second support layer 510 may include amorphous silicon doped with n-type impurities, and may be crystallized by heat generated through deposition processes of other layers to form polysilicon doped with n-type impurities.

The third insulation layer 520 may include an oxide, e.g., silicon oxide, and the fifth sacrificial layer 530 may include a material having a high etching selectivity with respect to the third insulation layer 520, which may include a nitride, e.g., silicon nitride.

A second channel hole 540 may be formed through the second mold layer and an upper portion of the second support layer 510 by an etching process, and a sixth sacrificial pattern 550 may be formed in the second channel hole 540.

In example embodiments, a plurality of second channel holes 540 may be formed in each of the second and third directions D2 and D3 in the first region I.

In example embodiments, each of the second channel holes 540 may have a width gradually decreasing from a top end toward a bottom end due to the characteristics of the etching process.

A sixth sacrificial layer may be formed on the second support layer 510 and an uppermost one of the third insulation layers 520 to fill the second channel holes 540, and may be planarized until an upper surface of the uppermost one of the third insulation layers 520 is exposed to form a sixth sacrificial pattern 550 in the second channel hole 540. The sixth sacrificial pattern 550 may include a material having an etching selectivity with respect to the third insulation layer 520 and the fifth sacrificial layer 530, e.g., polysilicon.

FIG. 21 shows that the second mold layer includes the third insulation layers 520 at seven levels and the fifth sacrificial layers 530 at six levels, however, the inventive concept may not be limited thereto. In some example embodiments, in the second mold layer, the number of third insulation layers 520 may be one more than the number of fifth sacrificial layers 530. In other example embodiments, in the second mold layer, the number of third insulation layers 520 may be the same as the number of fifth sacrificial layers 530. In some embodiments, an uppermost one of the third insulation layers 520 may have a thickness greater than those of other ones of the third insulation layers 520.

Figure 23:
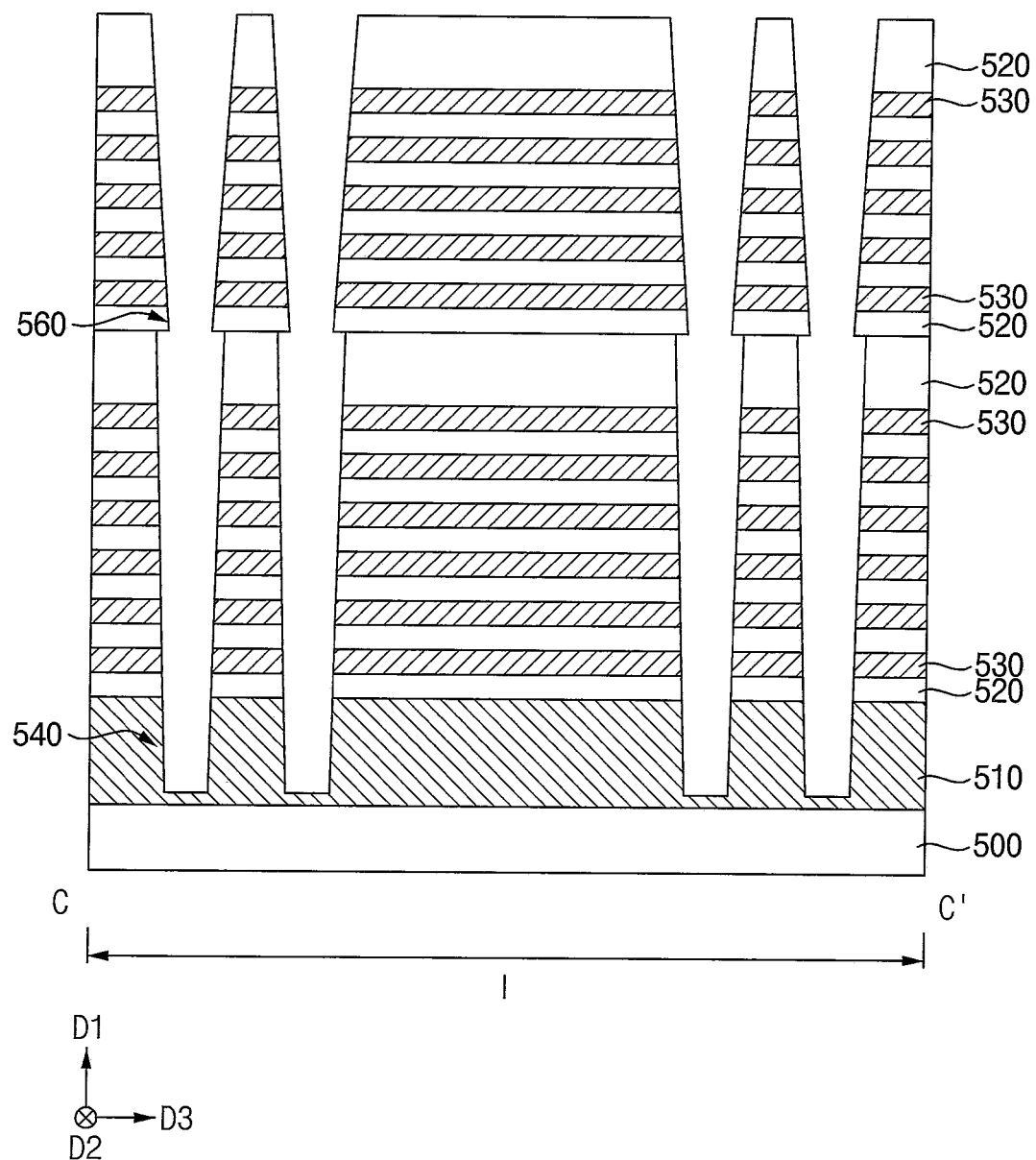
Figure 24:
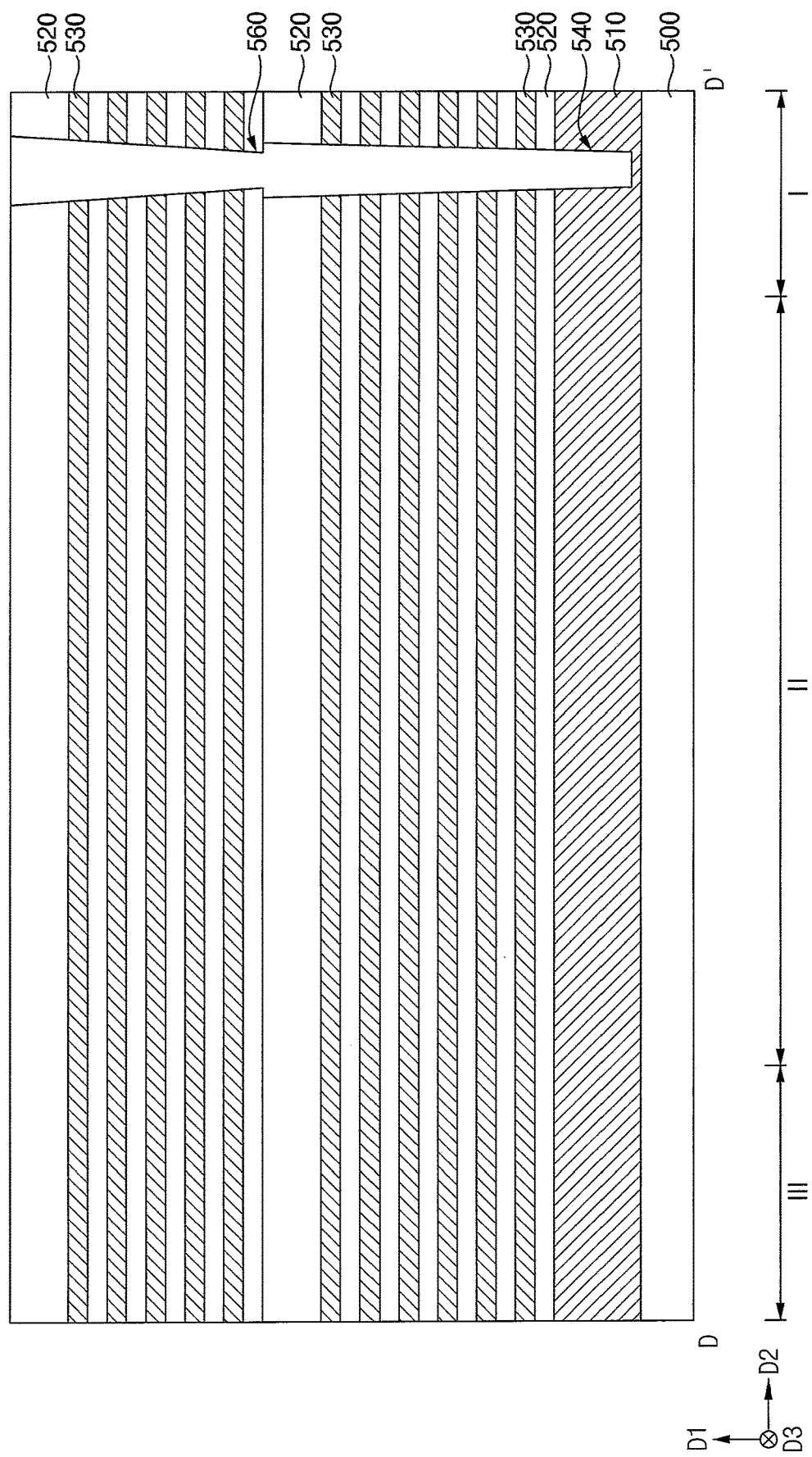

Referring to FIGS. 23 and 24, the third insulation layer 520 and the fifth sacrificial layer 530 may be alternately and repeatedly stacked in the first direction D1 on the second mold layer and the sixth sacrificial pattern 550 to form a third mold layer. The second and the third mold layers may form a mold layer structure.

A third channel hole 560 may be formed through the third mold layer to expose an upper surface of the sixth sacrificial pattern 550 by an etching process.

In example embodiments, a plurality of third channel holes 560 may be formed to be spaced apart from each other in each of the second and third directions D2 and D3.

In example embodiments, each of the third channel holes 560 may have a width gradually decreasing from a top end toward a bottom end due to the characteristics of the etching process.

The sixth sacrificial patterns 550 exposed by the third channel holes 560 may be removed by, e.g., a wet etching process so that the second channel holes 54 may be formed again.

FIGS. 23 and 24 show that the third mold layer includes the third insulation layers 520 at six levels and the fifth sacrificial layers 530 at five levels, however, the inventive concept may not be limited thereto. In some example embodiments, in the third mold layer, the number of third insulation layers 520 may be one more than the number of fifth sacrificial layers 530. In other example embodiments, in the third mold layer, the number of third insulation layers 520 may be the same as the number of fifth sacrificial layers 530. An uppermost one of the third insulation layers 520 may have a thickness greater than those of other ones of the third insulation layers 520.

Additionally, FIGS. 23 and 24 show that the mold layer structure includes the second and third mold layers stacked in the first direction D1, however, the inventive concept may not be limited thereto, and may include more mold layers stacked in the first direction D1. Thus, a distance from a bottom surface to a top surface of the mold layer structure may be greater than a distance from a bottom surface to a top surface of the first mold.

Figure 25:
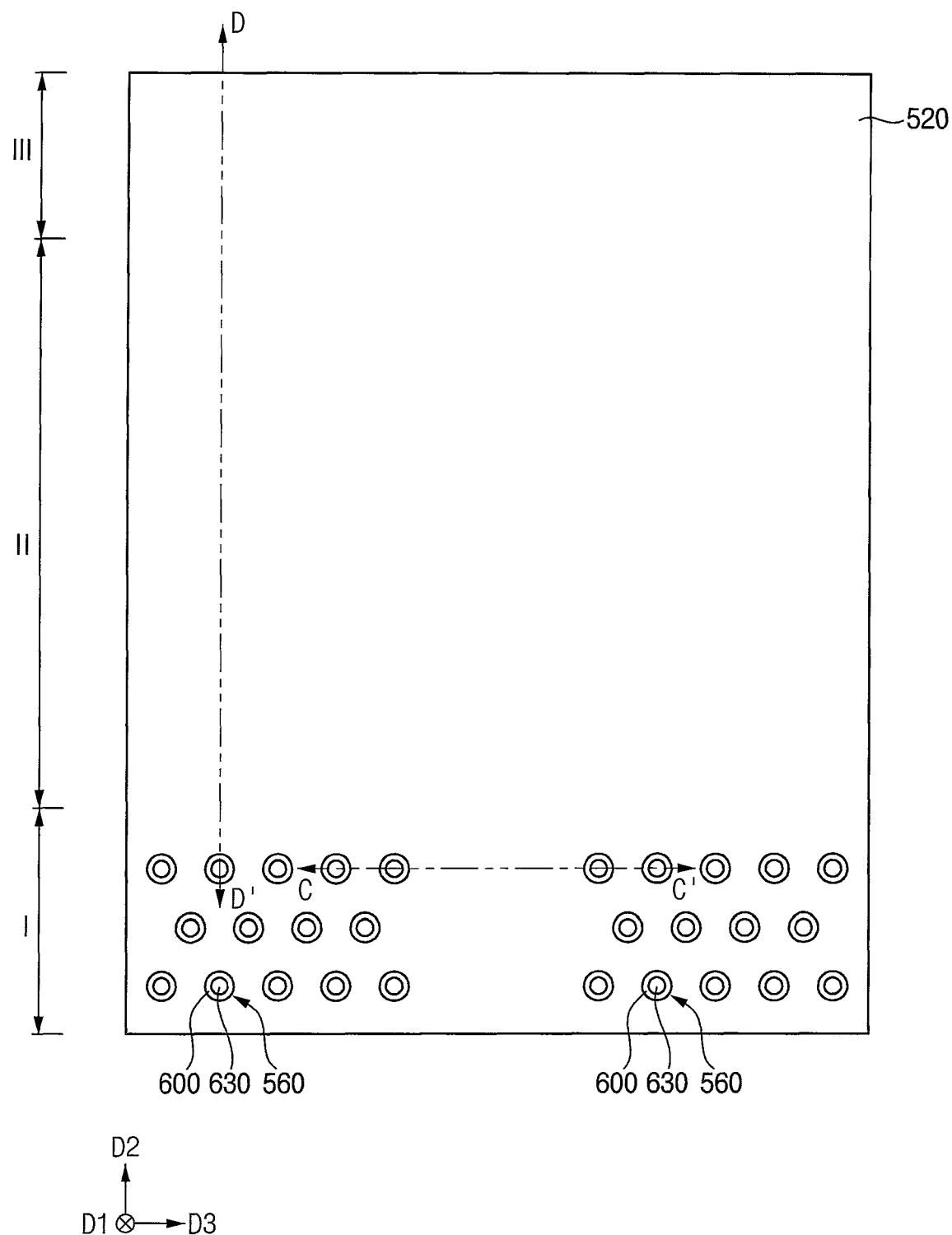
Figure 26:
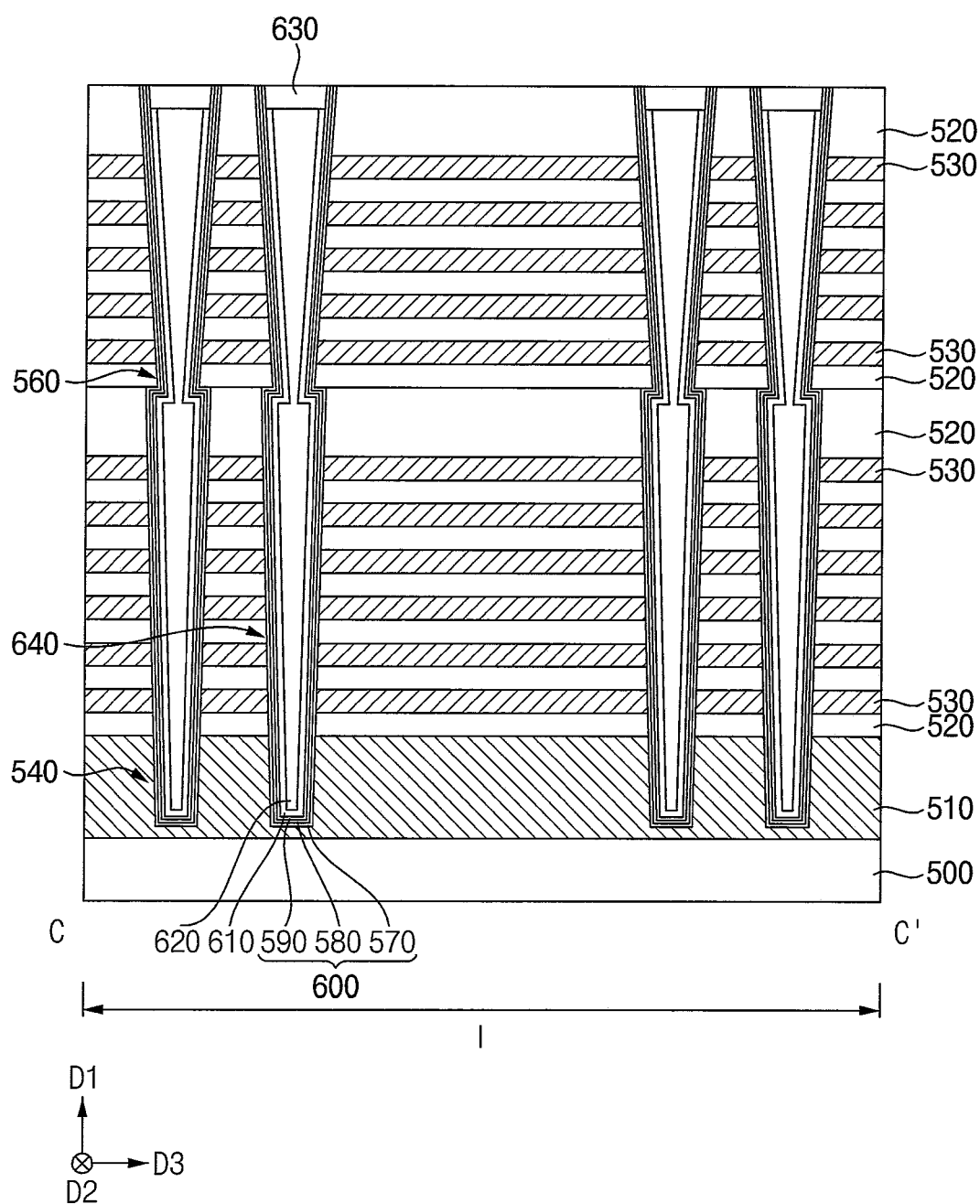
Figure 27:
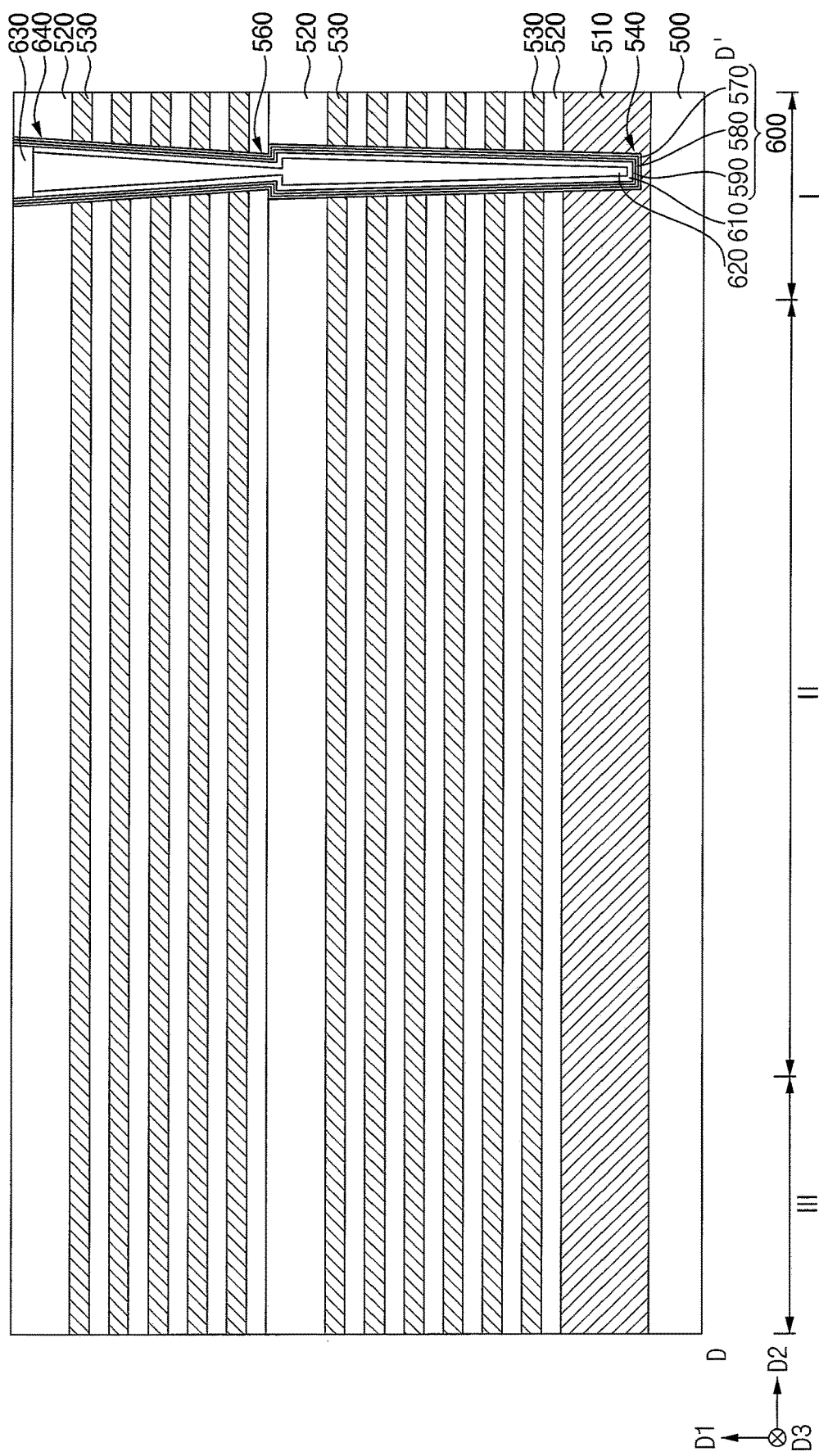

Referring to FIGS. 25 to 27, a second charge storage structure layer may be formed on a sidewall and a lower surface of the second channel hole 540, a sidewall of the third channel hole 560, and the uppermost one of the third insulation layers 520 in the mold layer structure, a second channel layer may be formed on the second charge storage structure layer, and a second filling layer may be formed on the second channel layer to fill the second and third channel holes 540 and 560.

The second channel layer may include substantially the same material as the first channel layer, e.g., polysilicon, and the second filling layer may include substantially the same material as the first filling layer, e.g., an oxide such as silicon oxide.

The second charge storage structure layer may include a third blocking layer, a second charge storage layer, and a second tunnel insulation layer sequentially stacked from inner walls of the second and third channel holes 540 and 560. The third blocking layer and the second tunnel insulation layer may include substantially the same material as the first blocking layer and the first tunnel insulation layer, respectively, e.g., an oxide such as silicon oxide, and the second charge storage layer may include substantially the same material as the first charge storage layer, e.g., nitride such as silicon nitride.

The second filling layer, the second channel layer, and the second charge storage structure layer may be planarized until an upper surface of the uppermost one of the third insulation layers 520 in the mold layer structure, and thus a second filling pattern 620, a second channel 610, and a second charge storage structure 600 may be formed in the second and third channel holes 540 and 560. The second charge storage structure 600 may include a third blocking pattern 570, a second charge storage pattern 580, and a second tunnel insulation pattern 590 sequentially stacked from sidewalls of the second and third channel holes 540 and 560 and a lower surface of the second channel hole 540.

In example embodiments, the second filling pattern 620 may have a pillar shape extending lengthwise in the first direction D1, the second channel 610 may have a cup shape covering a sidewall and a lower surface of the second filling pattern 620, and the second charge storage structure 600 may have a cup shape covering an outer sidewall and a lower surface of the second channel 610.

Upper portions of the second channel 610 and the second filling pattern 620 may be removed to form a trench, and a second capping pattern 630 may be formed in the trench. In example embodiments, the second capping pattern 630 may include polysilicon doped with impurities or amorphous silicon doped with impurities, and if the second capping pattern 630 includes amorphous silicon, a crystallization process may be further performed.

The second filling pattern 620, the second channel 610, the second charge storage structure 600, and the second capping pattern 630 may form a second memory channel structure 640. In example embodiments, a plurality of second memory channel structures 640 may be spaced apart from each other in each of the second and third directions D2 and D3. An upper surface of each of the second memory channel structures 640 may have an area greater than a lower surface thereof. Each of the second memory channel structures 640 may include a first portion having a width gradually decreasing from a top toward a bottom thereof and a second portion on and contacting the first portion and having a width gradually decreasing from a top toward a bottom thereof.

The first and second memory channel structures 330 and 640 may correspond to the memory channel structures 3220 and 4220 shown in FIGS. 2 and 3.

Figure 28:
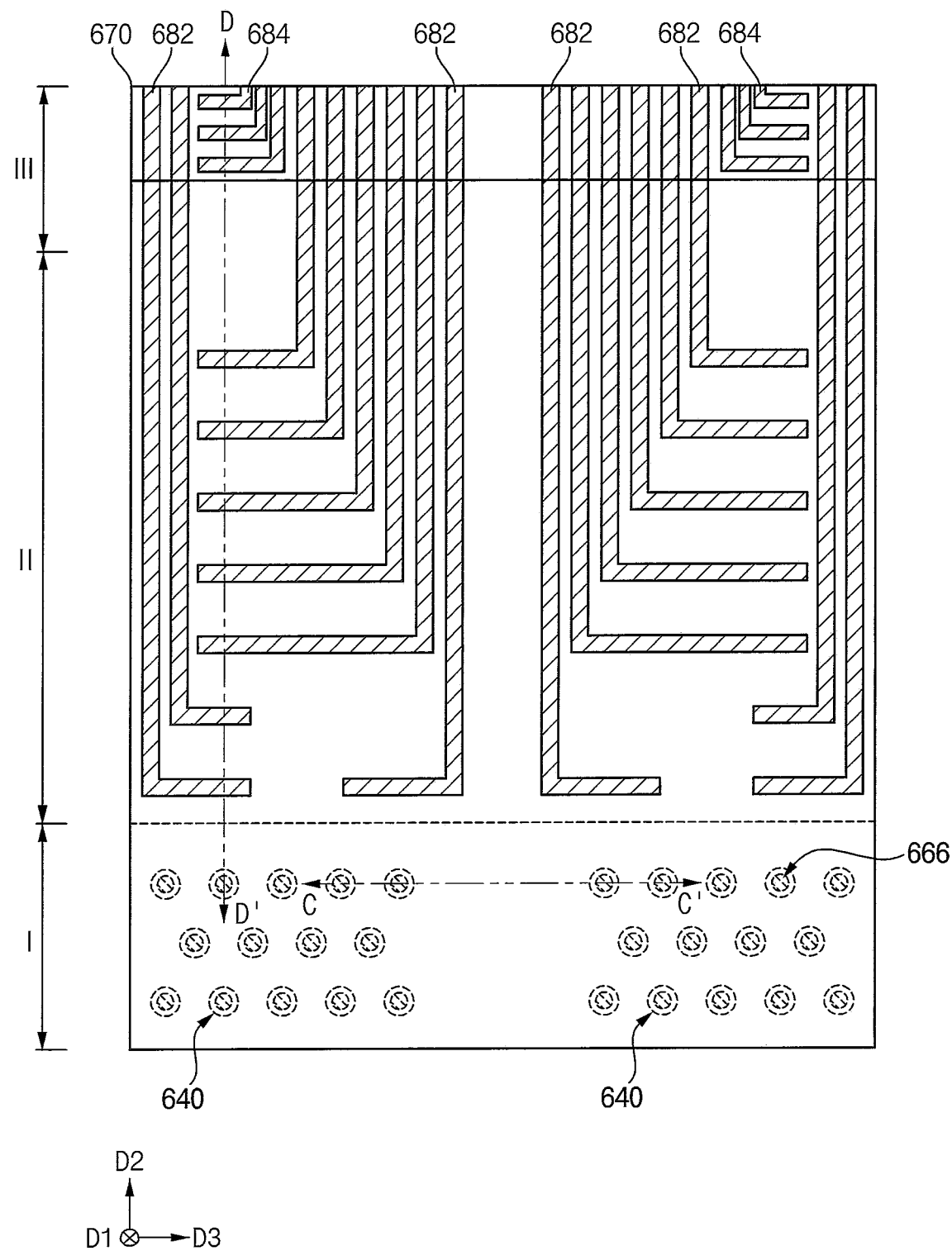
Figure 29:
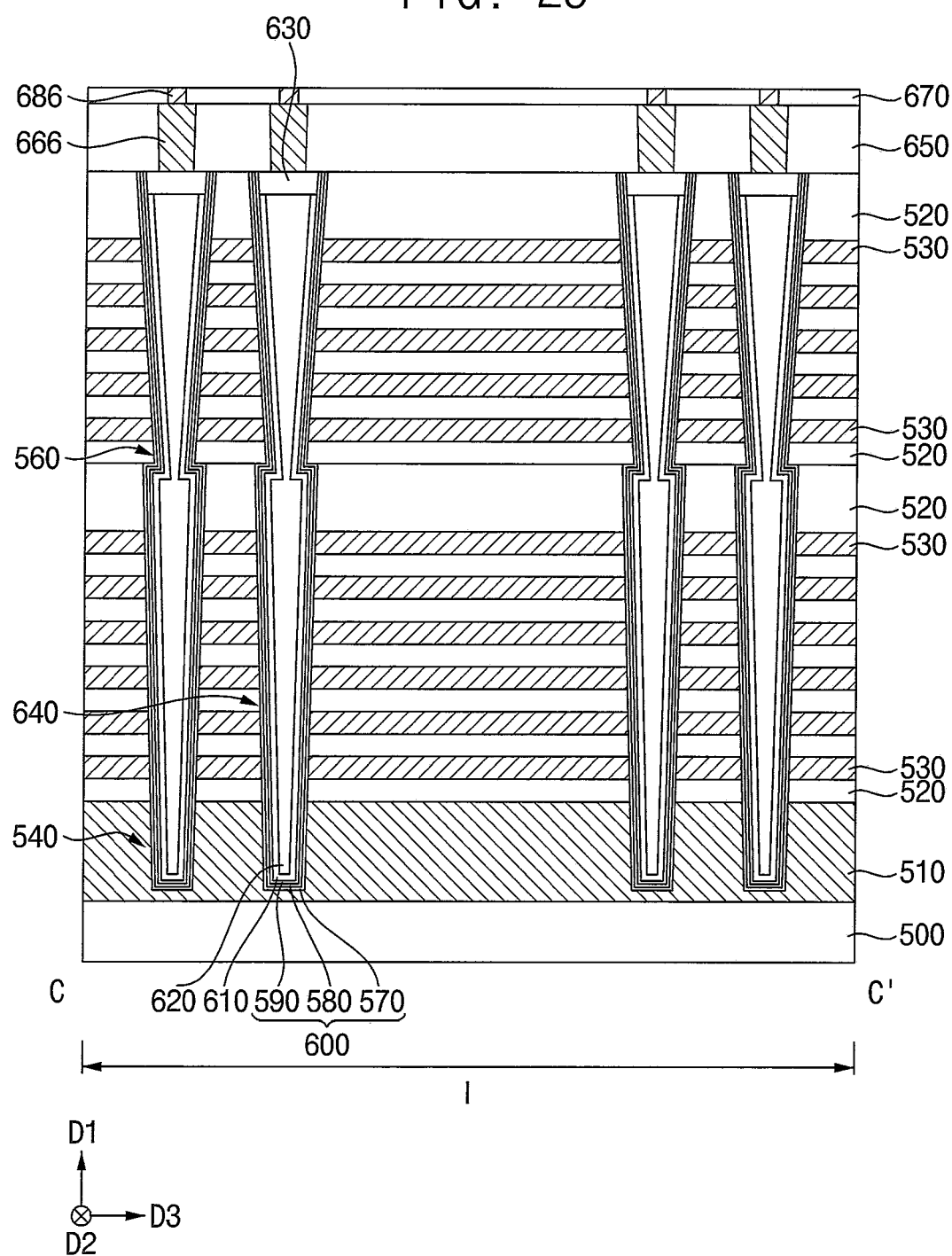
Figure 30:
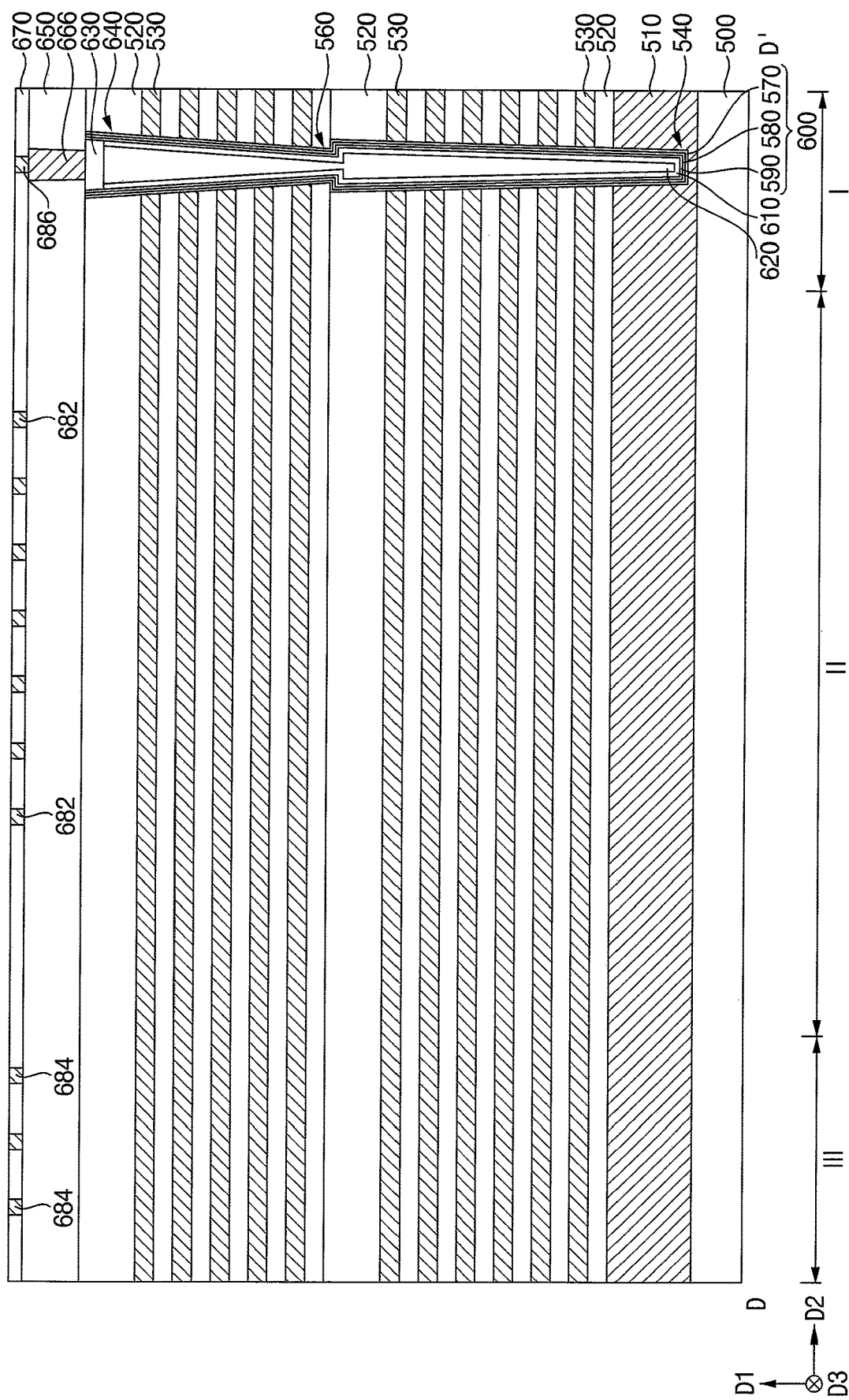

Referring to FIGS. 28 to 30, a sixth insulating interlayer 650 including an oxide, e.g., silicon oxide, may be formed on the uppermost one of the third insulation layers 520 in the mold layer structure and the second memory channel structure 640, and fourth contact plugs 666 may be formed through the sixth insulating interlayer 650 to contact the second capping patterns 630, respectively. Each of the fourth contact plugs 666 may have a width gradually decreasing from a top portion toward a bottom portion thereof. Upper surfaces of the fourth contact plugs 666 may be coplanar with an upper surface of the sixth insulating interlayer 650, and lower surfaces of the fourth contact plugs 666 may be coplanar with a lower surface of the sixth insulating interlayer 650.

A seventh insulating interlayer 670 including an oxide, e.g., silicon oxide may be formed on the sixth insulating interlayer 650, and third and fourth wirings 682 and 684 and second vias 686 may be formed through the seventh insulating interlayer 670. Upper surfaces of the third and fourth wirings 682 and 684 and the second vias 686 may be coplanar with an upper surface of the seventh insulating interlayer 670, and lower surfaces of the third and fourth wirings 682 and 684 and the second vias 686 may be coplanar with a lower surface of the seventh insulating interlayer 670. The second vias 686 may contact the fourth contact plugs 666, respectively. FIGS. 28 to 30 show exemplary layouts of the fourth contact plug 666 and the third and fourth wirings 682 and 684, however, the inventive concept may not be limited thereto, and thus the numbers and layouts of the fourth contact plug 666 and the third and fourth wirings 682 and 684 may be varied.

The fourth contact plug 666, the third and fourth wirings 682 and 684 and the second via 686 may include, e.g., a metal, a metal nitride, a metal silicide, doped polysilicon, etc.

Figure 31:
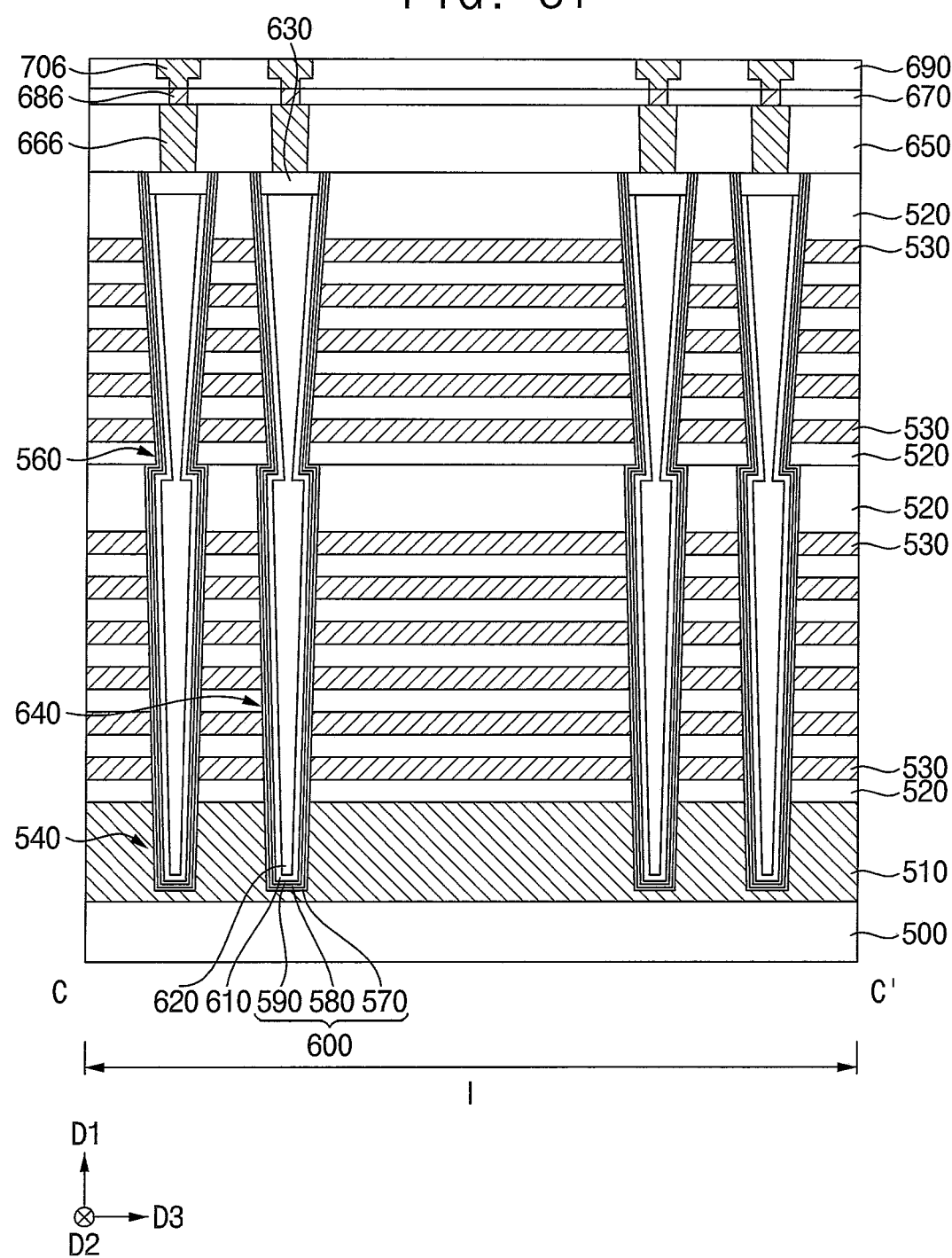
Figure 32:
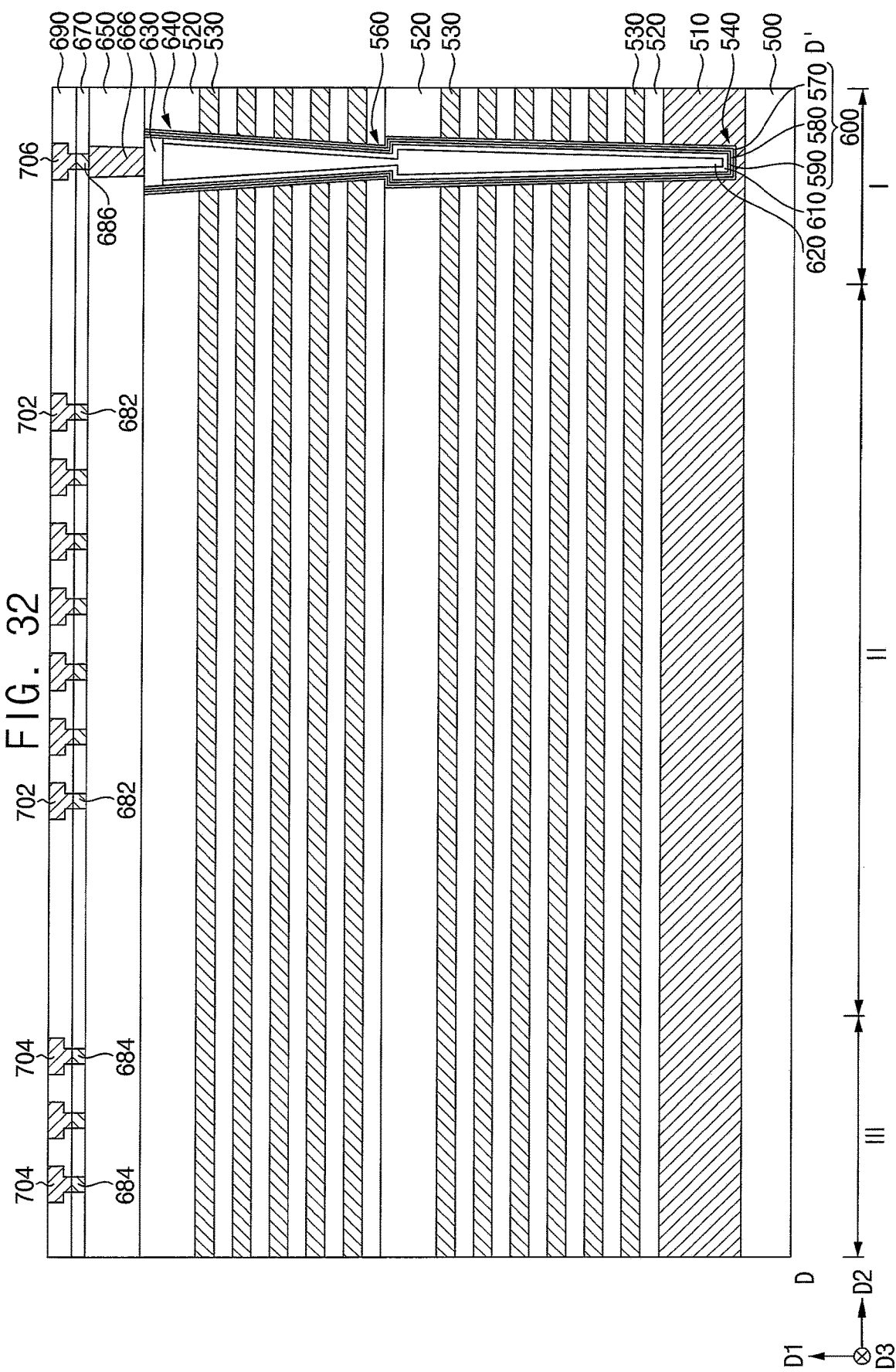

Referring to FIGS. 31 and 32, an eighth insulating interlayer 690 including an oxide, e.g., silicon oxide, may be formed on the seventh insulating interlayer 670, the third and fourth wirings 682 and 684, and the second via 686.

Fourth and fifth bonding patterns 702 and 704 may be formed through the eighth insulating interlayer 690 to contact the third and fourth wirings 682 and 684, respectively, and a sixth bonding pattern 706 may be formed through the eighth insulating interlayer 690 to contact the second via 686. Upper surfaces of the fourth to sixth bonding patterns 702, 704, and 706 may be coplanar with an upper surface of the eighth insulating interlayer 690, and lower surfaces of the fourth to sixth bonding patterns 702, 704, and 706 may be coplanar with a lower surface of the eighth insulating interlayer 690.

In example embodiments, the fourth to sixth bonding patterns 702, 704, and 706 may be spaced apart from each other in each of the second and third directions D2 and D3 on the first to third regions I, II and III of the second substrate 500, and may be arranged in a lattice pattern in a plan view. In an example embodiment, the fourth to sixth bonding patterns 702, 704, and 706 may be formed by a dual damascene process, and may include a lower portion and an upper portion having a width greater than that of the lower portion. Alternatively, the fourth to sixth bonding patterns 702, 704, and 706 may be formed by a single damascene process. In example embodiments, the lower portion of each of the fourth to sixth bonding patterns 702, 704, and 706 may have a first uniform width, and the upper portion of each of the fourth to sixth bonding patterns 702, 704, and 706 may have a second uniform width that is greater than the first uniform width.

The fourth to sixth bonding patterns 702, 704, and 706 may include a low resistance material, e.g., copper, aluminum, etc.

Figure 33:
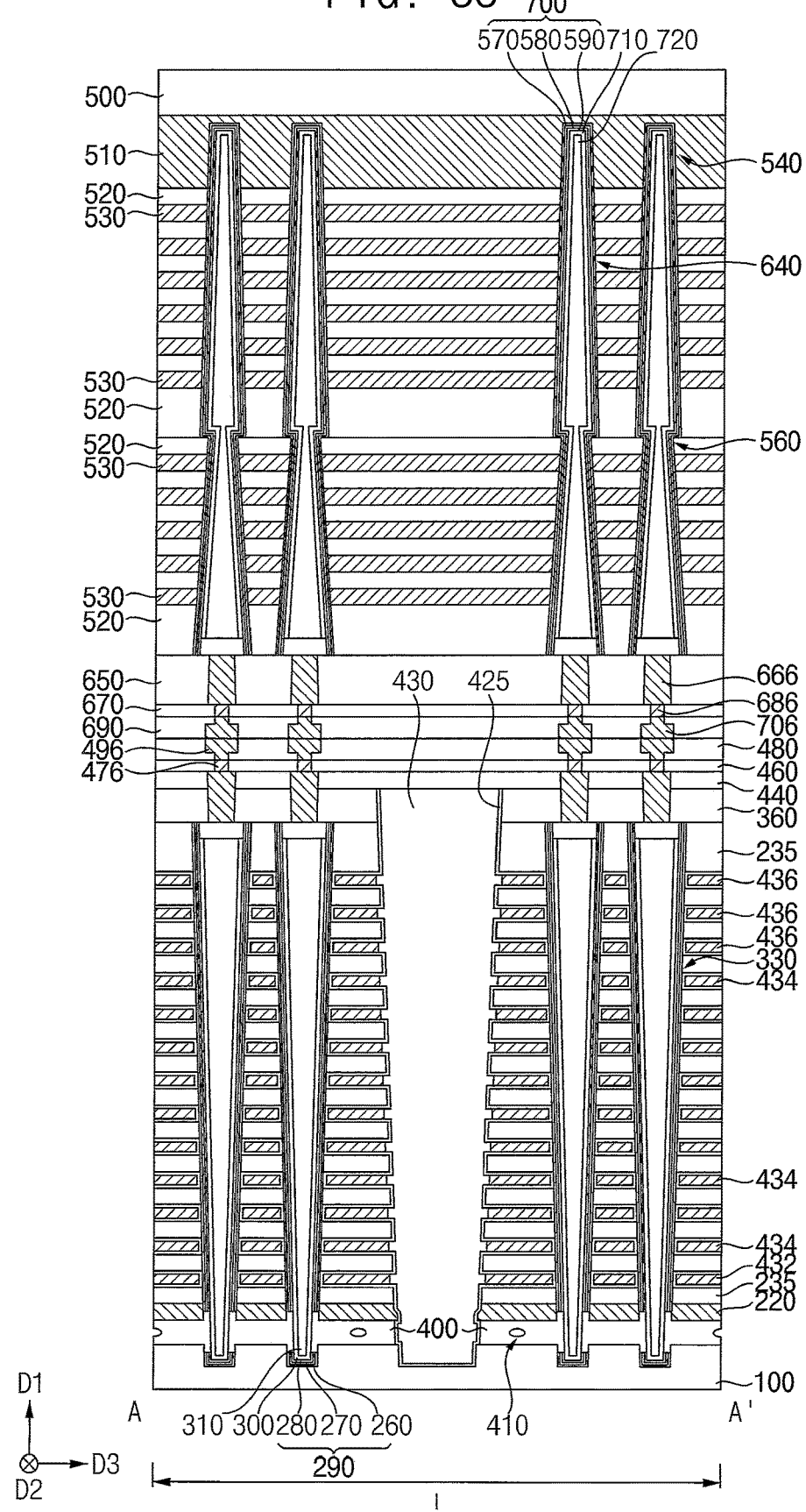
Figure 34:
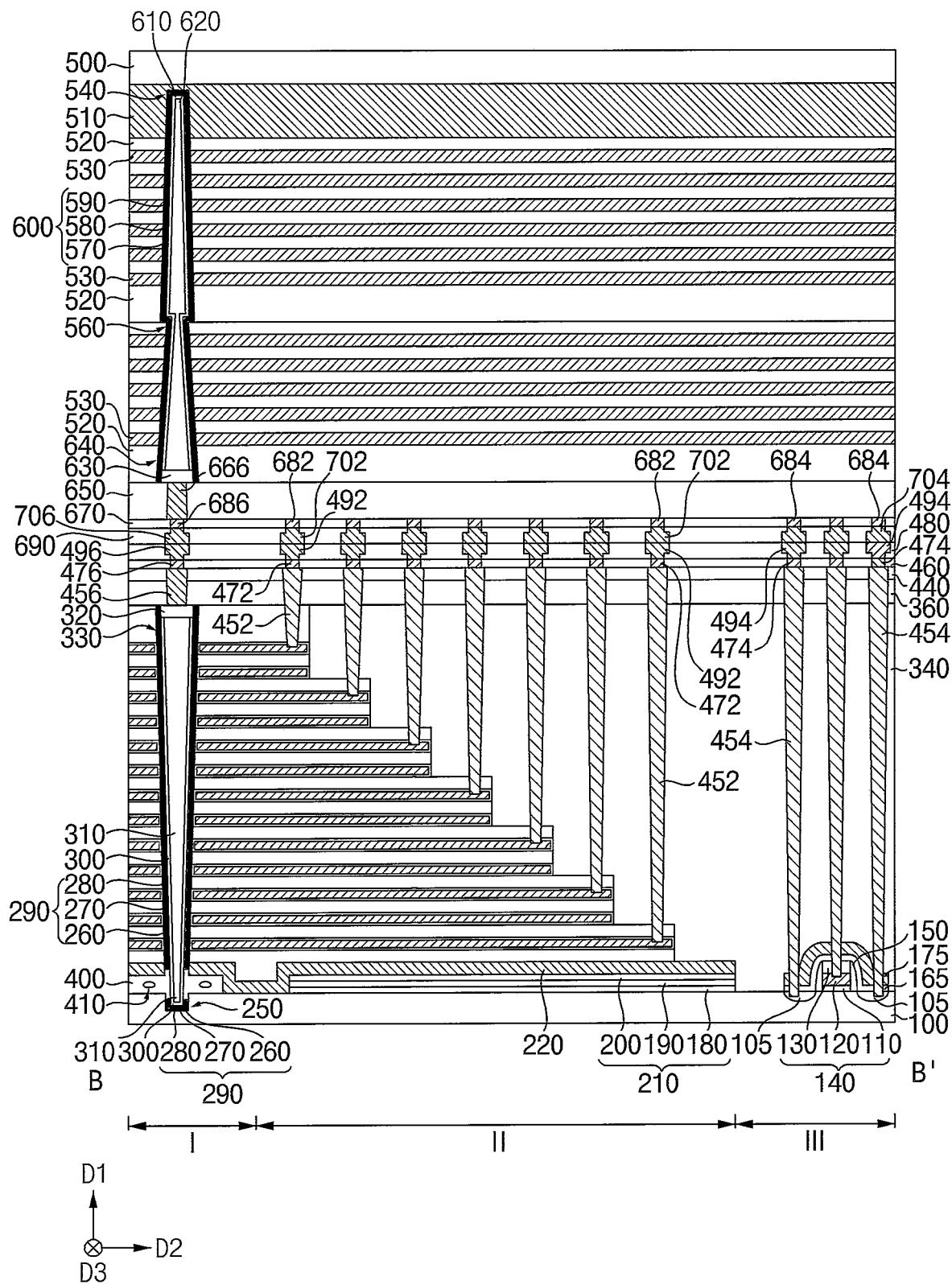

Referring to FIGS. 33 and 34, the second substrate 500 may be overturned, and the eighth insulating interlayer 690 may be bonded with the fifth insulating interlayer 480 on the first substrate 100, and the fourth to sixth bonding patterns 702, 704, and 706 may contact the first to third bonding patterns 492, 494, and 496, respectively. The first and fourth bonding patterns 492 and 702 may form a first bonding structure, the second and fifth bonding patterns 494 and 704 may form a second bonding structure, and the third and sixth bonding patterns 496 and 706 may form a third bonding structure.

Various structures on the second substrate 500 may be upside down, and hereinafter, may be explained with reference to the changed direction.

For example, the upper surface of the second memory channel structure 640 may have an area less than that of the lower surface thereof. The second memory channel structure 640 may include the lower portion having a width gradually increasing from a top toward a bottom thereof and the upper portion having a width gradually increasing from a top toward a bottom thereof. The fourth contact plug 666 may have a width gradually increasing from a top portion toward a bottom portion thereof.

The first to third regions I, II, and III of the first substrate 100 may correspond to the first to third regions I, II, and III of the second substrate 500.

Figure 35:
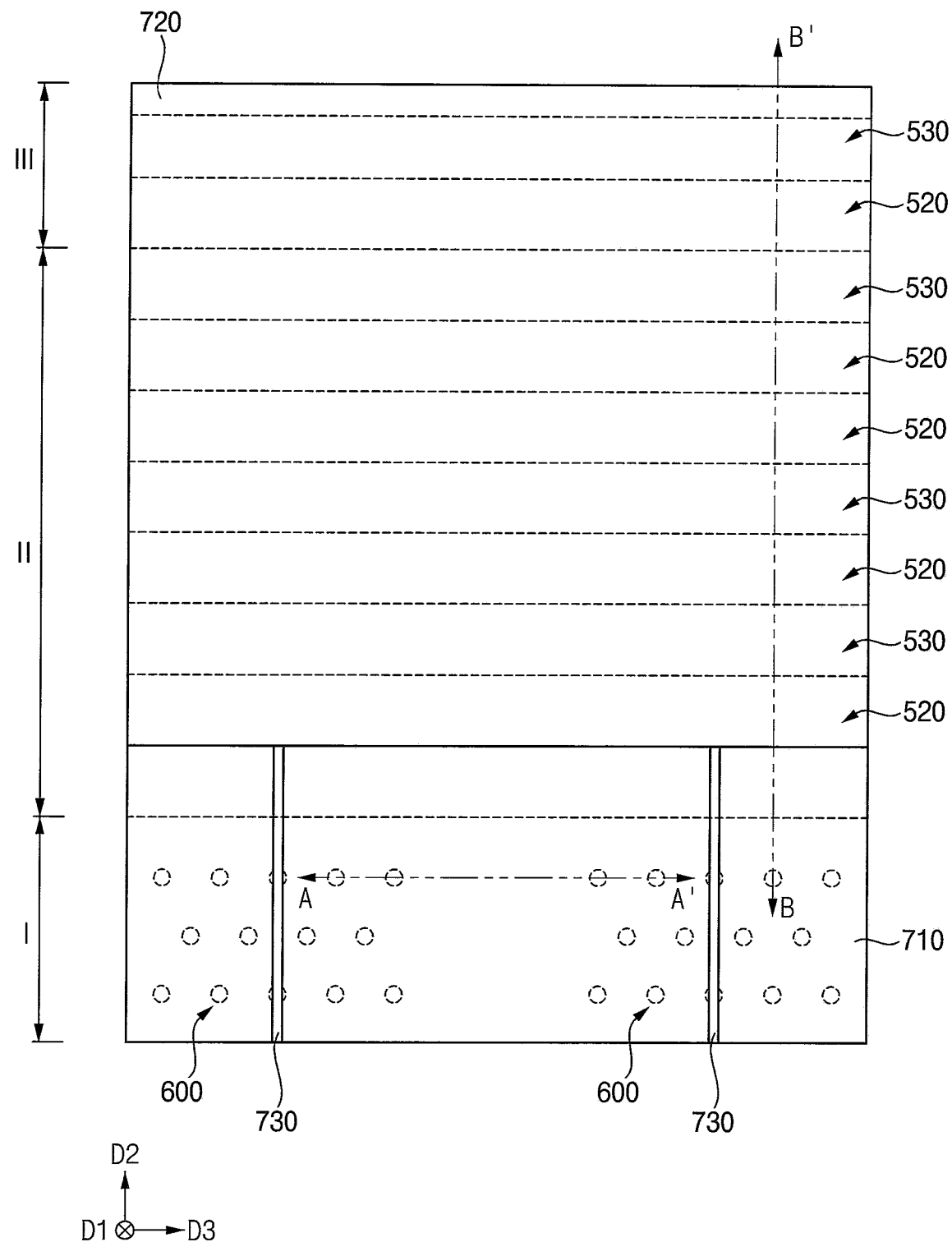
Figure 36:
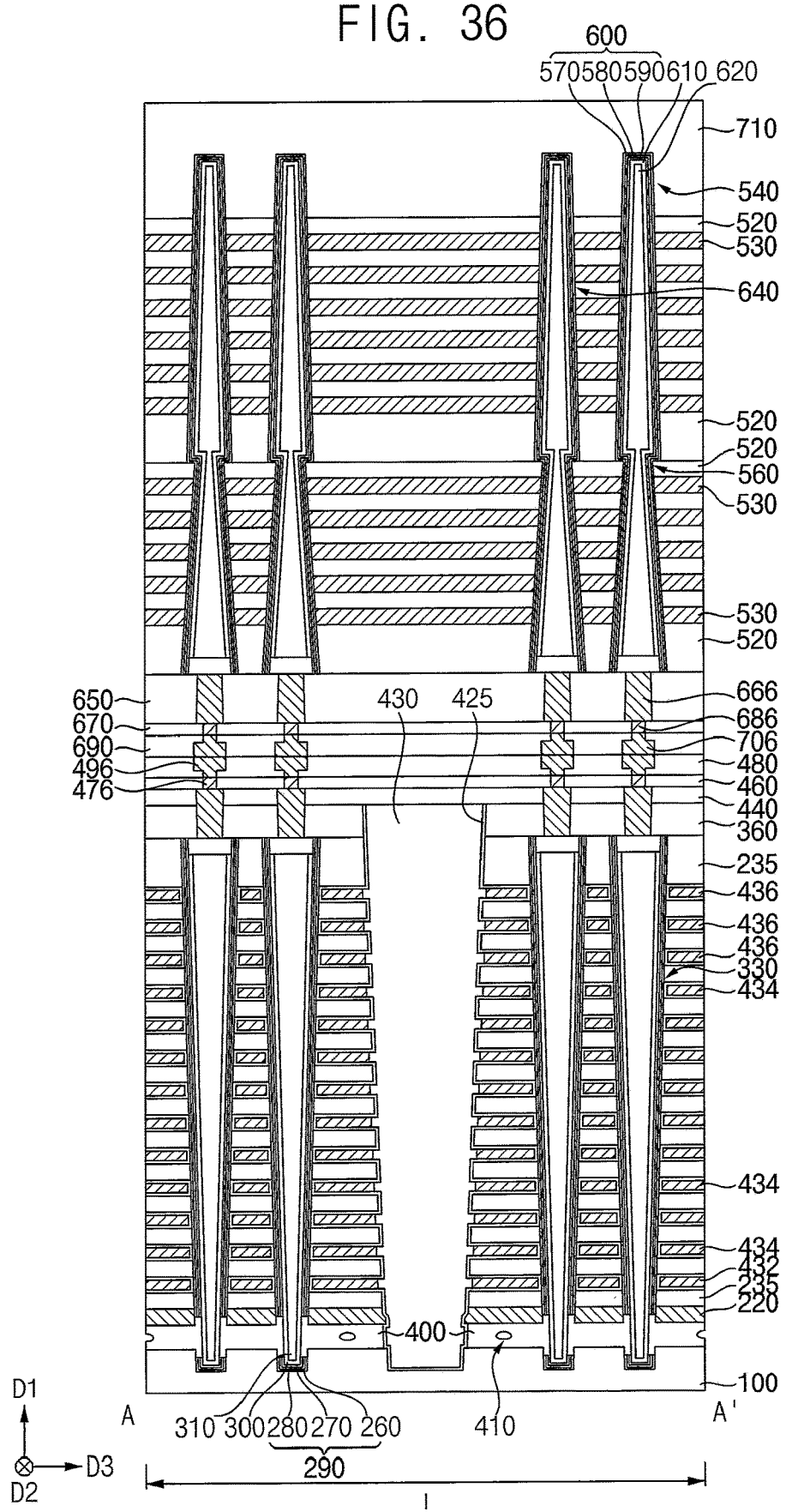
Figure 37:
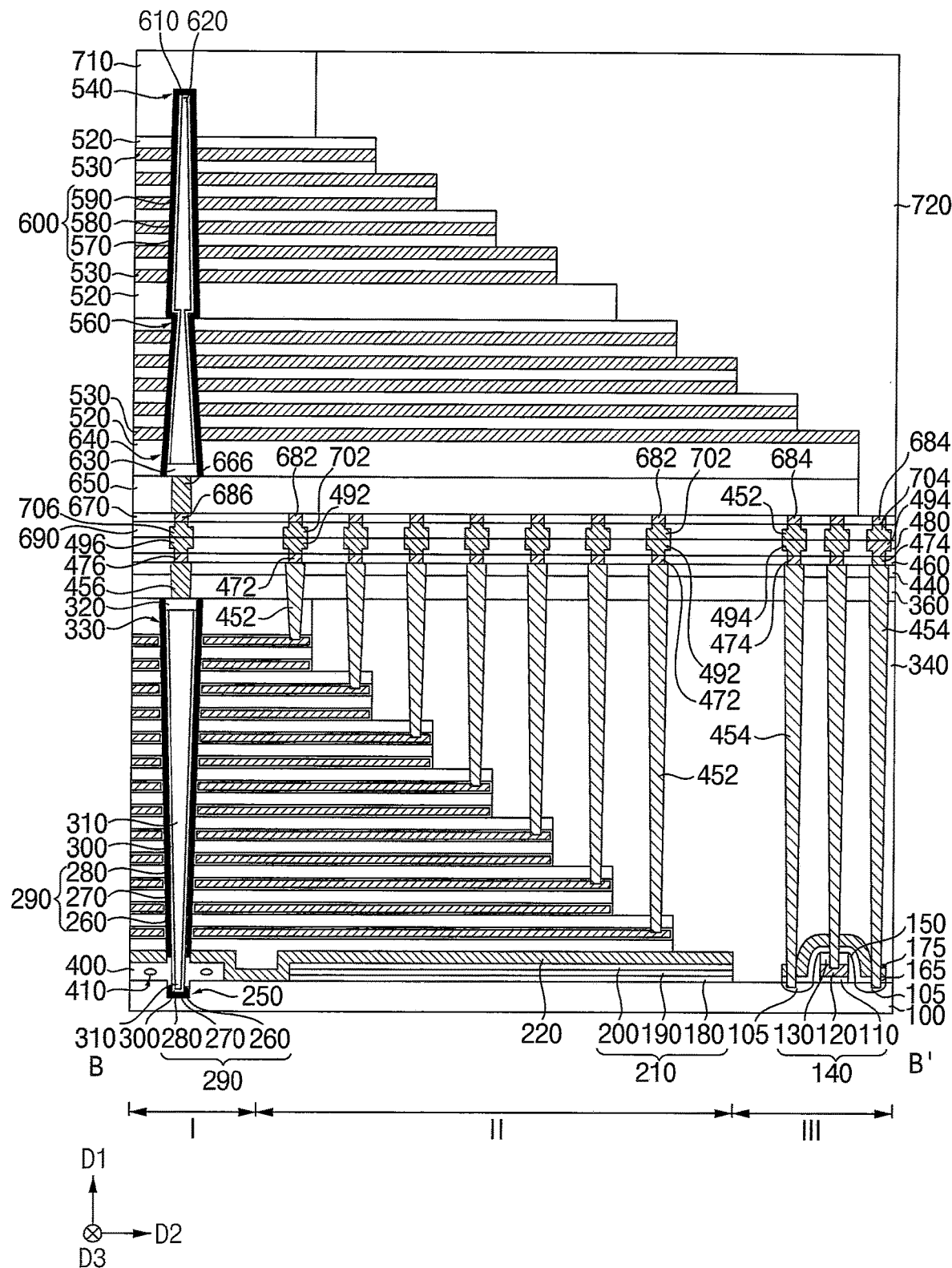

Referring to FIGS. 35 to 37, the second substrate 500 and the second support layer 510 may be removed by, e.g., a grind process and/or a wet etching process, and a ninth insulating interlayer 710 may be formed on the uppermost one of the third insulation layers 520 in the mold layer structure to cover the second memory channel structure 640.

A second photoresist layer may be formed on the ninth insulating interlayer 710, and may be patterned to form a second photoresist pattern. The ninth insulating interlayer 710 may be etched using the second photoresist pattern as an etching mask. Thus, the uppermost one of the third insulation layers 520 under the ninth insulating interlayer 710 may be partially exposed. After performing a trimming process for reducing an area of the second photoresist pattern by a given ratio, the uppermost one of the third insulation layers 520, an uppermost one of the fifth sacrificial layers 530, one of the third insulation layers 520 at a second level from above, and one of the fifth sacrificial layers 530 at a second level from above may be etched using the reduced second photoresist pattern as an etching mask.

The trimming process and the etching process may be repeatedly performed to form a second mold including a plurality of step layers each of which may include one fifth sacrificial layer 530 and one third insulation layer 520 and having a staircase shape on the first to third regions I, II and III of the first substrate 100. An end portion in the second direction D2 of each step layer may not be overlapped with upper step layers but may be exposed, which may be referred to as a "step." In example embodiments, the steps of the second mold may be arranged in the second direction D2 and/or in the third direction D3 on the second and third regions II and III of the first substrate 100.

An edge portion of the seventh insulating interlayer 670 and some of the fourth wirings 684 may not be covered by the second mold, but may be exposed.

A tenth insulating interlayer 720 may be formed on the exposed seventh insulating interlayer 670 and the fourth wiring 684 to cover the second mold and on the sixth and ninth insulating interlayers 650 and 710, and may be planarized until an upper surface of the ninth insulating interlayer 710 is exposed, and thus a sidewall of the second mold and sidewalls of the sixth and ninth insulating interlayers 650 and 710 may be covered by the tenth insulating interlayer 720.

The ninth and tenth insulating interlayers 710 and 720 may include an oxide, e.g., silicon oxide.

The ninth insulating interlayer 710, the third insulation layers 520, and the fifth sacrificial layers 530 may be partially etched to form a third opening extending in the second direction D2 therethrough, and a third division pattern 730 may be formed in the third opening.

The third division pattern 730 may extend lengthwise in the second direction D2 on the first and second regions I and II of the first substrate 100, and may extend through the ninth insulating interlayer 710 and an uppermost step layer in the second mold. Thus, the ninth insulating interlayer 710 and the fifth sacrificial layer 530 at the uppermost level in the second mold may be divided in the third direction D3 by the third division pattern 730. In an example embodiment, the third division pattern 730 may extend through upper portions of some of the second memory channel structures 640.

The third division pattern 730 may include substantially the same material as the first division pattern 350, e.g., an oxide such as silicon oxide or a nitride such as silicon nitride.

Figure 38:
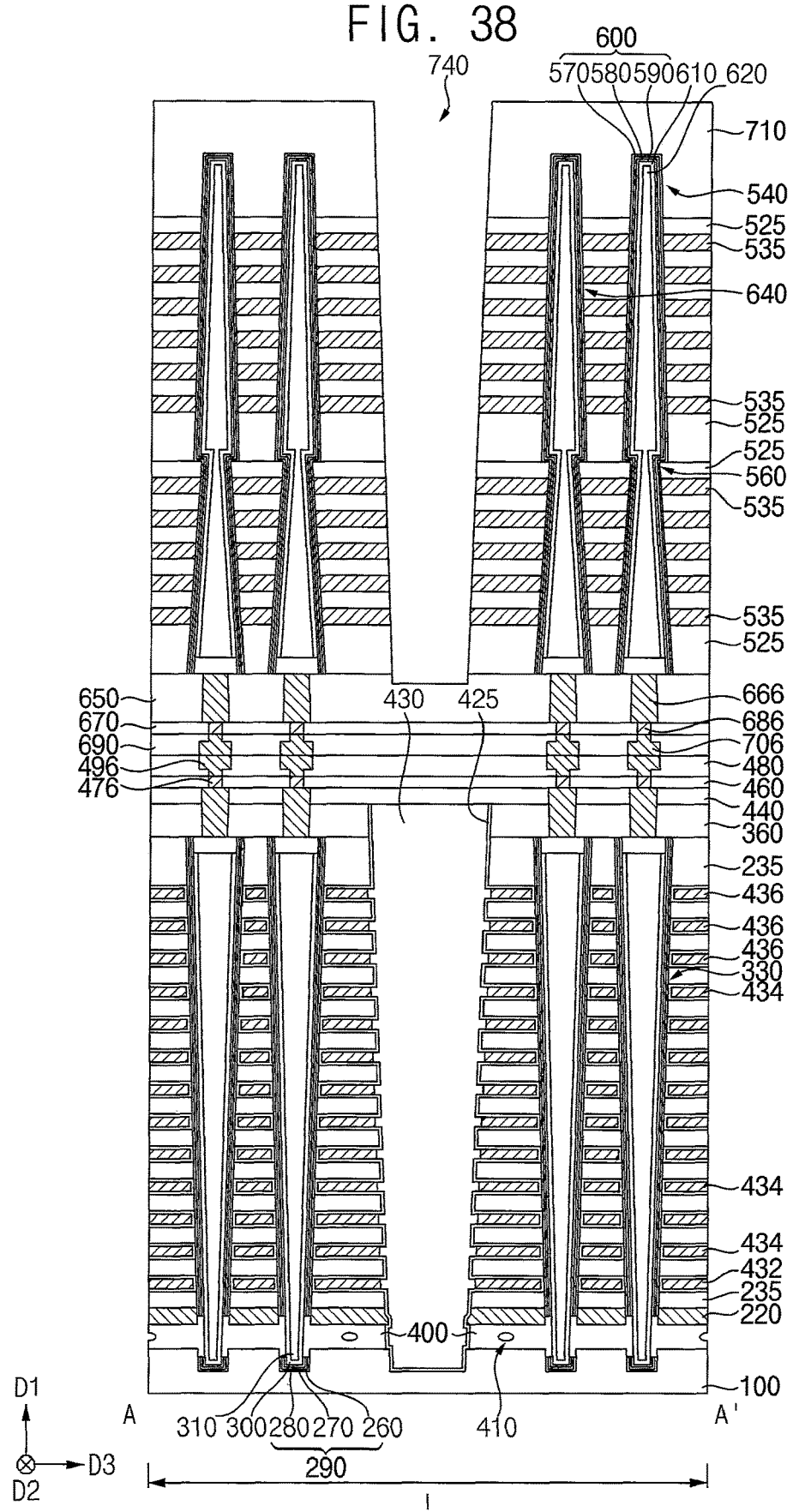

Referring to FIG. 38, a fourth opening 740 may be formed through the ninth insulating interlayer 710 and the second mold by, e.g., a dry etching process on the sixth insulating interlayer 650.

The dry etching process may be performed until the fourth opening 740 extends through an upper portion of the sixth insulating interlayer 650. For example, a bottom surface of the fourth opening 740 may be at a lower vertical level than an upper surface of the sixth insulating interlayer 650. In example embodiments, the fourth opening 740 may extend lengthwise in the second direction D2 on the first and second regions I and II of the first substrate 100, and a plurality of fourth openings 740 may be formed in the third direction D3. As the fourth opening 740 is formed, the third insulation layer 520 and the fifth sacrificial layer 530 in the second mold may be divided into third insulation patterns 525 and fifth sacrificial patterns 535, respectively, which may extend in the second direction D2.

In example embodiments, each of the fourth openings 740 may have a width gradually decreasing from a top portion toward a bottom portion thereof due to the characteristics of the dry etching process.

Figure 39:
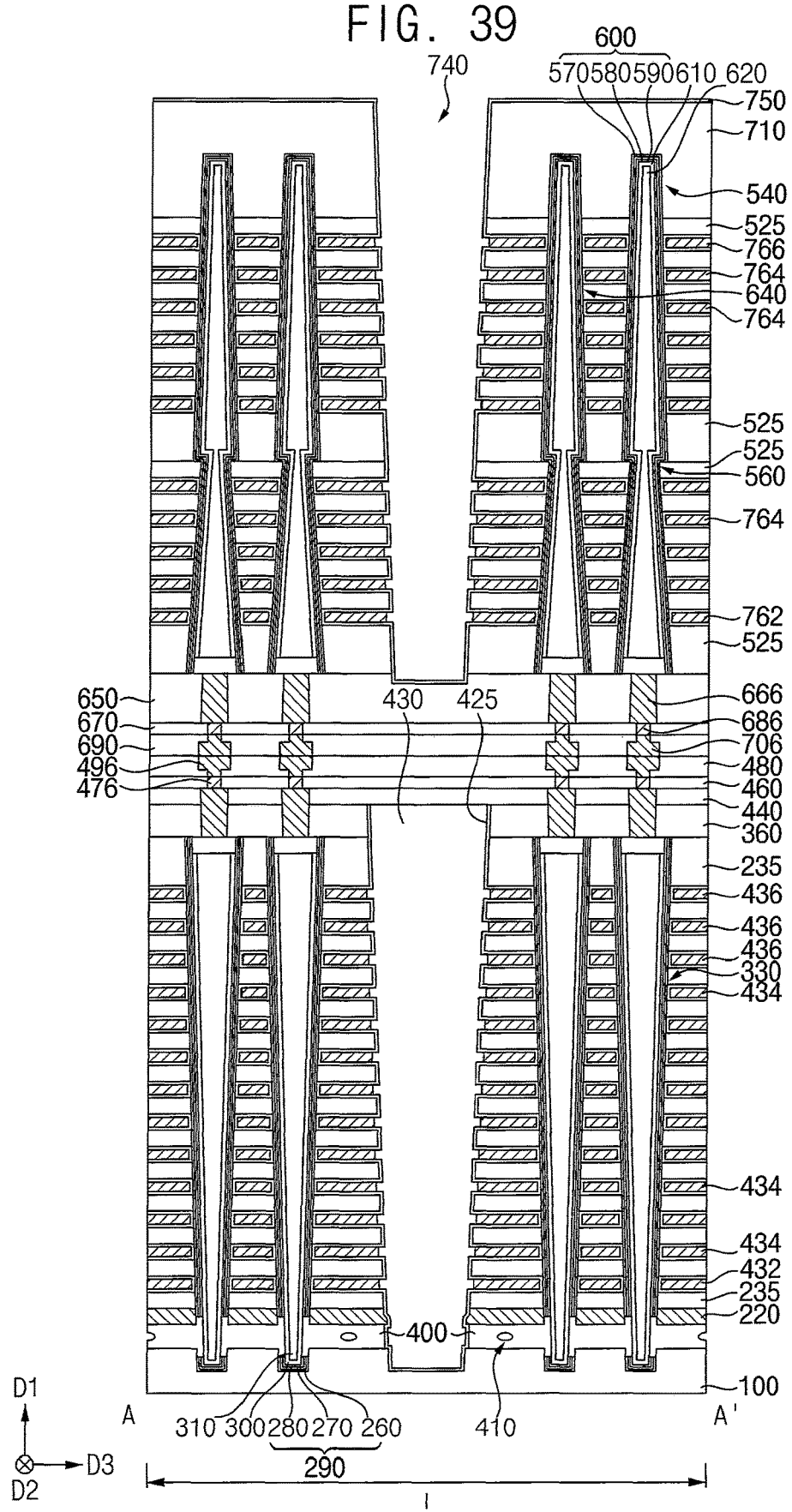

Referring to FIG. 39, the fifth sacrificial patterns 535 exposed by the fourth opening 740 may be removed to form a third gap between the third insulation patterns 525, and an outer sidewall of the third blocking pattern 570 may be partially exposed by the third gap.

In example embodiments, the fifth sacrificial patterns 535 may be removed by a wet etching process using, e.g., hydrofluoric acid or phosphoric acid.

A fourth blocking layer 750 may be formed on the exposed outer sidewall of the third blocking pattern 570, inner walls of the third gaps, surfaces of the third insulation patterns 525, a sidewall and an upper surface of the ninth insulating interlayer 710, and an upper surface of the sixth insulating interlayer 650, and a third gate electrode layer may be formed on the fourth blocking layer 750.

In example embodiments, the fourth blocking layer 750 may include substantially the same material as the second blocking layer 420, e.g., a metal oxide such as aluminum oxide, hafnium oxide, zirconium oxide, etc. The third gate electrode layer may include a second gate conductive layer and a second gate barrier layer covering lower and upper surfaces and a sidewall of the second gate conductive layer. The second gate conductive layer may include substantially the same material as the first gate conductive layer, e.g., a low resistance metal such as tungsten, titanium, tantalum, etc., and the first gate barrier layer may include substantially the same material as the first gate barrier layer, e.g., a metal nitride such as titanium nitride, tantalum nitride, etc.

The third gate electrode layer may be partially removed to form a third gate electrode in each of the third gaps. In example embodiments, the third gate electrode layer may be partially removed by a wet etching process.

In example embodiments, the third gate electrode may extend in the second direction D2, and a plurality of third gate electrodes may be spaced apart from each other in the first direction D1 to form a second gate electrode structure. The third gate electrodes may be staked in a staircase shape in which extension lengths in the second direction D2 decrease in a stepwise manner from a lowermost level toward an uppermost level.

In example embodiments, a maximum extension length in the second direction D2 of the second gate electrode structure may be greater than a maximum extension length in the second direction D2 of the first gate electrode structure. Thus, the second gate electrode structure may overlap at least one of the first transistors in the first direction D1.

In example embodiments, a distance from a bottom toward a top of the second gate electrode may be greater than a distance from a bottom toward a top of the first gate electrode.

In example embodiments, a plurality of second gate electrode structures may be spaced apart from each other in the third direction D3 by the fourth openings 740.

The second gate electrode structure may include sixth to eighth gate electrodes 762, 764, and 766 sequentially stacked in the first direction D1. Additionally, although not illustrated, a ninth gate electrode may be formed under the sixth gate electrode 762 or over the eighth gate electrode 766, which may perform body erase using the gate induced drain leakage (GIDL) phenomenon.

The sixth gate electrode 762 may serve as a ground selection line (GSL), and the eighth gate electrode 766 may serve as a string selection line (SSL). FIG. 39 shows that the sixth gate electrode 762 is formed at a lowermost level, and the eighth gate electrode 766 is formed at an uppermost level and a second level from above, however, the inventive concept may not be limited thereto, and each of the sixth and eighth gate electrodes 762 and 766 may be formed at a single level or a plurality of levels. The seventh gate electrodes 764 may be formed at a plurality of levels between the sixth and eighth gate electrodes 762 and 766, and each seventh gate electrode 764 may serve as a word line.

The first and second gate electrode structures may correspond to the gate electrode structures 3210 and 4210 shown in FIGS. 2 and 3, respectively.

Figure 40:
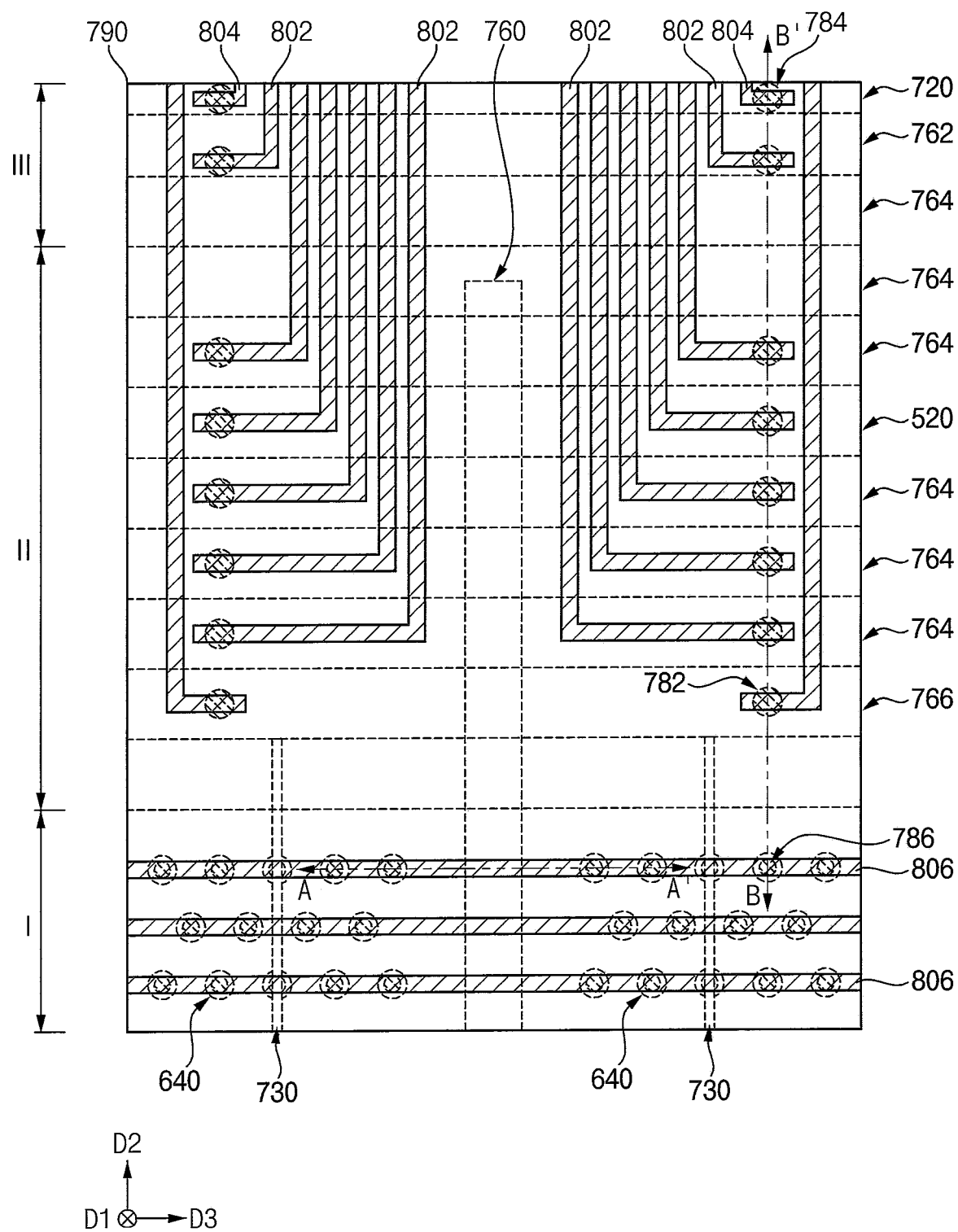
Figure 41:
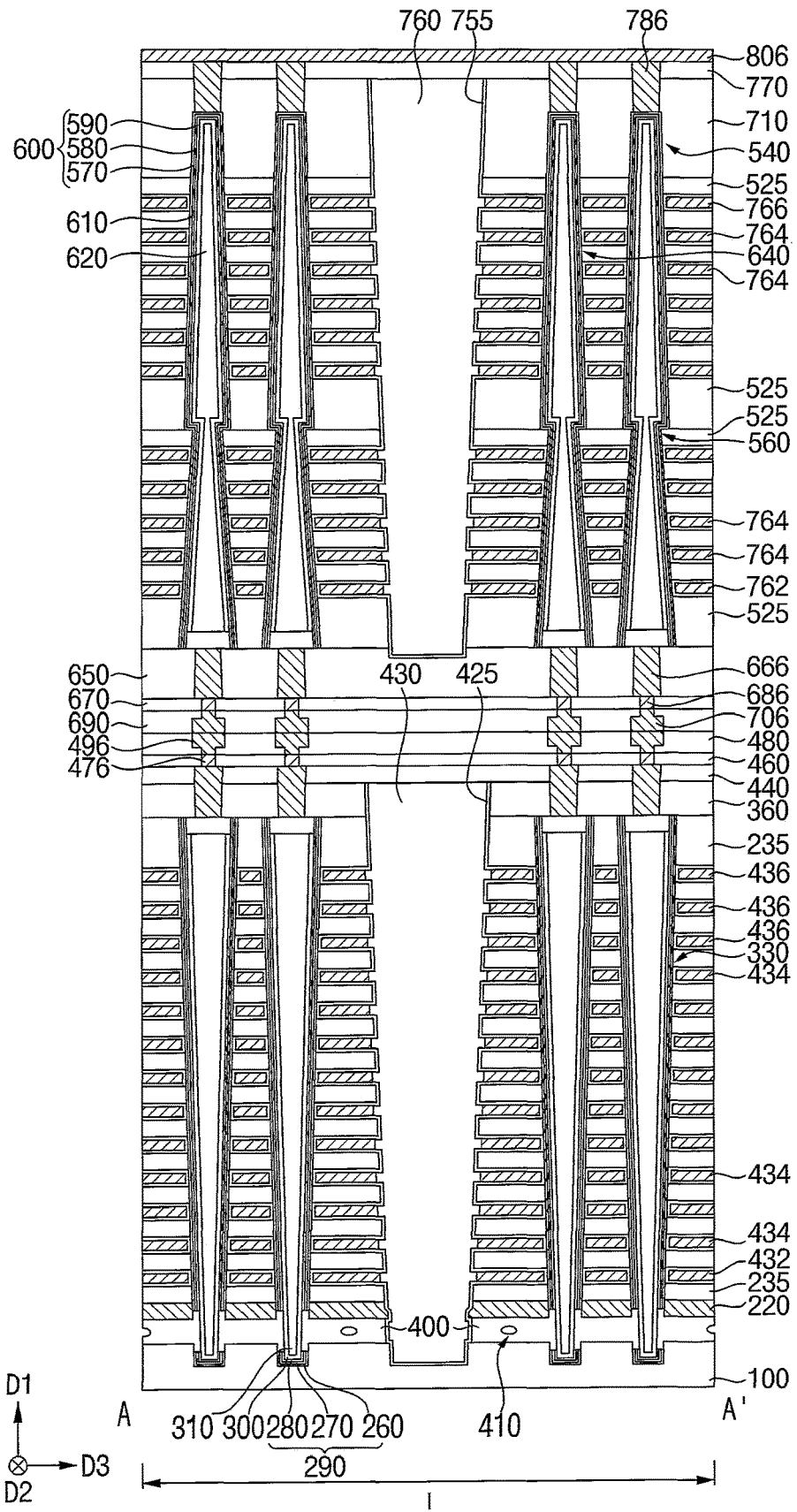
Figure 42:
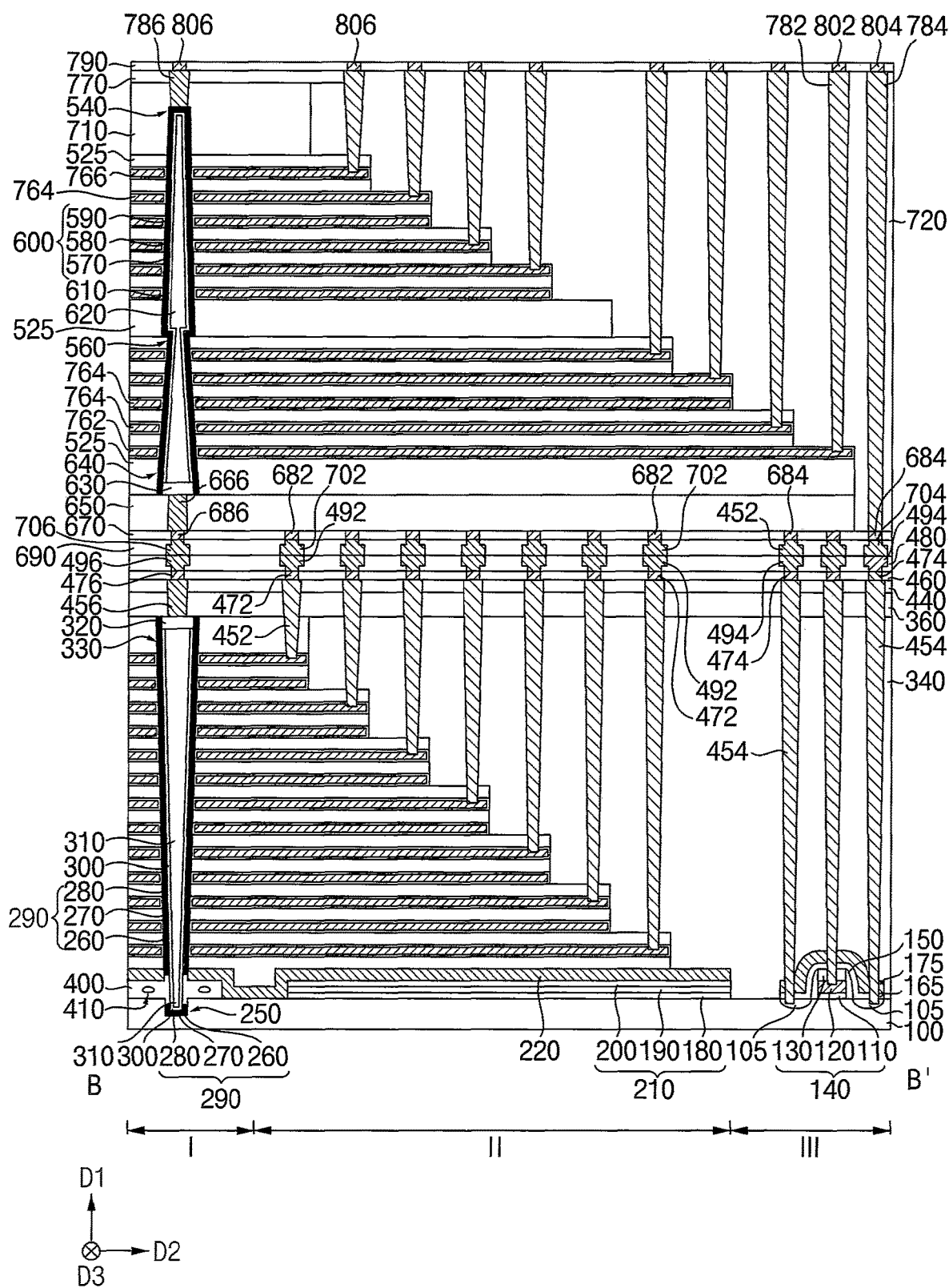

Referring to FIGS. 40 to 42, a second division layer may be formed on the fourth blocking layer 750 to fill the fourth opening 740, and planarized until the upper surface of the ninth insulating interlayer 710 is exposed to form a fourth division pattern 760. During the planarization process, a portion of the fourth blocking layer 750 on the upper surface of the ninth insulating interlayer 710 may be removed, and a remaining portion of the fourth blocking layer 750 may form a fourth blocking pattern 755.

In example embodiments, the fourth division pattern 760 may have a width gradually decreasing from a top toward a bottom thereof.

The fourth division pattern 760 may extend in the second direction D2 on the first and second regions I and II of the first substrate 100, and a plurality of fourth division patterns 760 may be formed in the third direction D3. The fourth division pattern 760 may include an oxide, e.g., silicon oxide. An upper surface of the fourth division pattern 760 may be coplanar with an upper surface of the ninth insulating interlayer 710.

An eleventh insulating interlayer 770 including an oxide, e.g., silicon oxide, may be formed on the ninth insulating interlayer 710, the fourth division pattern 760, and the fourth blocking pattern 755. Fifth contact plugs 782 may be formed through the tenth and eleventh insulating interlayers 720 and 770, the third insulation pattern 525, and the fourth blocking pattern 755 to contact corresponding ones of the sixth to eighth gate electrodes 762, 764, and 766, respectively. Upper surfaces of the fifth contact plugs 782 may be coplanar with an upper surface of the tenth insulating interlayer 720, and lower surfaces of the fifth contact plugs 782 may be at a lower vertical level than upper surfaces of the sixth to eighth gate electrodes 762, 764, and 766 to which they are respectively connected. Sixth contact plugs 784 may be formed through the tenth and eleventh insulating interlayers 720 and 770 to contact the fourth wirings 684, respectively. Upper surfaces of the sixth contact plugs 784 may be coplanar with the upper surface of the tenth insulating interlayer 720, and lower surfaces of the sixth contact plugs 784 may be coplanar with a lower surface of the sixth insulating interlayer 650. Seventh contact plugs 786 may be formed through the ninth and tenth insulating interlayers 710 and 770 to contact corresponding ones of the second memory channel structures 640, respectively. Upper surfaces of the seventh contact plugs 786 may be coplanar with the upper surface of the tenth insulating interlayer 720, and lower surfaces of the seventh contact plugs 786 may be at a vertical level lower than an upper surface of the ninth insulating interlayer 710. In example embodiments, each of the fifth to seventh contact plugs 782, 784, and 786 may have a width gradually decreasing from a top toward a bottom thereof.

A twelfth insulating interlayer 790 including an oxide, e.g., silicon oxide, may be formed on the eleventh insulating interlayer 770. Fifth to seventh wirings 802, 804, and 806 may be formed through the twelfth insulating interlayer 790 to contact the fifth to seventh contact plugs 782, 784, and 786, respectively. Upper surfaces of the fifth to seventh contact plugs 782, 784, and 786 may be coplanar with an upper surface of the twelfth insulating interlayer 790, and lower surfaces of the fifth to seventh contact plugs 782, 784, and 786 may be coplanar with a lower surface of the twelfth insulating interlayer 790. FIGS. 40 to 42 show exemplary layouts of the fifth to seventh contact plugs 782, 784, and 786 and the fifth to seventh wirings 802, 804, and 806, however, the inventive concept may not be limited thereto, and thus the numbers and layouts of the fifth to seventh contact plugs 782, 784, and 786 and the fifth to seventh wirings 802, 804, and 806 may be varied.

The fifth to seventh contact plugs 782, 784, and 786 and the fifth to seventh wirings 802, 804, and 806 may include, e.g., a metal, a metal nitride, a metal silicide, doped polysilicon, etc.

In example embodiments, the seventh wiring 806 may extend in the third direction D3 on the first region I of the first substrate 100, and a plurality of seventh wirings 806 may be spaced apart from each other in the second direction D2. Each of the seventh wirings 806 may serve as a bit line of the semiconductor device.

Figure 43:
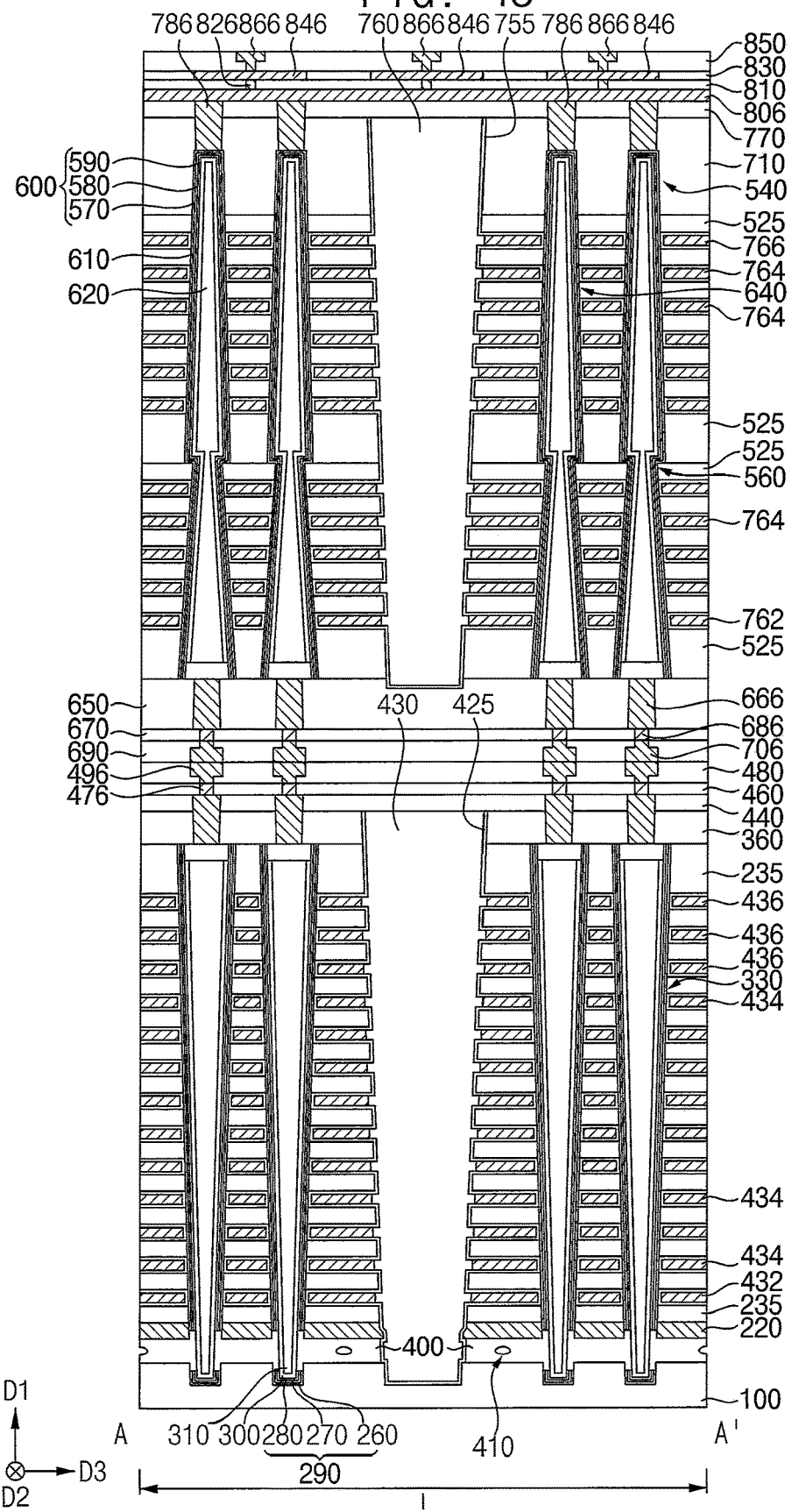
Figure 44:
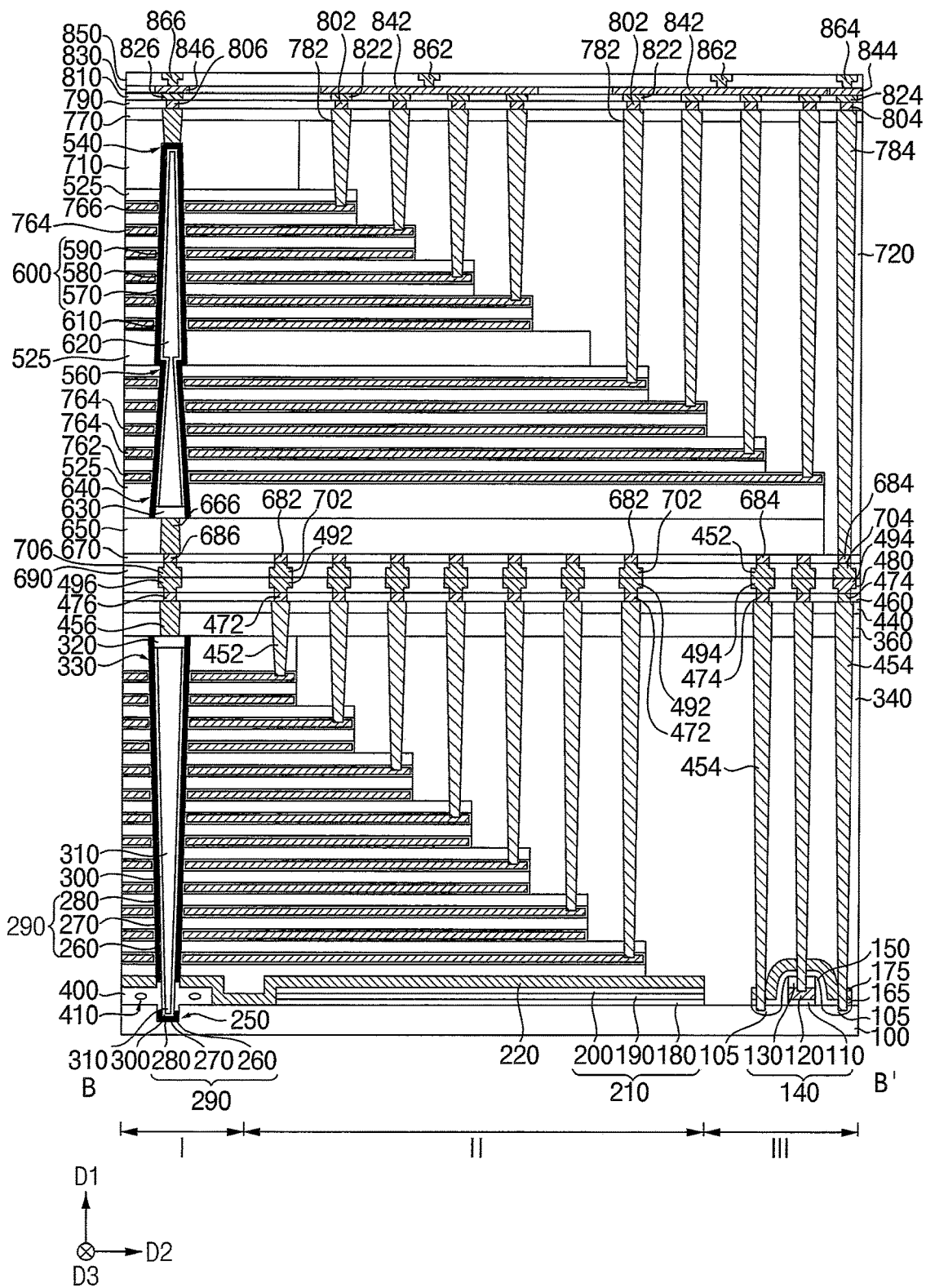
Figure 45:
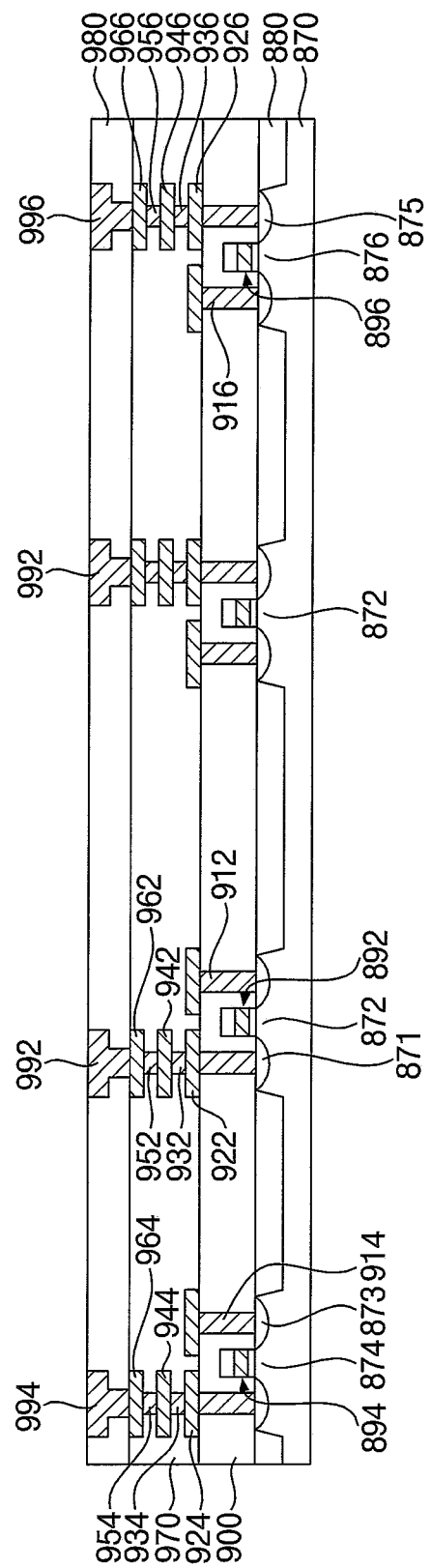

Referring to FIGS. 43 and 44, a thirteenth insulating interlayer 810 including an oxide, e.g., silicon oxide, may be formed on the twelfth insulating interlayer 790 and the fifth to seventh contact plugs 782, 784, and 786. Third to fifth vias 822, 824, and 826 may be formed through the thirteenth insulating interlayer 810 to contact the fifth to seventh wirings 802, 804, and 806, respectively. Upper surfaces of the third to fifth vias 822, 824, and 826 may be coplanar with an upper surface of the thirteenth insulating interlayer 810, and lower surfaces of the third to fifth vias 822, 824, and 826 may be coplanar with a lower surface of the thirteenth insulating interlayer 810.

A fourteenth insulating interlayer 830 may be formed on the thirteenth insulating interlayer 810 and the third to fifth vias 822, 824, and 826, and eighth to tenth wirings 842, 844, and 846 may be formed through the fourteenth insulating interlayer 830 to contact the third to fifth vias 822, 824, and 826, respectively. Upper surfaces of the eighth to tenth wirings 842, 844, and 846 may be coplanar with an upper surface of the fourteenth insulating interlayer 830, and lower surfaces of the eighth to tenth wirings 842, 844, and 846 may be coplanar with a lower surface of the fourteenth insulating interlayer 830. The fourteenth insulating interlayer 830 may include an oxide, e.g., silicon oxide, or a nitride, e.g., silicon nitride.

The third to fifth vias 822, 824, and 826 and the eight to tenth wirings 842, 844, and 846 may include a conductive material, e.g., a metal, a metal nitride, a metal silicide, doped polysilicon, etc.

A fifteenth insulating interlayer 850 including an oxide, e.g., silicon oxide, may be formed on the fourteenth insulating interlayer 830 and the eighth to tenth wirings 842, 844, and 846, and seventh to ninth bonding patterns 862, 864, and 866 may be formed through the fifteenth insulating interlayer 850 to contact the eighth to tenth wirings 842, 844, and 846, respectively. Upper surfaces of the seventh to ninth bonding patterns 862, 864, and 866 may be coplanar with an upper surface of the fifteenth insulating interlayer 850, and lower surfaces of the seventh to ninth bonding patterns 862, 864, and 866 may be coplanar with a lower surface of the fifteenth insulating interlayer 850.

In example embodiments, the seventh to ninth bonding patterns 862, 864, and 866 may be formed to be spaced apart from each other in each of the second and third directions D2 and D3 on the first to third regions I, II and III of the first substrate 100, and may be arranged in a lattice pattern in a plan view. In an example embodiment, each of the seventh to ninth bonding patterns 862, 864, and 866 may be formed by a dual damascene process, and may include a lower portion and an upper portion having a width greater than that of the lower portion. Alternatively, each of the seventh to ninth bonding patterns 862, 864, and 866 may be formed by a single damascene process. In example embodiments, the lower portion of each of the seventh to ninth bonding patterns 862, 864, and 866 may have a first uniform width, and the upper portion of each of the seventh to ninth bonding patterns 862, 864, and 866 may have a second uniform width that is greater than the first uniform width.

The seventh to ninth bonding patterns 862, 864, and 866 may include a low resistance material, e.g., copper, aluminum, etc.

Referring to FIG. 45, upper circuit patterns may be formed on a third substrate 870 including first to third active regions 872, 874, and 876 that may be defined by an isolation pattern 880. The upper circuit patterns may include, e.g., transistors, upper contact plugs, upper wirings, upper vias, etc.

FIG. 45 shows second to fourth transistors including first to third upper gate structures 892, 894, and 896, respectively, on the third substrate 870 and second to fourth impurity regions 871, 873, and 875 at upper portions of the first to third active regions 872, 874, and 876, respectively, however, the inventive concept may not be limited thereto, and the second to fourth transistors may have various other layouts.

The first upper gate structure 892 may include a first upper gate insulation pattern, a first upper gate electrode, and a first upper gate mask sequentially stacked on the first active region 872, the second upper gate structure 894 may include a second upper gate insulation pattern, a second upper gate electrode, and a second upper gate mask sequentially stacked on the second active region 874, and the third upper gate structure 896 may include a third upper gate insulation pattern, a third upper gate electrode, and a third upper gate mask sequentially stacked on the third active region 876.

A first upper insulating interlayer 900 including an oxide, e.g., silicon oxide, may be formed on the third substrate 870 to cover the second to fourth transistors, and first to third upper contact plugs 912, 914, and 916 may be formed through the first upper insulating interlayer 900 to contact the second to fourth impurity regions 871, 873, and 875, respectively. In example embodiments, the first to third upper contact plugs 912, 914, and 916 may have a width gradually decreasing from a top portion toward a bottom portion thereof.

A first upper wiring 922 may be formed on the first upper insulating interlayer 900 to contact an upper surface of the first upper contact plug 912, and a first upper via 932, a fourth upper wiring 942, a fourth upper via 952, and a seventh upper wiring 962 may be sequentially stacked on the first upper wiring 922. A second upper wiring 924 may be formed on the first upper insulating interlayer 900 to contact an upper surface of the second upper contact plug 914, and a second upper via 934, a fifth upper wiring 944, a fifth upper via 954, and an eighth upper wiring 964 may be sequentially stacked on the second upper wiring 924. A third upper wiring 926 may be formed on the first upper insulating interlayer 900 to contact an upper surface of the third upper contact plug 916, and a third upper via 936, a sixth upper wiring 946, a sixth upper via 956, and a ninth upper wiring 966 may be sequentially stacked on the third upper wiring 926.

The first to ninth upper wirings 922, 924, 926, 942, 944, 946, 962, 964, and 966 and the first to sixth upper vias 932, 934, 936, 952, 954, and 956 may be formed on the first upper insulating interlayer 900, and may be covered by a second upper insulating interlayer 970 including an oxide, e.g., silicon oxide.

The first to third upper contact plugs 912, 914, and 916, the first to sixth upper vias 932, 934, 936, 952, 954, and 956, and first to ninth upper wirings 922, 924, 926, 942, 944, 946, 962, 964, and 966 may include a metal, e.g., tungsten, titanium, tantalum, etc., and may further include a metal nitride covering the metal.

A third upper insulating interlayer 980 including an oxide, e.g., silicon oxide, may be formed on the second upper insulating interlayer 970 and the seventh to ninth upper wirings 962, 964, and 966, and tenth to twelfth bonding patterns 992, 994, and 996 may be formed through the third upper insulating interlayer 980 to contact the seventh to ninth upper wirings 962, 964, and 966, respectively. Upper surfaces of the tenth to twelfth bonding patterns 992, 994, and 996 may be coplanar with an upper surface of the third upper insulating interlayer 980, and lower surfaces of the tenth to twelfth bonding patterns 992, 994, and 996 may be coplanar with a lower surface of the third upper insulating interlayer 980.

In example embodiments, the tenth to twelfth bonding patterns 992, 994, and 996 may be formed at positions corresponding to those of the seventh to ninth bonding patterns 862, 864, and 866, respectively, on the first substrate 100.

The tenth to twelfth bonding patterns 992, 994, and 996 may be formed by a dual damascene process or a single damascene process, and may include a low resistance material, e.g., copper, aluminum, etc.

Figure 46:
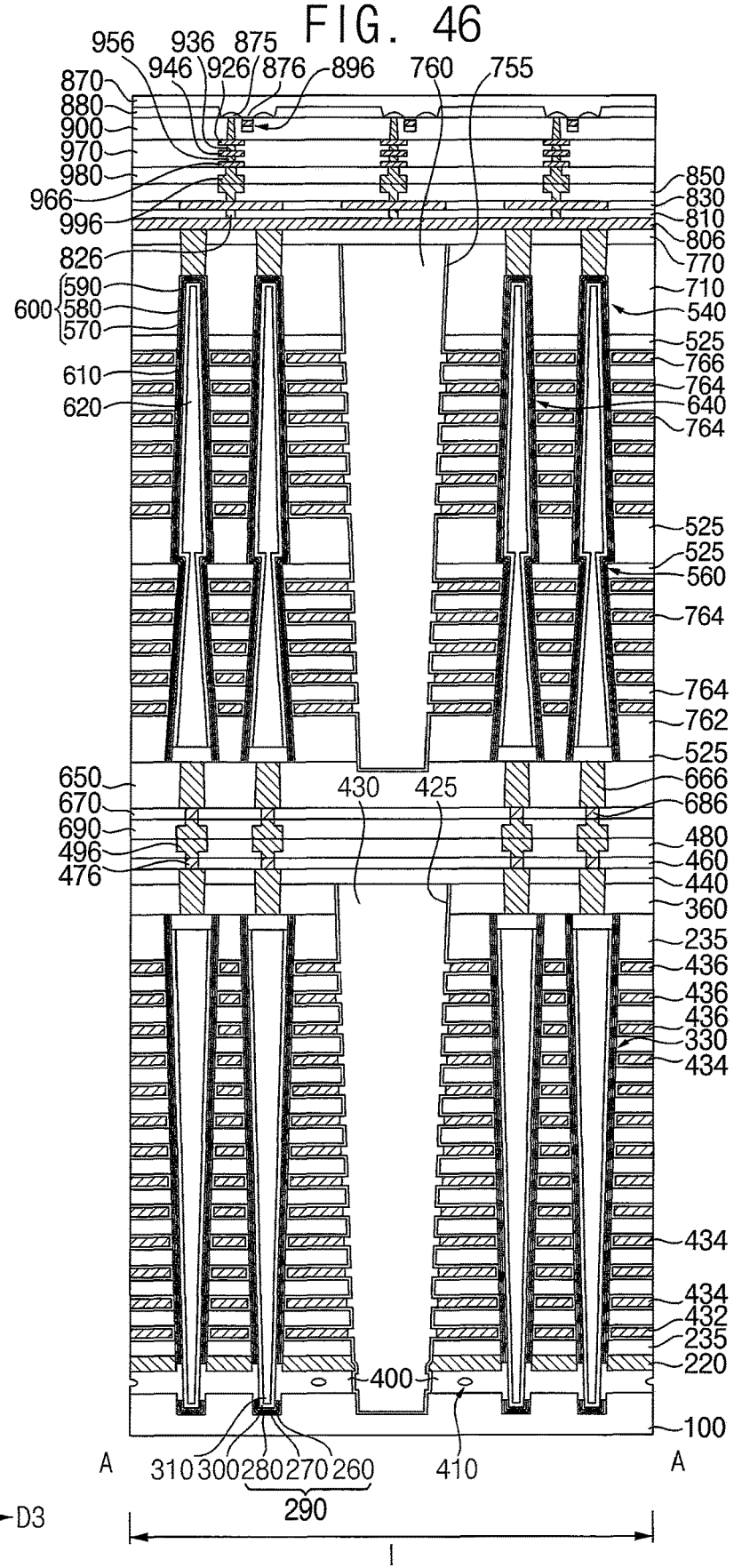
Figure 47:
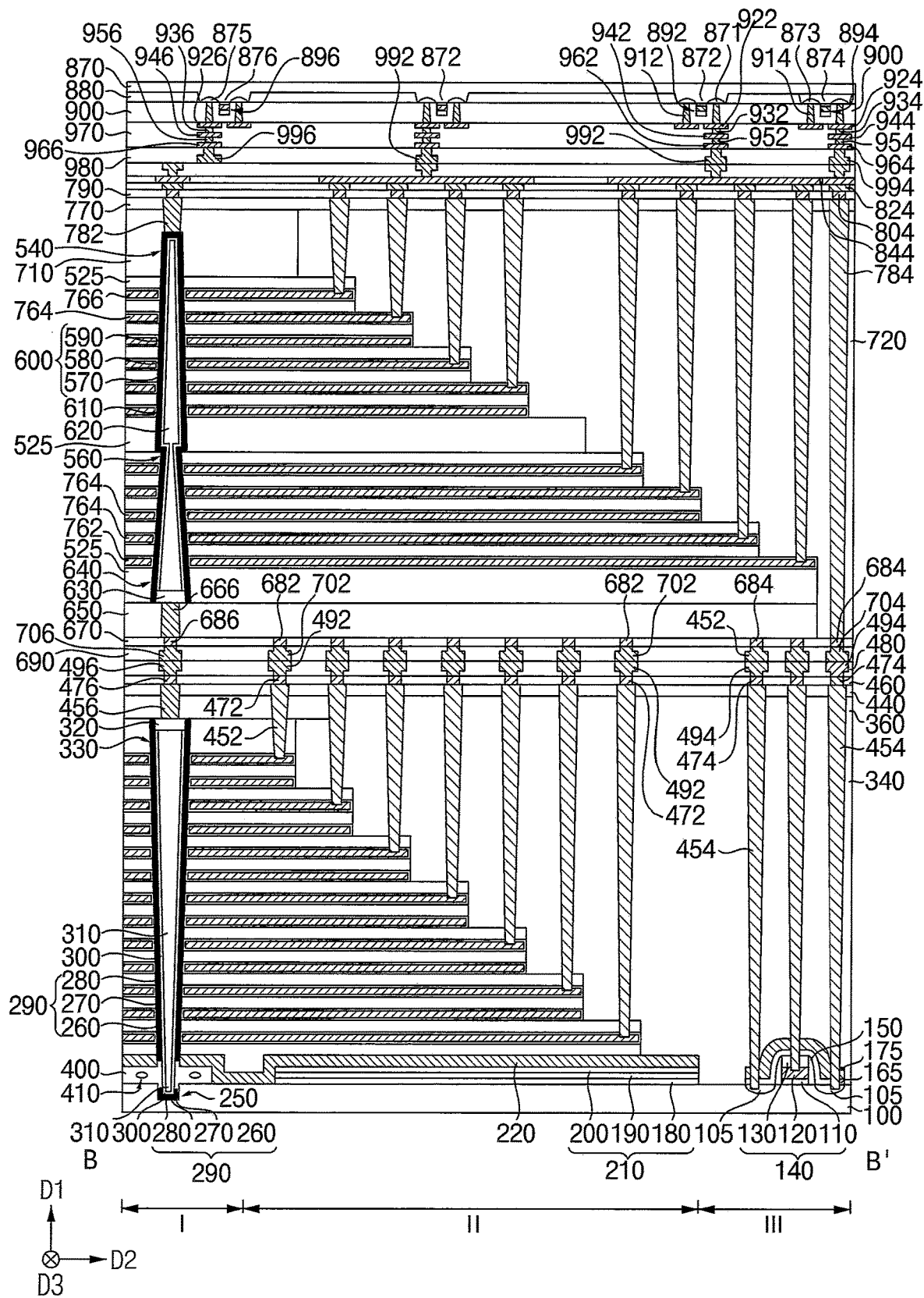

Referring to FIGS. 46 and 47, the third substrate 870 may be overturned, and the fifteenth insulating interlayer 850 may be bonded with the third upper insulating interlayer 980. The seventh to ninth bonding patterns 862, 864, and 866 may contact the tenth to twelfth bonding patterns 992, 994, and 996, respectively. The seventh and tenth bonding patterns 862 and 992 may form a fourth bonding structure, the eighth and eleventh bonding patterns 864 and 994 may form a fifth bonding structure, and the ninth and twelfth bonding patterns 866 and 996 may form a sixth bonding structure. The fourth to sixth bonding structures may correspond to the second bonding structure 4250 of FIG. 3.

Various structures on the third substrate 870 may be upside down, and hereinafter, may be explained with reference to the changed direction.

For example, the first and third substrates 100 and 870 may be referred to as lower and upper substrates 100 and 870, respectively. Additionally, each of the first to third upper contact plugs 912, 914, and 916 may have a width gradually increasing from a top portion toward a bottom portion thereof.

Portions of the third substrate 870 corresponding to the first to third regions I, II, and III, respectively, of the first substrate 100 may also be referred to as the first to third regions I, II, and III.

The semiconductor device may be manufactured by the above processes.

The semiconductor device may have following structural characteristics.

Particularly, the semiconductor device may include the first substrate 100 including the first to third regions I, II, and III, the first gate electrode structure including the second to fourth gate electrodes 432, 434, and 436 spaced apart from each other in the first direction D1 on the first and second regions I and II of the first substrate 100 and stacked in a staircase shape in which extension lengths in the second direction D2 decrease from a lowermost level toward an uppermost level, the first memory channel structure 330 extending in the first direction D1 at least partially through the first gate electrode structure, the first transistor on the third region III of the first substrate 100, the second gate electrode structure including the sixth to eighth gate electrodes 762, 764, and 766 spaced apart from each other in the first direction D1 on the first gate electrode structure and the first transistor and stacked in a staircase shape in which extension lengths in the second direction D2 decrease from a lowermost level toward an uppermost level, the second memory channel structure 640 extending in the first direction D1 at least partially through the second gate electrode structure, the second to fourth transistors on the second gate electrode structure, the first contact plug 452 electrically connected to the first gate electrode structure and extending in the first direction D1, the second contact plug 454 electrically connected to the first transistor and extending in the first direction D1, the third contact plug 456 electrically connected to the first memory channel structure 330 and extending in the first direction D1, the fourth and seventh contact plugs 666 and 786 electrically connected to the second memory channel structure 640 and extending in the first direction D1, the fifth contact plug 782 electrically connected to the second gate electrode structure and extending in the first direction D1, the sixth contact plug 784 electrically connected to the fourth wiring 684 and extending in the first direction D1, the first upper contact plug 912 electrically connected to the second transistor and extending in the first direction D1, the second upper contact plug 914 electrically connected to the third transistor and extending in the first direction D1, the third upper contact plug 916 electrically connected to the fourth transistor and extending in the first direction D1, the first bonding structure for electrically connecting the first wiring 472 contacting the first contact plug 452 to third wiring 682, the second bonding structure for electrically connecting the second wiring 474 contacting the second contact plug 454 to the fourth wiring 684, the third bonding structure for electrically connecting the first and second vias 476 and 686 contacting the third and fourth contact plugs 456 and 666, respectively, with each other, the fourth bonding structure for electrically connecting the eighth wiring 842 and the seventh upper wiring 962 that are electrically connected to the fifth contact plug 782 and the first upper contact plug 912, respectively, the fifth bonding structure for electrically connecting the ninth wiring 844 and the eighth upper wiring 964 that are electrically connected to the sixth contact plug 784 and the second upper contact plug 914, respectively, the sixth bonding structure for electrically connecting the tenth wiring 846 and the ninth upper wiring 966 that are electrically connected to the seventh contact plug 786 and the third upper contact plug 916, respectively, the bit line 806 on and electrically connected to the seventh contact plug 786, and the third substrate 870 on the second and fourth transistors.

The first memory channel structure 330 may include the first filling pattern 310, the first channel 300 on an outer sidewall of the first filling pattern 310, the first charge storage structure 290 on an outer sidewall of the first channel 300, and the first capping pattern 320 on upper surfaces of the first channel 300 and the first filling pattern 310 and contacting an inner sidewall of the first charge storage structure 290, and the second memory channel structure 640 may include the second filling pattern 620, the second channel 610 on an outer sidewall of the second filling pattern 620, the second charge storage structure 600 on an outer sidewall of the second channel 610, and the second capping pattern 630 on lower surfaces of the second channel 610 and the second filling pattern 620 and contacting an inner sidewall of the second charge storage structure 600.

In example embodiments, the first and second channels 300 and 610 may not directly contact each other, but may be electrically connected with each other through the third bonding structure, and may receive electrical signals from the fourth transistor.

In example embodiments, a plurality of first contact plugs 452 may contact the second to fourth gate electrodes 432, 434, and 436, respectively, and a plurality of fifth contact plugs 782 may contact the sixth to eighth gate electrodes 762, 764, and 766, respectively. A maximum value of extension lengths of the fifth contact plugs 782 in the first direction D1 may be greater than a maximum value of extension lengths of the first contact plugs 452 in the first direction D1.

In example embodiments, upper surfaces of the first to third contact plugs 452, 454, and 456 may be substantially coplanar with each other, upper surfaces of the fifth to seventh contact plugs 782, 784, and 786 may be substantially coplanar with each other, and upper surfaces of the first to third upper contact plugs 912, 914, and 916 may be substantially coplanar with each other. Additionally, upper surfaces of the fifth to seventh contact plugs 782, 784, and 786 may be lower than lower surfaces of the first to third upper contact plugs 912, 914, and 916.

The second to fourth gate electrodes 432, 434, and 436, the first channels 300 extending through the second to fourth gate electrodes 432, 434, and 436, the first charge storage structures 290 between the first channels 300 and the second to fourth gate electrodes 432, 434, and 436, the sixth to eighth gate electrodes 762, 764, and 766, the second channels 610 extending through the sixth to eighth gate electrodes 762, 764, and 766, and the second charge storage structures 600 between the second channels 610 and the sixth to eighth gate electrodes 762, 764, and 766 may form memory cells.

In example embodiments, the bit line 806 may extend in the third direction D3, and a plurality of bit lines 806 may be spaced apart from each other in the second direction D2. Each of the bit lines 806 may be electrically connected to the fourth transistor by the fifth via 826 and the tenth wiring 846, and may be electrically connected to the second memory channel structures 640 disposed in the third direction D3 by the seventh contact plug 786. In example embodiments, the fourth transistor may correspond to the transistor included in the page buffer 1120 of FIG. 1.

In example embodiments, the fifth contact plug 782 may be electrically connected to the eighth wiring 842 through the fifth wiring 802 and the third via 822, and thus may be electrically connected to the second transistor. The first contact plug 452 and the first wiring 472 may be electrically connected to the second transistor through the first bonding structure. The sixth contact plug 784 may be electrically connected to the ninth wiring 844 through the sixth wiring 804 and the fourth via 824, and thus may be electrically connected to the third transistor. The sixth contact plug 784 may be electrically connected to the second contact plug 454 through the second bonding structure, and thus may be electrically connected to the first transistor. In example embodiments, the first to third transistors may correspond to the transistors included in the decoder circuit of FIG. 1. Thus, the first to third transistors may apply electrical signals to the first and second gate electrodes structures, and the first, second, fifth and sixth contact plugs 452, 454, 782, and 784 may be electrically connected with each other.

As illustrated above, the mold layer structure may include at least two mold layers stacked in the first direction D1, and thus the second gate electrode structure may include a large number of the sixth to eighth gate electrodes 762, 764, and 766.

As the stack number of the memory cells increases, the data storage capacity of the semiconductor device may increase. Thus, the number of the transistors electrically connected to the first and second memory channel structures 330 and 640 and included in the page buffer, and the number of the transistors electrically connected to the first and second gate electrode structures and included in the decoder circuit 1110 may increase.

If the transistors are formed under the first gate electrode structure or over the second gate electrode structure, a horizontal area of a space containing the transistors may increase, and thus the semiconductor device may have a large horizontal area.

However, in example embodiments, the fourth transistors included in the page buffer 1120 and the second and third transistors included in the decoder circuit 1110 may be formed over the second gate electrode structure, and the first transistors included in the decoder circuit 1110 may be formed on the third region III of the first substrate 100. That is, the first transistors among the first to third transistors included in the decoder circuit 1110 may be separately formed on the third region III of the first substrate 100, so that the horizontal area of the semiconductor device may decrease, and thus the integration degree of the semiconductor device may be enhanced.

The first gate electrode structure may be further formed under the second gate electrode structure, that is, on the first and second region I and II of the first substrate 100, and thus the stack number of the memory cells may increase, and the data storage capacity of the semiconductor device may increase.

Figure 48:
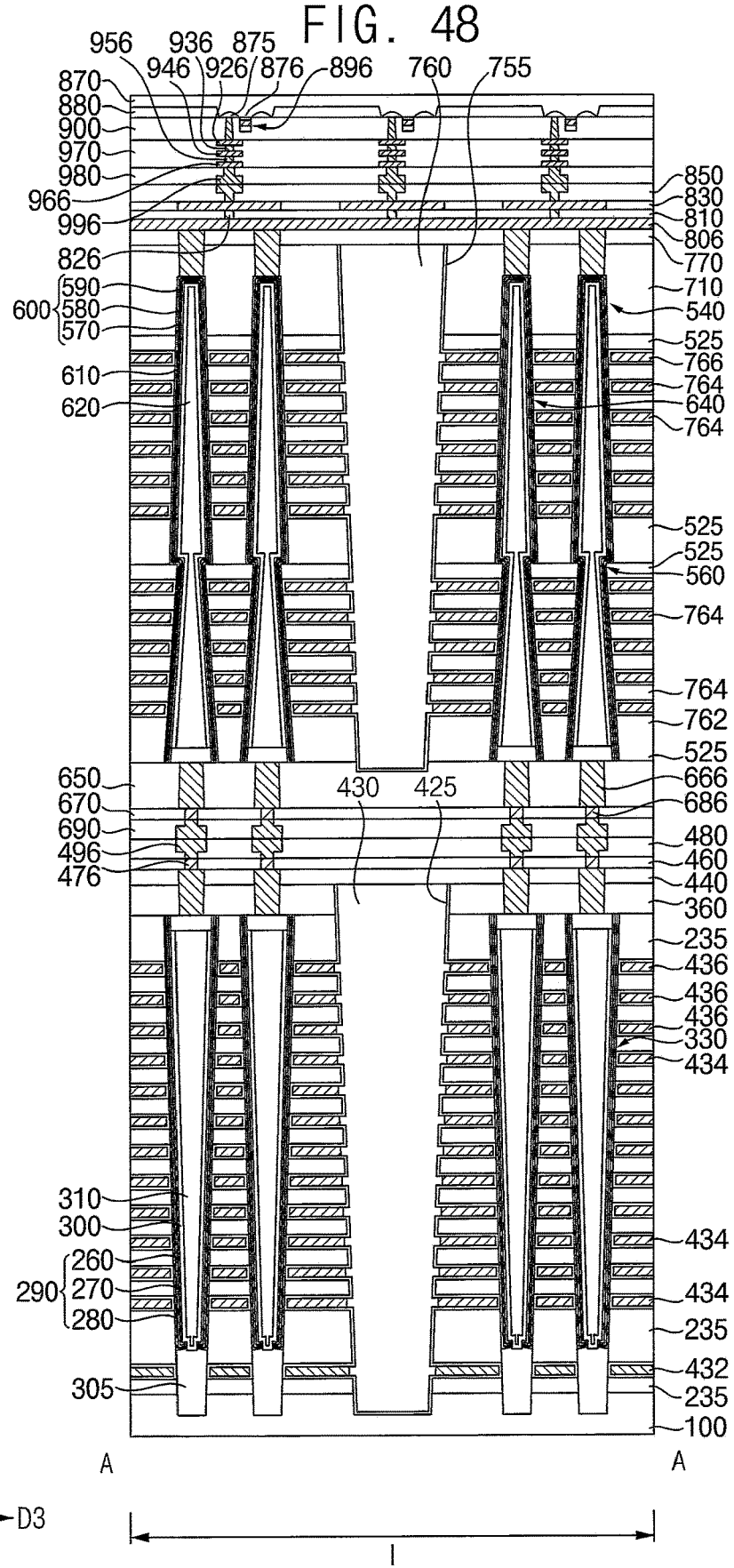
FIG. 48 is a cross-sectional view illustrating a semiconductor device in accordance with example embodiments, which may correspond to FIG. 46.

FIG. 48 is a cross-sectional view illustrating a semiconductor device in accordance with example embodiments, which may correspond to FIG. 46. This semiconductor device may be substantially the same as or similar to that of FIGS. 46 and 47, except for the first memory channel structure.

The first memory channel structure 330 may further include a semiconductor pattern 305 contacting an upper surface of the first substrate 100, and the first charge storage structure 290, the first channel 300, the first filling pattern 310, and the first capping pattern 320 may be formed on the semiconductor pattern 305. In example embodiments, a lower surface of the semiconductor pattern 305 may be at a lower vertical level than an upper surface of the first substrate 100.

The semiconductor pattern 305 may include, e.g., single crystalline silicon or polysilicon. In an example embodiment, an upper surface of the semiconductor pattern 305 may be formed at a height between lower and upper surfaces of the second insulation pattern 235 between the first and second gate electrodes 432 and 434. The first charge storage structure 290 may have a cup-like shape of which a central lower surface is opened, and may contact an edge upper surface of the semiconductor pattern 305. The first channel 300 may have a cup-like shape, and may contact a central upper surface of the semiconductor pattern 305. Thus, the first channel 300 may be electrically connected to the first substrate 100 through the semiconductor pattern 305.

The first channel connection pattern 400, the first support layer 220, and the first support pattern may not be formed between the first substrate 100 and the second gate electrode 432. In an example embodiment, one of the second insulation patterns 235 between the first and second gate electrodes 432 and 434 may have a thickness greater than those of ones of the second insulation patterns 235 at upper levels, respectively.

Figure 49:
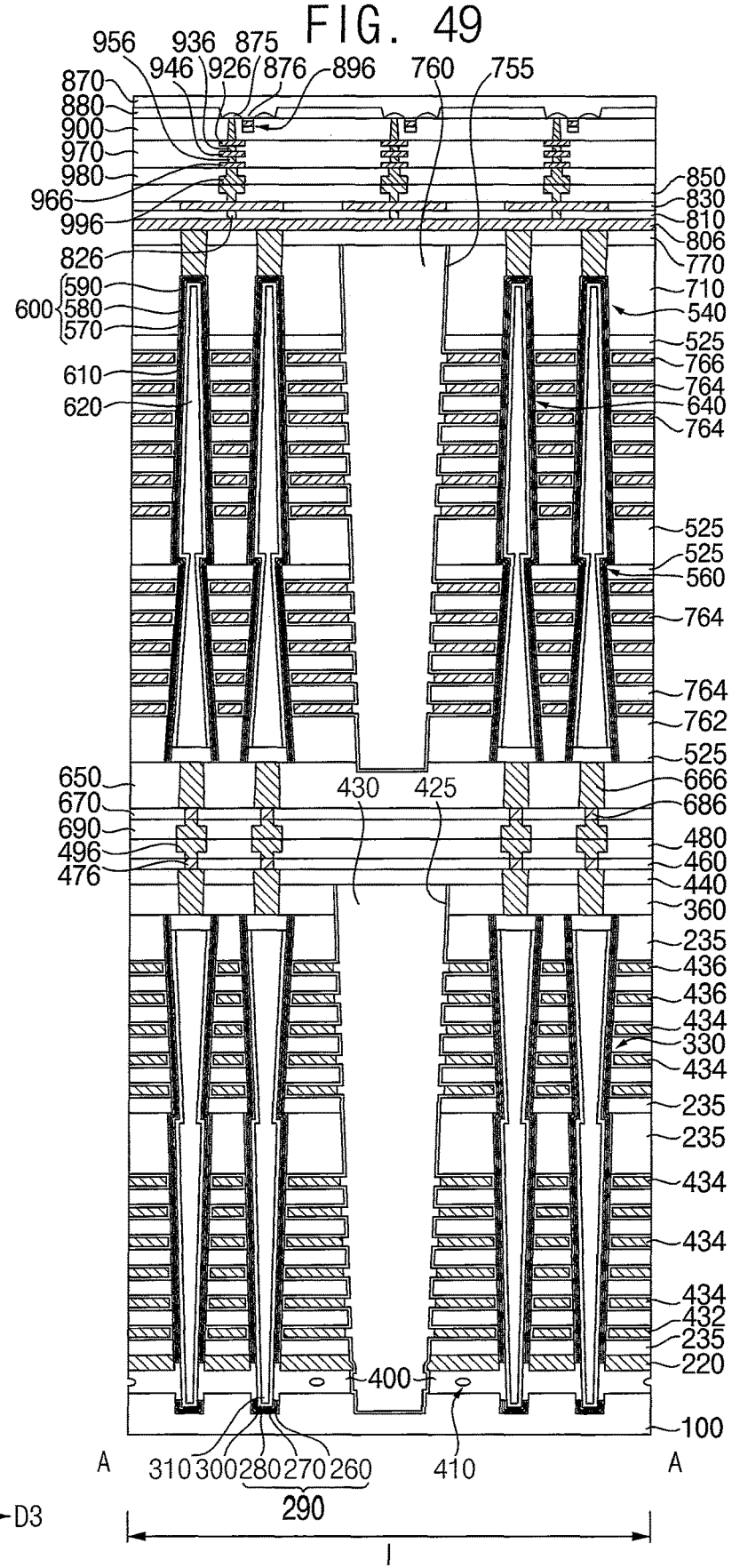
FIG. 49 is a cross-sectional view illustrating a semiconductor device in accordance with example embodiments, which may correspond to FIG. 46.

FIG. 49 is a cross-sectional view illustrating a semiconductor device in accordance with example embodiments, which may correspond to FIG. 46. This semiconductor device may be substantially the same as or similar to that of FIGS. 46 and 47, except for the shape of the first memory channel structure.

The first memory channel structure 330 may include lower and upper portions sequentially stacked, and each of the lower and upper portions may have a width gradually increasing from a bottom toward a top thereof. In example embodiments, a lower surface of the upper portion of the first memory channel structure 330 may have an area less than that of an upper surface of the lower portion thereof.

In the drawing, the first memory channel structure 330 includes two portions, that is, the lower and upper portions, however, the inventive concept may not be limited thereto, and may include more than two portions. Each of the portions of the first memory channel structure 330 may have a width gradually increasing from a bottom toward a top thereof, and an area of a lower surface of an upper portion may be less than that of an upper surface of a lower portion that is directly under the upper portion.

While example embodiments have been particularly shown and described, it will be understood by one of ordinary skill in the art that variations in form and detail may be made therein without departing from the spirit and scope of the claims.

What is claimed is:

1. A semiconductor device comprising:
    a first gate electrode structure on a first substrate including a cell region and a peripheral circuit region surrounding the cell region, the first gate electrode structure including first gate electrodes spaced apart from each other on the cell region of the first substrate in a first direction substantially perpendicular to an upper surface of the first substrate, and each of the first gate electrodes extending lengthwise in a second direction substantially parallel to the upper surface of the first substrate;
    a first channel extending in the first direction through at least a portion of the first gate electrode structure;
    a first transistor on the peripheral circuit region of the first substrate;
    a second gate electrode structure on the first gate electrode structure and the first transistor, the second gate electrode structure including second gate electrodes spaced apart from each other in the first direction, and each of the second gate electrodes extending lengthwise in the second direction;
    a second channel extending in the first direction through at least a portion of the second gate electrode structure;
    a second transistor and a third transistor on the second gate electrode structure; and
    a second substrate on the second and third transistors,
    wherein the first and second channels do not directly contact each other, but are electrically connected with each other, and receive electrical signals from the second transistor, and
    wherein the first and third transistors apply electrical signals to the first and second gate electrode structures.

2. The semiconductor device of claim 1, wherein an upper surface of the first channel has an area greater than a lower surface thereof, and an upper surface of the second channel has an area less than a lower surface thereof.

3. The semiconductor device of claim 2, wherein the second channel includes:
    a first portion having a width gradually increasing from a top toward a bottom thereof, and
    a second portion on the first portion, the second portion having a width gradually increasing from a top toward a bottom thereof.

4. The semiconductor device of claim 1,
    wherein extension lengths in the second direction of the first gate electrodes decrease from a lowermost level toward an uppermost level, and extension lengths in the second direction of the second gate electrodes decrease from a lowermost level toward an uppermost level, and
    wherein each of the first and second gate electrode structures has a staircase shape.

5. The semiconductor device of claim 1, wherein a maximum value of extension lengths in the second direction of the second gate electrode structure is greater than a maximum value of extension lengths in the second direction of the first gate electrode structure.

6. The semiconductor device of claim 5, wherein the first transistor overlaps the second gate electrode structure in the first direction.

7. The semiconductor device of claim 1, wherein a distance from a bottom to a top of the second gate electrode structure is greater than a distance from a bottom to a top of the first gate electrode structure.

8. The semiconductor device of claim 1,
    wherein the first gate electrode structure is one of a plurality of first gate electrode structures disposed in a third direction substantially parallel to the upper surface of the first substrate and crossing the second direction, and the second gate electrode structure is one of a plurality of second gate electrode structures disposed in the third direction, and
    wherein the semiconductor device further comprises:
        a first division pattern between neighboring ones of the plurality of first gate electrode structures in the third direction; and
        a second division pattern between neighboring ones of the plurality of second gate electrode structures in the third direction.

9. The semiconductor device of claim 8, wherein each of the first and second division patterns has a width gradually decreasing from a top portion toward a bottom portion thereof.

10. A semiconductor device comprising:
    a first gate electrode structure on a first substrate including a cell region and a peripheral circuit region surrounding the cell region, the first gate electrode structure including first gate electrodes spaced apart from each other on the cell region of the first substrate in a first direction substantially perpendicular to an upper surface of the first substrate, and each of the first gate electrodes extending lengthwise in a second direction substantially parallel to the upper surface of the first substrate;

a first channel extending in the first direction through at least a portion of the first gate electrode structure;

a first transistor on the peripheral circuit region of the first substrate;

a second gate electrode structure on the first gate electrode structure and the first transistor, the second gate electrode structure including second gate electrodes spaced apart from each other in the first direction, and each of the second gate electrodes extending lengthwise in the second direction;

a second channel extending in the first direction through at least a portion of the second gate electrode structure;

a second transistor and a third transistor on the second gate electrode structure; and a second substrate on the second and third transistors, wherein:
the first and second channels are electrically connected with each other, and receive electrical signals from the second transistor,
the first and third transistors apply electrical signals to the first and second gate electrode structures, and
the first transistor overlaps the second gate electrode structure in the first direction.

11. The semiconductor device of claim 10, further comprising:

a first contact plug electrically connected to the first transistor and extending in the first direction;

a second contact plug electrically connected to the first gate electrode structure and extending in the first direction;

a third contact plug electrically connected to the second gate electrode structure and extending in the first direction; and a fourth contact plug electrically connected to the third transistor and extending in the first direction, wherein the first and second contact plugs are electrically connected with each other, and wherein the third and fourth contact plugs are electrically connected with each other.

12. The semiconductor device of claim 11,
wherein upper surfaces of the first and second contact plugs are substantially coplanar with each other, and
wherein an upper surface of the third contact plug is lower than a lower surface of the fourth contact plug.

13. The semiconductor device of claim 11,
wherein each of the first to third contact plugs has a width gradually decreasing from a top portion toward a bottom portion thereof, and
wherein the fourth contact plug has a width gradually increasing from a top portion toward a bottom portion thereof.

14. The semiconductor device of claim 11,
wherein the second contact plug is one of a plurality of second contact plugs contacting the first gate electrodes, respectively, included in the first gate electrode structure, and the third contact plug is one of a plurality of third contact plugs contacting the second gate electrodes, respectively, included in the second gate electrode structure, and wherein a maximum value of extension lengths in the first direction of the third contact plugs is greater than a maximum value of extension lengths in the first direction of the second contact plugs.

15. The semiconductor device of claim 10, further comprising a bonding structure between an upper surface of the first channel and a lower surface of the second channel, the bonding structure electrically connecting the first and second channels with each other.

16. The semiconductor device of claim 10, further comprising a bit line extending in a third direction substantially parallel to the upper surface of the first substrate and crossing the second direction, the bit line electrically connecting the second channel and the second transistor.

17. The semiconductor device of claim 10, wherein a maximum value of extension lengths in the second direction of the second gate electrode structure is greater than a maximum value of extension lengths in the second direction of the first gate electrode structure.

18. A semiconductor device comprising:

a first gate electrode structure on a first substrate including a cell region and a peripheral circuit region surrounding the cell region, the first gate electrode structure including first gate electrodes spaced apart from each other on the cell region of the first substrate in a first direction substantially perpendicular to an upper surface of the first substrate, and each of the first gate electrodes extending in a second direction substantially parallel to the upper surface of the first substrate;

a first channel extending in the first direction through at least a portion of the first gate electrode structure;

a first transistor on the peripheral circuit region of the first substrate;

a second gate electrode structure on the first gate electrode structure and the first transistor, the second gate electrode structure including second gate electrodes spaced apart from each other in the first direction, and each of the second gate electrodes extending in the second direction;

a second channel extending in the first direction through at least a portion of the second gate electrode structure;

a bonding structure between an upper surface of the first channel and a lower surface of the second channel, the bonding structure electrically connecting the first and second channels with each other;

a second transistors and a third transistor on the second gate electrode structure;

a bit line extending in a third direction substantially parallel to the upper surface of the first substrate and crossing the second direction, the bit line electrically connecting the second channel to the second transistor;

a first contact plug electrically connected to the first transistor and extending in the first direction;

a second contact plug electrically connected to the first gate electrode structure and extending in the first direction;

a third contact plug electrically connected to the second gate electrode structure and extending in the first direction; and a fourth contact plug electrically connected to the third transistor and extending in the first direction; and a second substrate on the second and third transistors, wherein:
the first and second contact plugs are electrically connected with each other, and
the third and fourth contact plugs are electrically connected with each other.

19. The semiconductor device of claim 18,
wherein the second contact plug is one of a plurality of second contact plugs contacting the first gate electrodes, respectively, included in the first gate electrode structure, and the third contact plug is one of a plurality of third contact plugs contacting the second gate electrodes, respectively, included in the second gate electrode structure, and
wherein a maximum value of extension lengths in the first direction of the third contact plugs is greater than a maximum value of extension lengths in the first direction of the second contact plugs.

20. The semiconductor device of claim 18,
wherein the first transistor is one of a plurality of first transistors spaced apart from each other, and
wherein at least one of the plurality of first transistors overlaps the second gate electrode structure in the first direction.

\* \* \* \* \*